US012684984B2

(12) United States Patent
Jeong et al.

(10) Patent No.: US 12,684,984 B2
(45) Date of Patent: Jul. 14, 2026

(54) COLOR CONVERSION SUBSTRATE HAVING BANK LAYER DEFINING OPENING OVERLAPPING COLOR FILTER LAYERS AND DISPLAY DEVICE INCLUDING THE SAME

(71) Applicant: Samsung Display Co., LTD., Yongin-si (KR)

(72) Inventors: Kang Seob Jeong, Hwaseong-si (KR); Tae Hoon Kim, Suwon-si (KR); Joon Hyung Park, Seoul (KR); Min Hee Kim, Ansan-si (KR); Sim Bum Yuk, Hwaseong-si (KR); Do Kyung Youn, Suwon-si (KR); Chang Hun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1064 days.

(21) Appl. No.: 17/842,500

(22) Filed: Jun. 16, 2022

(65) Prior Publication Data

US 2023/0102623 A1 Mar. 30, 2023

(30) Foreign Application Priority Data

Sep. 30, 2021 (KR) ........................ 10-2021-0130070

(51) Int. Cl.
*H10K 59/38* (2023.01)
*G02B 5/20* (2006.01)
*H10K 59/122* (2023.01)

(52) U.S. Cl.
CPC ............. *H10K 59/38* (2023.02); *G02B 5/201* (2013.01); *H10K 59/122* (2023.02)

(58) Field of Classification Search
CPC ............................ H10K 59/38; H10K 59/122
See application file for complete search history.

(56) References Cited

U.S. PATENT DOCUMENTS

| | | | |
|---|---|---|---|
| 11,204,518 B2 | 12/2021 | Lee et al. | |
| 12,193,302 B2 | 1/2025 | Song | |
| 2019/0377223 A1* | 12/2019 | Lee .................. | G02F 1/133514 |
| 2020/0251688 A1* | 8/2020 | Chung .................. | H10K 85/40 |
| 2020/0258944 A1* | 8/2020 | Joo .................... | H10K 59/8792 |

FOREIGN PATENT DOCUMENTS

| | | |
|---|---|---|
| KR | 2020-0097379 A | 8/2020 |
| KR | 2021-0021216 A | 2/2021 |

* cited by examiner

*Primary Examiner* — Michael Jung
(74) *Attorney, Agent, or Firm* — Womble Bond Dickinson (US) LLP

(57) ABSTRACT

A color conversion substrate and a display device including the same are provided, the color conversion substrate including a substrate, color filter layers on the substrate, and arranged in a first direction, and in a second direction intersecting the first direction, a bank layer defining openings overlapping the color filter layers, and including a first bank part extending in the second direction, and second bank parts extending in the first direction from a side of the first bank part, and wavelength conversion layers in the openings of the bank layer, wherein the first bank part includes a recess recessed inwardly from a part of a second side opposite a first side on which the second bank parts are located.

21 Claims, 31 Drawing Sheets

COLOR CONVERSION SUBSTRATE HAVING BANK LAYER DEFINING OPENING OVERLAPPING COLOR FILTER LAYERS AND DISPLAY DEVICE INCLUDING THE SAME

CROSS-REFERENCE TO RELATED APPLICATION

This application claims priority to, and the benefit of, Korean Patent Application No. 10-2021-0130070 filed on Sep. 30, 2021 in the Korean Intellectual Property Office, the contents of which in its entirety are herein incorporated by reference.

BACKGROUND

1. Field

The disclosure relates to a color conversion substrate, and a display device including the same.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material as a light emitting element or an inorganic light emitting display using an inorganic material as a light emitting material.

SUMMARY

Aspects of the disclosure provide a color conversion substrate in which incorrectly deposited ink is reduced or altogether prevented from remaining.

Aspects of the disclosure also provide a display device which can reduce appearance defects by including the above color conversion substrate.

However, aspects of the disclosure are not restricted to the one set forth herein. The above and other aspects of the disclosure will become more apparent to one of ordinary skill in the art to which the disclosure pertains by referencing the detailed description of the disclosure given below.

According to one or more embodiments of the disclosure, a color conversion substrate includes a substrate, color filter layers on the substrate, and arranged in a first direction, and in a second direction intersecting the first direction, a bank layer defining openings overlapping the color filter layers, and including a first bank part extending in the second direction, and second bank parts extending in the first direction from a side of the first bank part, and wavelength conversion layers in the openings of the bank layer, wherein the first bank part includes a recess recessed inwardly from a part of a second side opposite a first side on which the second bank parts are located.

The second bank parts may branch in the first direction from the first side of the first bank part, and may be connected to the first bank part, wherein the recess is side by side with each of the second bank parts in the first direction.

A maximum width of the first bank part measured in the first direction may be greater than a width of a part of the first bank part that is connected to each of the second bank parts.

The first bank part may become wider in the second direction from an intersection.

An angle between the first direction and the second direction may be about 90 degrees or more.

At least a part of each of the second bank parts may be spaced apart from the first bank part, wherein a width of each of the first bank part and the second bank parts is greater than a distance between the first bank part and each of the second bank parts.

The first bank part may include a first sub-bank part and a second sub-bank part spaced apart from each other in the second direction, wherein each of the second bank parts is spaced apart from each of the first sub-bank part and the second sub-bank part at an intersection where the first sub-bank part and the second sub-bank part are spaced apart from each other.

In each of the second bank parts, a part facing the first sub-bank part and the second sub-bank part may be narrower than other parts.

The first bank part and each of the second bank parts may be at least partially in contact with each other.

The bank layer may further include a third bank part spaced apart from the first bank part in the first direction with the second bank parts interposed therebetween, and a bank extension part extending in the first direction, and connected to the first bank part and the third bank part, and wherein a distance between each of the second bank parts and the bank extension part is less than a distance between the bank extension part and another bank extension part.

The distance between each of the second bank parts and the bank extension part may be less than a width of each of the openings.

The color filter layers may be on the bank layer to partially overlap each other.

The color conversion may further include a light blocking member on the substrate and extending in the first direction and the second direction, wherein the color filter layers are spaced apart from each other with the light blocking member interposed therebetween.

The color conversion may further include a first capping layer on the color filter layers, a second capping layer on the wavelength conversion layers and the bank layer, and a third capping layer on the second capping layer, wherein the wavelength conversion layers are on the first capping layer.

A part of the third capping layer on the second capping layer might not overlap the bank layer and the wavelength conversion layers.

According to one or more embodiments of the disclosure, a display device includes a display substrate including a first substrate and light emitting elements on the first substrate, a bank layer on the display substrate, extending in a first direction and a second direction, and surrounding openings, wavelength conversion layers in the openings of the bank layer, and color filter layers on the bank layer and the wavelength conversion layers to overlap the openings, wherein the bank layer includes a first bank part extending in the second direction, and second bank parts extending in the first direction from a side of the first bank part in the first direction, and wherein the first bank part includes a recess that is recessed inwardly from a part of a second side that is opposite a first side on which the second bank parts are located.

The second bank parts may branch in the first direction from the first side of the first bank part, and may be connected to the first bank part, wherein the recess is side by side with each of the second bank parts in the first direction.

A maximum width of the first bank part measured in the first direction may be greater than a width of a part of the first bank part connected to each of the second bank parts.

The first bank part may include a first sub-bank part and a second sub-bank part spaced apart from each other in the second direction, wherein each of the second bank parts is spaced apart from each of the first sub-bank part and the second sub-bank part at an intersection where the first sub-bank part and the second sub-bank part are spaced apart from each other.

A width of each of the first bank part and the second bank parts may be greater than a distance between the first bank part and each of the second bank parts, wherein, in each of the second bank parts, a part facing the first sub-bank part and the second sub-bank part is narrower than other parts.

The openings may include a first opening, a second opening spaced apart from the first opening in the second direction, and a third opening spaced apart from the first opening in the first direction, wherein the recess of the first bank part is between the first opening and the third opening.

The color filter layers may include a first color filter layer overlapping the first opening, and a second color filter layer overlapping the second opening, wherein the wavelength conversion layers include a first wavelength conversion layer in the first opening, and a second wavelength conversion layer in the second opening.

The display device may further include a first capping layer between the color filter layers and the bank layer and the wavelength conversion layers, a second capping layer between the wavelength conversion layers and the bank layer and the first substrate, and a third capping layer between the second capping layer and the first substrate, wherein a part of the third capping layer on the second capping layer does not overlap the bank layer and the wavelength conversion layers.

The display substrate may include anodes on the first substrate, and a cathode on the anodes, wherein the light emitting elements are between the anodes and the cathode, respectively.

The display substrate may include a first electrode and a second electrode on the first substrate, and spaced apart from each other, a first connection electrode on the first electrode, and a second connection electrode on the second electrode, wherein one of the light emitting elements is on the first electrode and the second electrode, and contacts the first connection electrode and the second connection electrode.

BRIEF DESCRIPTION OF THE DRAWINGS

These and/or other aspects will become apparent and more readily appreciated from the following description of the embodiments, taken in conjunction with the accompanying drawings in which:

FIG. 5 is a cross-sectional view taken along the line Q1-Q1' of FIGS. 3 and 4;

FIG. 6 is a cross-sectional view of a color conversion substrate according to one or more embodiments;

FIG. 26 is a schematic cross-sectional view of a display device according to one or more embodiments;

FIG. 27 is a schematic cross-sectional view of a display device according to one or more embodiments;

FIG. 28 is a schematic cross-sectional view of a display device according to one or more embodiments;

FIG. 30 is a schematic cross-sectional view of a display device according to one or more embodiments.

DETAILED DESCRIPTION

Figure 1:
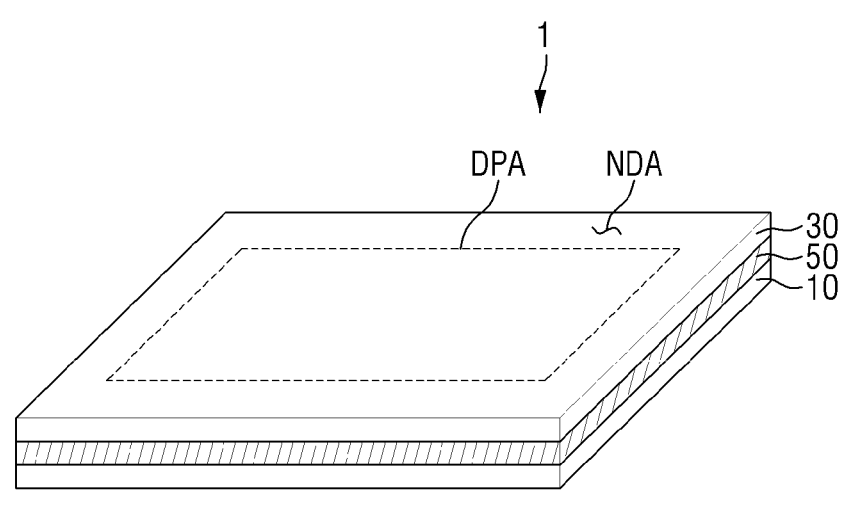
FIG. 1 is a perspective view of a display device according to one or more embodiments.
Figure 1:
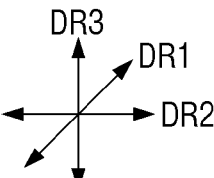

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
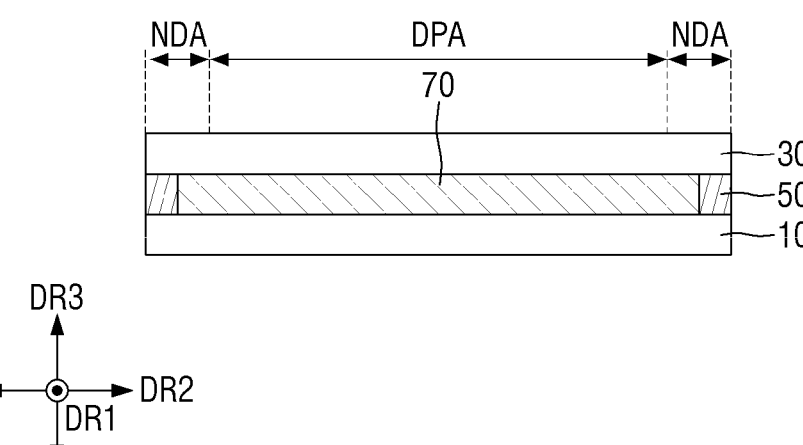
FIG. 2 is a cross-sectional view of the display device of FIG. 1.

FIG. 1 is a perspective view of a display device 1 according to one or more embodiments. FIG. 2 is a cross-sectional view of the display device 1 of FIG. 1.

Referring to FIGS. 1 and 2, the display device 1 displays moving images or still images. The display device 1 may refer to any electronic device that provides a display screen. Examples of the display device 1 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 1 includes a display panel that provides a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels can also be applied.

The shape of the display device 1 can be variously modified. For example, the display device 1 may have various shapes such as a horizontally long rectangle, a vertically long rectangle, a square, a quadrangle with rounded corners (vertices), other polygons, and a circle. The shape of a display area DPA of the display device 1 may also be similar to the overall shape of the display device 1. In FIG. 1, the display device 1 shaped like a rectangle that is long in a second direction DR2 is illustrated.

The display device 1 may include the display area DPA and a non-display area NDA. The display area DPA is an area where a screen can be displayed, and the non-display area NDA is an area where no screen is displayed. The display area DPA may also be referred to as an active area, and the non-display area NDA may also be referred to as an inactive area. The display area DPA may generally occupy the center of the display device 1.

According to one or more embodiments, the display device 1 may include a display substrate 10 and a color conversion substrate 30, and may further include a sealing part 50 to bond the display substrate 10 and the color conversion substrate 30 together, and a filler 70 filling a space between the display substrate 10 and the color conversion substrate 30.

The display substrate 10 may include an element and circuits for displaying an image, for example, a pixel circuit such as a switching element, and a self-light emitting element. In one or more embodiments, the self-light emitting element may include at least one of an organic light emitting diode, a quantum dot light emitting diode, an inorganic material-based micro light emitting diode (e.g., a micro LED), and an inorganic material-based nano light emitting diode (e.g., a nano LED). A case where the self-light emitting element is an organic light emitting diode will be described below as an example.

The color conversion substrate 30 may be located on the display substrate 10, and may face the display substrate 10. The color conversion substrate 30 may include a wavelength conversion layer that converts the color of incident light, a light transmitting layer that transmits incident light, and color filters.

The sealing part 50 may be located between the display substrate 10 and the color conversion substrate 30 in the non-display area NDA. The sealing part 50 may be located along edges of the display substrate 10 and the color conversion substrate 30 in the non-display area NDA to surround the display area DPA in plan view. The display substrate 10 and the color conversion substrate 30 may be bonded to each other through the sealing part 50. In some embodiments, the sealing part 50 may be made of an organic material. For example, the sealing part 50 may be made of, but is not limited to, epoxy-based resin.

The filler 70 may be located in the space between the display substrate 10 and the color conversion substrate 30 surrounded by the sealing part 50. The filler 70 may fill the space between the display substrate 10 and the color conversion substrate 30. The filler 70 may be made of a material that can transmit light. In some embodiments, the filler 70 may be made of an organic material. For example, the filler 70 may be made of, but is not limited to, a silicon-based organic material or an epoxy-based organic material. In addition, in some cases, the filler 70 may be omitted.

Figure 3:
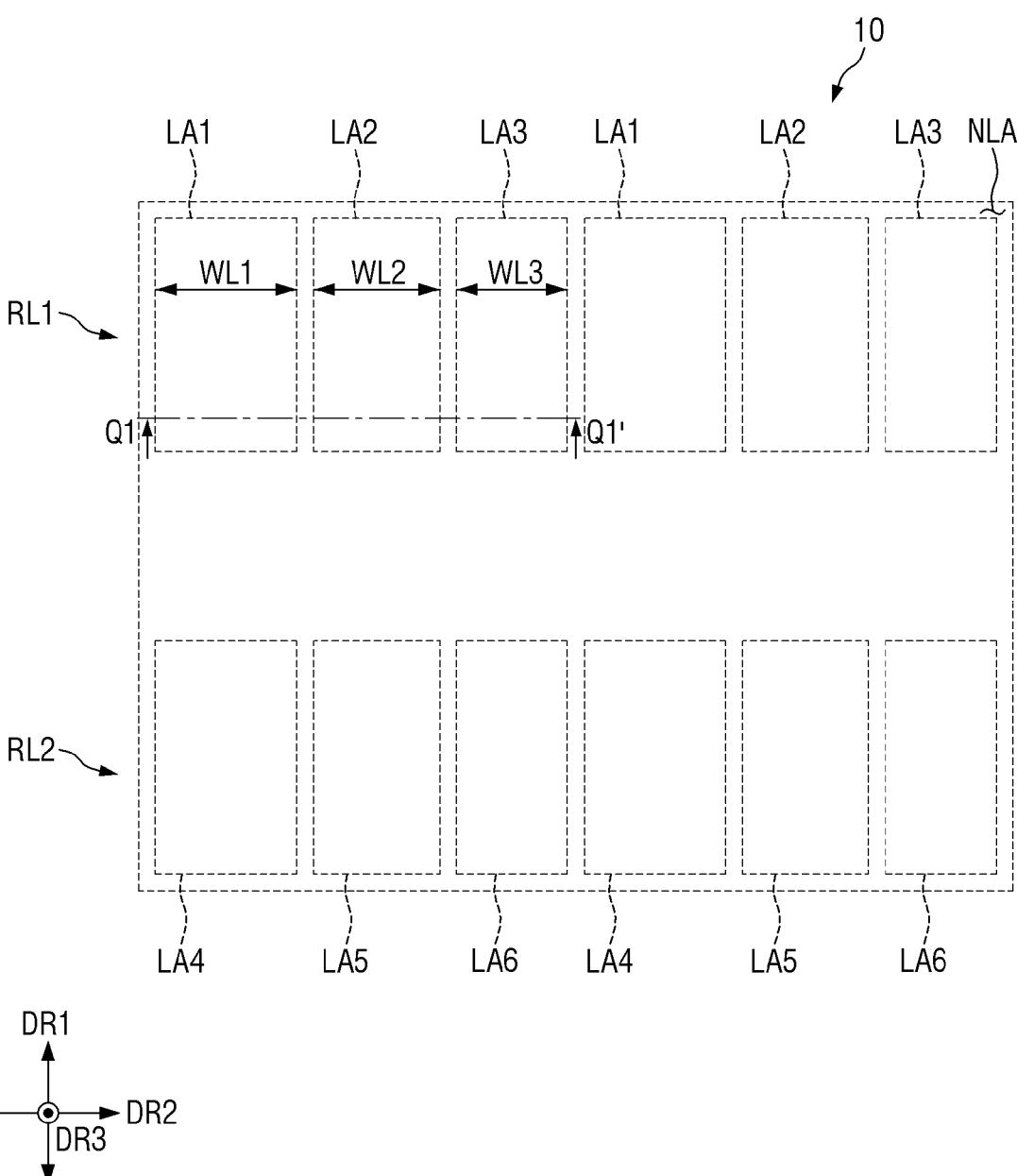
FIG. 3 is a schematic plan view of a display substrate of the display device illustrated in FIGS. 1 and 2.
Figure 4:
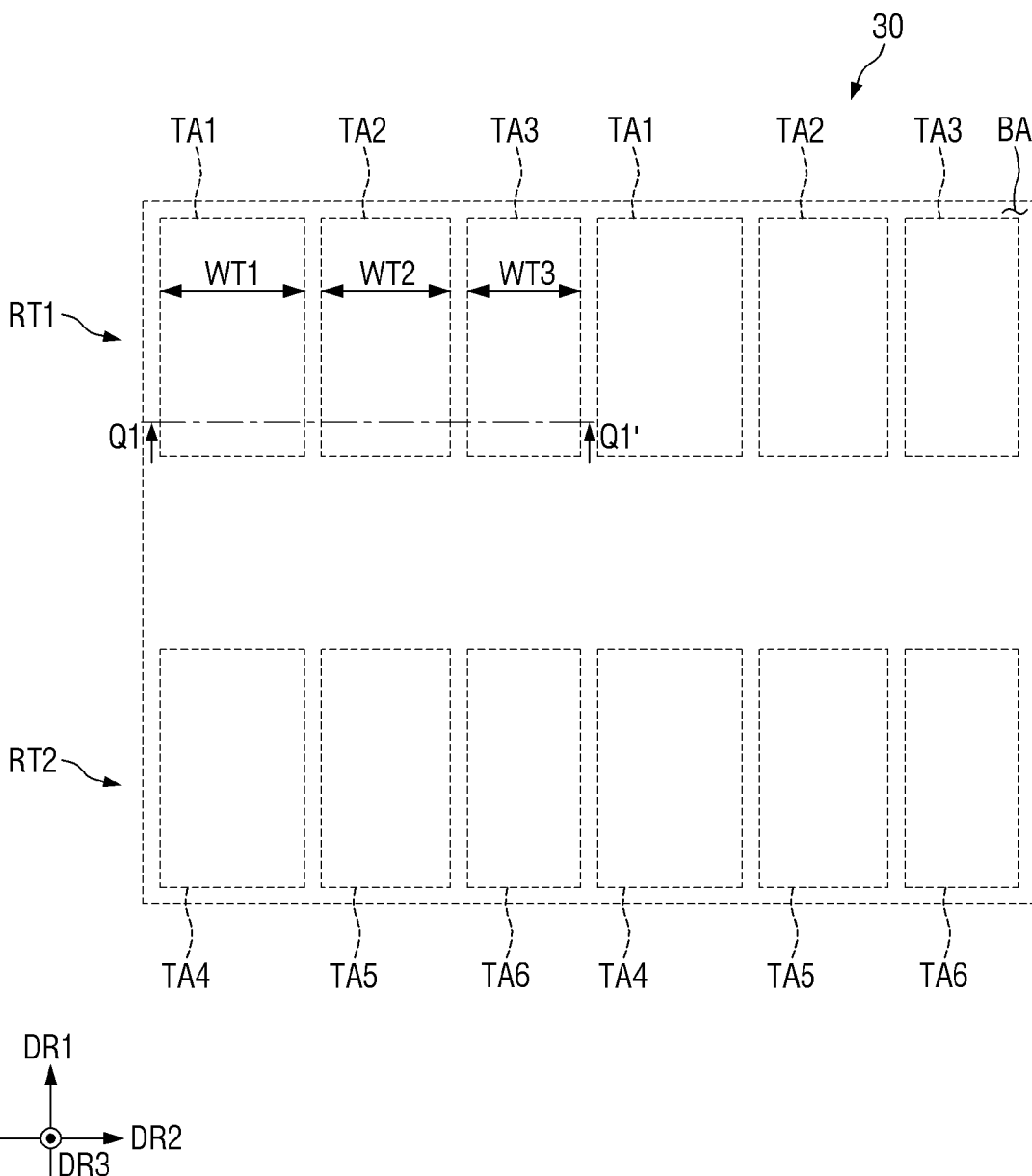
FIG. 4 is a schematic plan view of a color conversion substrate of the display device illustrated in FIGS. 1 and 2.

FIG. 3 is a schematic plan view of the display substrate 10 of the display device 1 illustrated in FIGS. 1 and 2. FIG. 4 is a schematic plan view of the color conversion substrate 30 of the display device 1 illustrated in FIGS. 1 and 2.

Referring to FIGS. 3 and 4, the display substrate 10 of the display device 1 may include a plurality of light emitting areas LA1 through LA6 and a non-light emitting area NLA located in the display area DPA. Each of the light emitting areas LA1 through LA6 may be an area where light generated by a light emitting element is emitted to the outside of the display substrate 10, and the non-light emitting area NLA may be an area from which light is not emitted.

In one or more embodiments, light emitted out of the display substrate 10 in each of the light emitting areas LA1 through LA6 may be blue light, and may have a peak wavelength in the range of about 440 nm to about 480 nm.

The display substrate 10 may include light emitting areas LA1 through LA3 located in a first row RL1, and light emitting areas LA4 through LA6 located in a second row RL2, in the display area DPA. In the display substrate 10, a first light emitting area LA1, a second light emitting area LA2, and a third light emitting area LA3 may be located in the first row RL1 along the second direction DR2. In the first row RL1 of the display substrate 10, the first light emitting area LA1, the second light emitting area LA2, and the third light emitting area LA3 may be sequentially and repeatedly located. In the second row RL2 that neighbors the first row RL1 in a first direction DR1, a fourth light emitting area LA4, a fifth light emitting area LA5, and a sixth light emitting area LA6 may be sequentially located along the second direction DR2. In the second row RL2 of the display substrate 10, the fourth light emitting area LA4, the fifth light emitting area LA5, and the sixth light emitting area LA6 may be sequentially and repeatedly located.

In some embodiments, a first width WL1 of the first light emitting area LA1 measured in the second direction DR2 may be different from a second width WL2 of the second light emitting area LA2 measured in the second direction DR2 and a third width WL3 of the third light emitting area LA3 measured in the second direction DR2. The second width WL2 of the second light emitting area LA2 and the third width WL3 of the third light emitting area LA3 may also be different from each other. For example, the first width WL1 of the first light emitting area LA1 may be greater than the second width WL2 of the second light emitting area LA2 and the third width WL3 of the third light emitting area LA3, and the second width WL2 of the second light emitting area LA2 may be greater than the third width WL3 of the third light emitting area LA3. In one or more embodiments in which the first light emitting area LA1, the second light emitting area LA2, and the third light emitting area LA3 have the same length measured in the first direction DR1, the area of the first light emitting area LA1 may be larger than the area of the second light emitting area LA2 and the area of the third light emitting area LA3, and the area of the second light emitting area LA2 may be larger than the area of the third light emitting area LA3.

However, the disclosure is not limited thereto, and the first width WL1 of the first light emitting area LA1, the second width WL2 of the second light emitting area LA2, and the third width WL3 of the third light emitting area LA3 may be substantially the same or may have a magnitude relationship that is different from the above-described magnitude relationship. For example, the first width WL1 of the first light emitting area LA1 may be less than the second width WL2 of the second light emitting area LA2 and the third width WL3 of the third light emitting area LA3, and the second width WL2 of the second light emitting area LA2 may be less than the third width WL3 of the third light emitting area LA3. In the drawings, a width of the display substrate 10 is reduced sequentially from the first light emitting area LA1 toward the third light emitting area LA3. However, the disclosure is not limited to this case.

The fourth light emitting area LA4 adjacent to the first light emitting area LA1 in the first direction DR1 may be the same as the first light emitting area LA1 except that it is located in the second row RL2 of the display substrate 10, and may be substantially the same as the first light emitting area LA1 in width, area, and elements located in the area. Similarly, the fifth light emitting area LA5 adjacent to the second light emitting area LA2 in the first direction DR1 may have substantially the same structure as the second light emitting area LA2. The sixth light emitting area LA6 adjacent to the third light emitting area LA3 in the first direction DR1 may have substantially the same structure as the third light emitting area LA3.

In the display substrate 10, the non-light emitting area NLA may be located around the light emitting areas LA1 through LA6 in the display area DPA. The non-light emitting area NLA may extend in the first direction DR1 and the second direction DR2 to surround the light emitting areas LA1 through LA6.

The color conversion substrate 30 may include a plurality of light transmitting areas TA1 through TA6 and a light blocking area BA located in the display area DPA. The light transmitting areas TA1 through TA6 may be areas where light emitted from the display substrate 10 is provided to the outside of the display device 1 after being transmitted through the color conversion substrate 30. The light blocking area BA may be an area through which light emitted from the display substrate 10 is not transmitted.

The color conversion substrate 30 may include light transmitting areas TA1 through TA3 located in a first row RT1 and light transmitting areas TA4 through TA6 located in a second row RT2 in the display area DPA. In the color conversion substrate 30, a first light transmitting area TA1, a second light transmitting area TA2, and a third light transmitting area TA3 may be located in the first row RT1 along the second direction DR2. In the first row RT1 of the color conversion substrate 30, the first light transmitting area TA1, the second light transmitting area TA2, and the third light transmitting area TA3 may be sequentially and repeatedly located. In the second row RT2 neighboring the first row RT1 in the first direction DR1, a fourth light transmitting area TA4, a fifth light transmitting area TAS, and a sixth light transmitting area TA6 may be sequentially located along the second direction DR2. In the second row RT2 of the color conversion substrate 30, the fourth light transmitting area TA4, the fifth light transmitting area TAS, and the sixth light transmitting area TA6 may be sequentially and repeatedly located.

In some embodiments, a first width WT1 of the first light transmitting area TA1 measured in the second direction DR2 may be different from a second width WT2 of the second light transmitting area TA2 measured in the second direction DR2 and a third width WT3 of the third light transmitting area TA3 measured in the second direction DR2. Further, the second width WT2 of the second light transmitting area TA2 and the third width WT3 of the third light transmitting area TA3 may also be different from each other. For example, the first width WT1 of the first light transmitting area TA1 may be greater than the second width WT2 of the second light transmitting area TA2 and the third width WT3 of the third light transmitting area TA3, and the second width WT2 of the second light transmitting area TA2 may be greater than the third width WT3 of the third light transmitting area TA3. In one or more embodiments in which the first light transmitting area TA1, the second light transmitting area TA2, and the third light transmitting area TA3 have the same length measured in the first direction DR1, the area of the first light transmitting area TA1 may be larger than the area of the second light transmitting area TA2 and the area of the third light transmitting area TA3, and the area of the second light transmitting area TA2 may be larger than the area of the third light transmitting area TA3.

However, the disclosure is not limited thereto, and the first width WT1 of the first light transmitting area TA1, the second width WT2 of the second light transmitting area TA2, and the third width WT3 of the third light transmitting area TA3 may be substantially the same, or may have a magnitude relationship different from the above-described magnitude relationship. For example, the first width WT1 of the first light transmitting area TA1 may be less than the second width WT2 of the second light transmitting area TA2 and the third width WT3 of the third light transmitting area TA3, and the second width WT2 of the second light transmitting area TA2 may be less than the third width WT3 of the third light transmitting area TA3. In the drawings, a width of the color conversion substrate 30 is reduced sequentially from the first light transmitting area TA1 toward the third light transmitting area TA3. However, the disclosure is not limited to this case.

The fourth light transmitting area TA4 adjacent to the first light transmitting area TA1 in the first direction DR1 may be the same as the first light transmitting area TA1, with the exception that it is located in the second row RT2 of the color conversion substrate 30, and may be substantially the same as the first light transmitting area TA1 in width, area, and elements located in the area. Similarly, the fifth light transmitting area TA5 adjacent to the second light transmitting area TA2 in the first direction DR1 may have substantially the same structure as the second light transmitting area TA2. The sixth light transmitting area TA6 adjacent to the third light transmitting area TA3 in the first direction DR1 may have substantially the same structure as the third light transmitting area TA3.

Light emitted from the display substrate 10 may be transmitted through the light transmitting areas TA1 through TA6 of the color conversion substrate 30 and output to the outside of the display device 1. For example, light emitted from the first light emitting area LA1 of the display substrate 10 may be output through the first light transmitting area TA1 of the color conversion substrate 30. Similarly, light emitted from the second through sixth light emitting areas LA2 through LA6 of the display substrate 10 may be output through the second through sixth light transmitting areas TA2 through TA6 of the color conversion substrate 30, respectively. In one or more embodiments in which the display substrate 10 of the display device 1 includes light emitting elements emitting blue light, the first light transmitting area TA1, the second light transmitting area TA2, and the third light transmitting area TA3 may output light of different colors. For example, the first light transmitting area TA1 may output light of a first color, the second light transmitting area TA2 may output light of a second color, and the third light transmitting area TA3 may output light of a third color. The light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm. The fourth light transmitting area TA4, the fifth light transmitting area TA5, and the sixth light transmitting area TA6 may output the light of the first color, the light of the second color, and the light of the third color, respectively.

In the color conversion substrate 30, the light blocking area BA may be located around the light transmitting areas TA1 through TA6 in the display area DPA. The light blocking area BA may extend in both the first direction DR1 and the second direction DR2 to surround the light transmitting areas TA1 through TA6.

The structure of the display device 1 will now be described in more detail with reference to other drawings.

Figure 5:
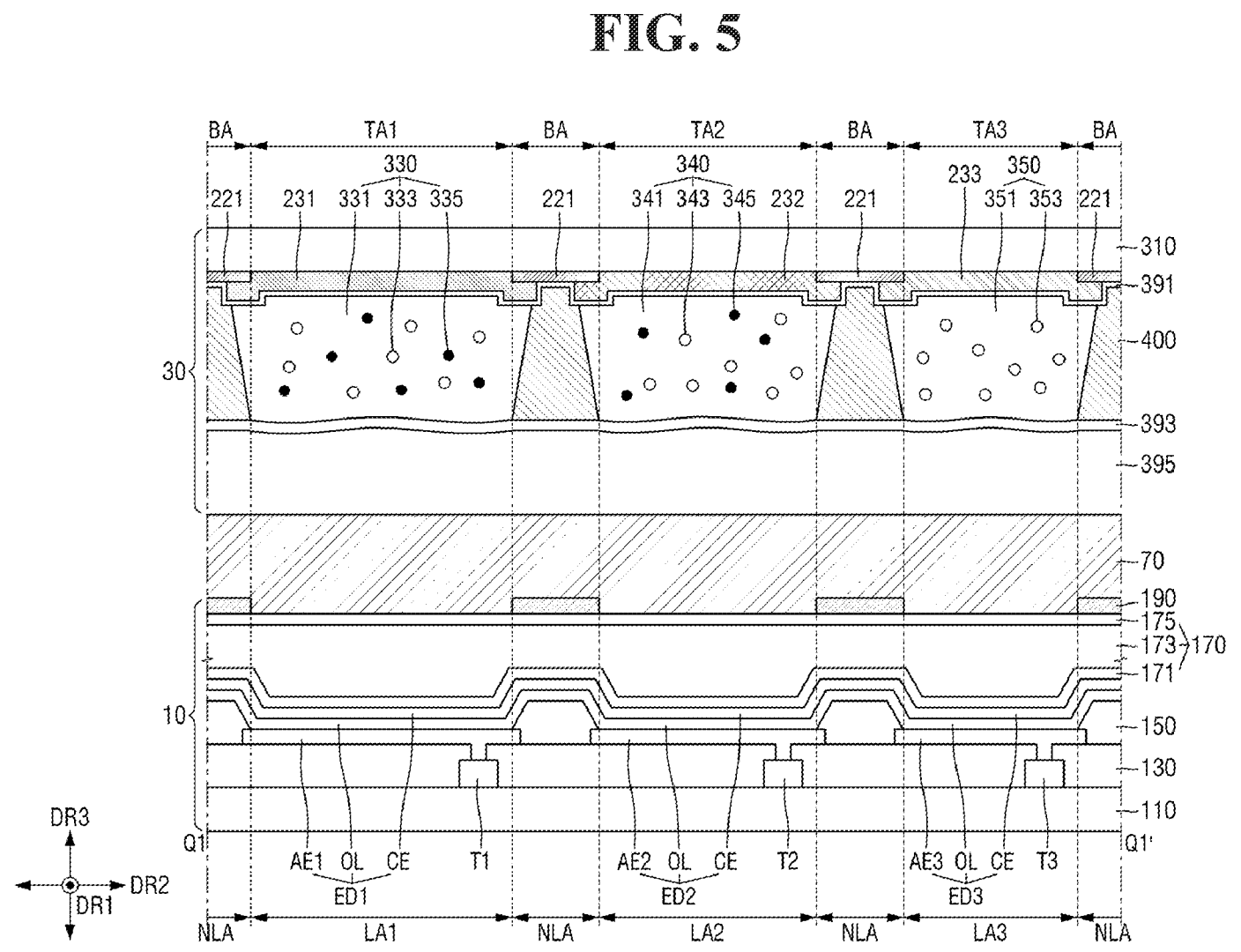
Figure 6:
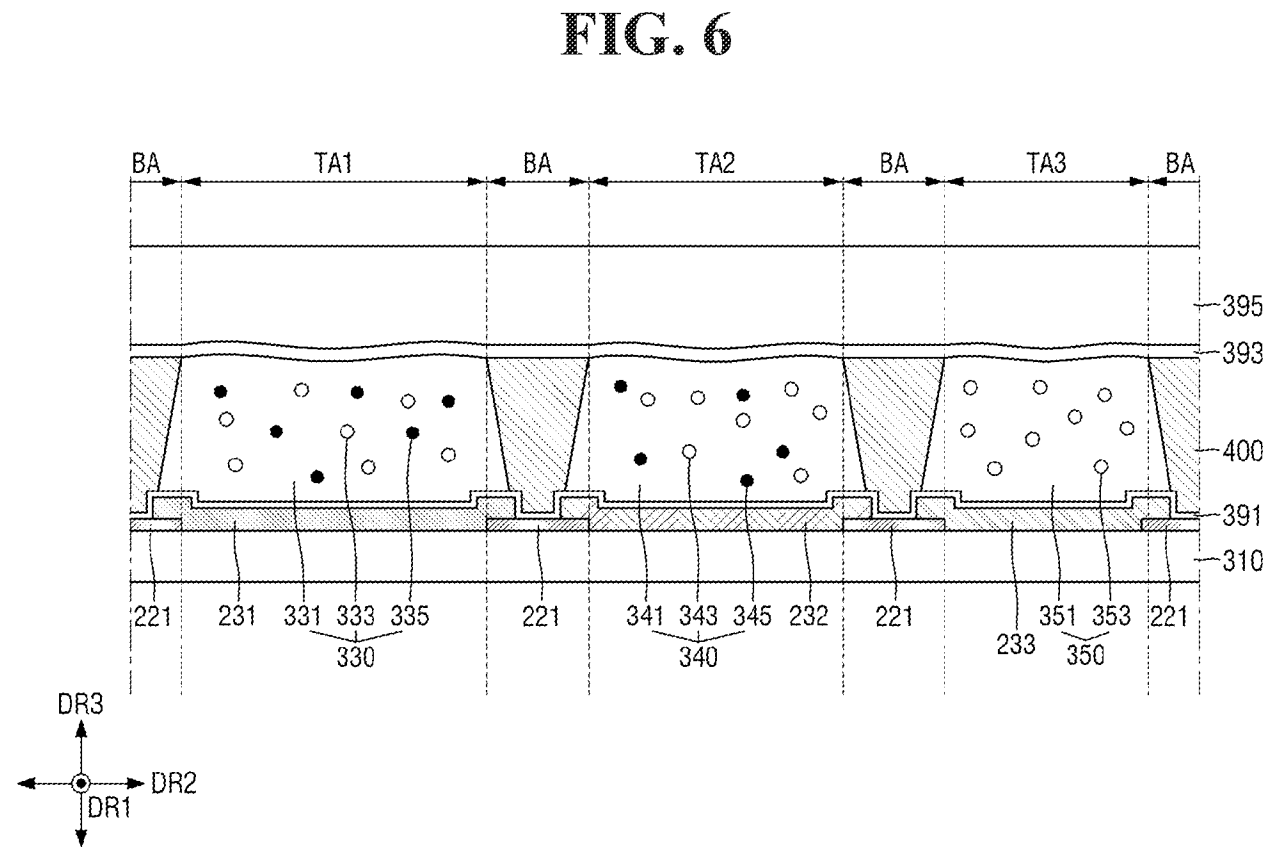

FIG. 5 is a cross-sectional view taken along the line Q1-Q1' of FIGS. 3 and 4. FIG. 6 is a cross-sectional view of a color conversion substrate 30 according to one or more embodiments. FIG. 5 illustrates a cross section taken across the first through third light emitting areas LA1 through LA3 of the display substrate 10 and the first through third light transmitting areas TA1 through TA3 of the color conversion substrate 30 in the second direction DR2. FIG. 6 illustrates a state in which a second substrate 310 of the color conversion substrate 30 is located at the bottom of the color conversion substrate 30.

Referring to FIGS. 5 and 6, the display substrate 10 may include a first substrate 110 and a plurality of switching elements T1 through T3, a plurality of anodes AE, a plurality of light emitting elements ED, and a cathode CE located on the first substrate 110.

The first substrate 110 may be made of a transparent material. In some embodiments, the first substrate 110 may be made of an insulating material such as glass, quartz, or polymer resin. In addition, the first substrate 110 may be a rigid substrate, but may also be a flexible substrate that can be bent, folded, rolled, etc. The first substrate 110 may include the light emitting areas LA1 through LA6 and the non-light emitting area NLA.

The switching elements T1 through T3 may be located on the first substrate 110. In some embodiments, a first switching element T1 may be located in the first light emitting area LA1, a second switching element T2 may be located in the second light emitting area LA2, and a third switching element T3 may be located in the third light emitting area LA3. However, the disclosure is not limited thereto. In one or more embodiments, at least any one of the first switching element T1, the second switching element T2, and the third switching element T3 may be located in the non-light emitting area NLA.

In some embodiments, each of the first switching element T1, the second switching element T2, and the third switching element T3 may be a thin-film transistor including polysilicon, or a thin-film transistor including an oxide semiconductor. In one or more embodiments, a plurality of signal lines (e.g., gate lines, data lines, and power lines) for transmitting signals to each switching element may be further located on the first substrate 110.

A circuit insulating layer 130 may be located on the first switching element T1, the second switching element T2, and the third switching element T3. The circuit insulating layer 130 may be a planarization layer located on the switching elements T1 through T3 to planarize an upper surface. In some embodiments, the circuit insulating layer 130 may be made of an organic layer. For example, the circuit insulating layer 130 may include acrylic resin, epoxy resin, imide resin, ester resin, or the like. The circuit insulating layer 130 may include a positive photosensitive material or a negative photosensitive material.

The anodes AE1 through AE3 may be located on the circuit insulating layer 130. A first anode AE1 may be located in the first light emitting area LA1, a second anode AE2 may be located in the second light emitting area LA2, and a third anode AE3 may be located in the third light emitting area LA3. The anodes AE1 through AE3 may be located in the light emitting areas LA1 through LA3, respectively, and at least a part of each of the anodes AE1 through AE3 may extend to the non-light emitting area NLA. The first anode AE1 may penetrate the circuit insulating layer 130 and may be connected to the first switching element T1, the second anode AE2 may penetrate the circuit insulating layer 130 and may be connected to the second switching element T2, and the third anode AE3 may penetrate the circuit insulating layer 130 and may be connected to the third switching element T3.

In some embodiments, the first anode AE1, the second anode AE2, and the third anode AE3 may be different from each other in width or area. For example, a width of the first anode AE1 may be greater than a width of the second anode AE2, and the width of the second anode AE2 may be less than the width of the first anode AE1 but may be greater than a width of the third anode AE3. Alternatively, the area of the first anode AE1 may be larger than the area of the second anode AE2, and the area of the second anode AE2 may be less than the area of the first anode AE1 but may be larger than the area of the third anode AE3. However, the disclosure is not limited thereto, and the area of the first anode AE1 may be less than the area of the second anode AE2, and the area of the third anode AE3 may be larger than the area of the second anode AE2 and the area of the first anode AE1. Alternatively, in some cases, the first anode AE1, the second anode AE2, and the third anode AE3 may be substantially the same in width or area.

The first anode AE1, the second anode AE2, and the third anode AE3 may include a material having high reflectivity. In this case, each of the first anode AE1, the second anode AE2, and the third anode AE3 may be a metal layer including a metal such as Ag, Mg, Al, Pt, Pd, Au, Ni, Nd, Ir, or Cr. In one or more embodiments, each of the first anode AE1, the second anode AE2, and the third anode AE3 may further include a metal oxide layer stacked on the metal layer. In one or more embodiments, each of the first anode AE1, the second anode AE2, and the third anode AE3 may have a multilayer structure such as a two-layer structure of ITO/Ag, Ag/ITO, ITO/Mg or ITO/MgF, or a three-layer structure of ITO/Ag/ITO.

A pixel defining layer 150 may be located on the first anode AE1, the second anode AE2, and the third anode AE3. The pixel defining layer 150 may include an opening exposing the first anode AE1, an opening exposing the second anode AE2, and an opening exposing the third anode AE3. An area of the first anode AE1 that is exposed without being covered by the pixel defining layer 150 may be the first light emitting area LA1. Similarly, an area of the second anode AE2 that is exposed without being covered by the pixel defining layer 150 may be the second light emitting area LA2, and an area of the third anode AE3 that is exposed without being covered by the pixel defining layer 150 may be the third light emitting area LA3. In addition, an area where the pixel defining layer 150 is located may be the non-light emitting area NLA.

In some embodiments, the pixel defining layer 150 may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

In some embodiments, a part of the pixel defining layer 150 may overlap a light blocking member 221 and a bank layer 400 to be described later.

A light emitting layer OL may be located on the first anode AE1, the second anode AE2, and the third anode AE3. In some embodiments, the light emitting layer OL may be in the shape of a continuous layer formed over the light emitting areas LA1 through LA6 and the non-light emitting area NLA. The light emitting layer OL will be described in more detail later.

The cathode CE may be located on the light emitting layer OL. In some embodiments, the cathode CE may have translucency or transparency. When the cathode CE has translucency, it may include Ag, Mg, Cu, Al, Pt, Pd, Au, Ni, Nd, Ir, Cr, Li, Ca, LiF/Ca, LiF/Al, Mo, Ti, or a compound or mixture of the same (e.g., a mixture of Ag and Mg). In addition, when a thickness of the cathode CE is about tens to hundreds of angstroms, the cathode CE may have translucency.

When the cathode CE has transparency, it may include a transparent conductive oxide (TCO). For example, the cathode CE may include tungsten oxide ($WxOx$), titanium oxide ($TiO_2$), indium tin oxide (ITO), indium zinc oxide (IZO), zinc oxide (ZnO), indium tin zinc oxide (ITZO), or magnesium oxide (MgO).

The first anode AE1, the light emitting layer OL, and the cathode CE may constitute a first light emitting element ED1, the second anode AE2, the light emitting layer OL, and the cathode CE may constitute a second light emitting element ED2, and the third anode AE3, the light emitting layer OL, and the cathode CE may constitute a third light emitting element ED3. Each of the first light emitting element ED1, the second light emitting element ED2, and the third light emitting element ED3 may emit light L, and the emitted light L may be provided to the color conversion substrate 30.

Figure 7:
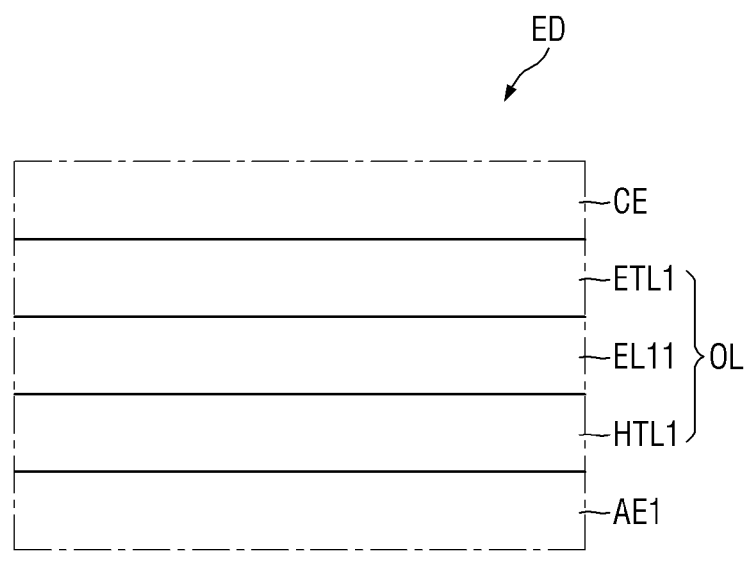
FIGS. 7 through 9 are cross-sectional views of light emitting elements according to embodiments.
Figure 8:
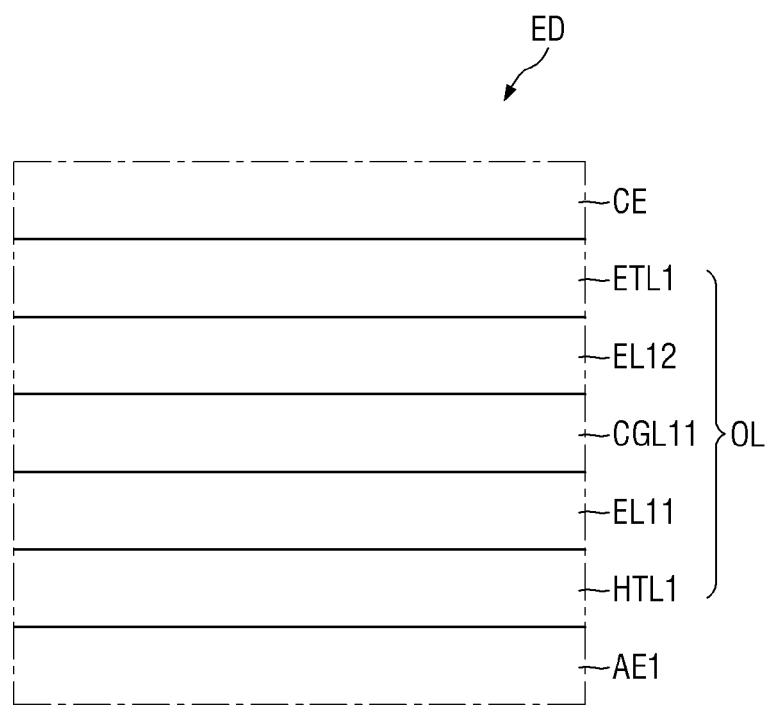
Figure 9:
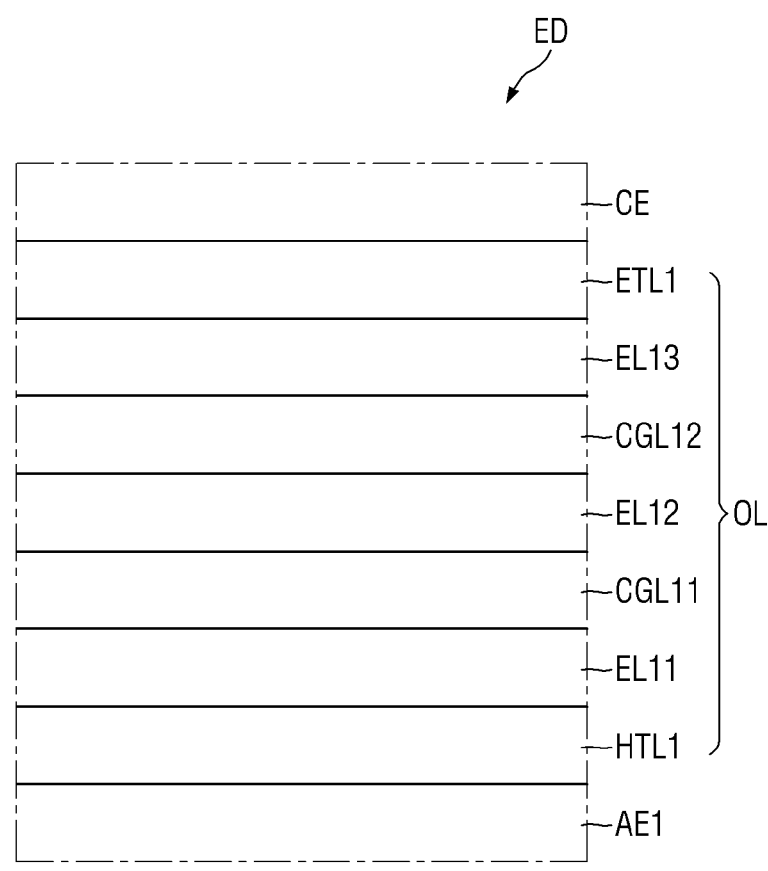

FIGS. 7 through 9 are cross-sectional views of light emitting elements ED according to embodiments.

Referring to FIG. 7, a light emitting layer OL of a light emitting element ED may have a structure in which a plurality of layers are stacked. In one or more embodiments, the light emitting layer OL may include a first hole transport layer HTL1 located on a first anode AE1, a first light emitting material layer EL11 located on the first hole transport layer HTL1, and a first electron transport layer ETL1 located on the first light emitting material layer EL11. In one or more embodiments, the light emitting layer OL may include only one light emitting layer, for example, only the first light emitting material layer EL11 as a light emitting layer, and the first light emitting material layer EL11 may be a blue light emitting layer. However, the stacked structure of the light emitting layer OL is not limited to the structure of FIG. 7.

Referring to FIG. 8, a light emitting layer OL may further include a first charge generation layer CGL11 located on a first light emitting material layer EL11 and a second light emitting material layer EL12 located on the first charge generation layer CGL11, and a first charge transport layer ETL1 may be located on the second light emitting material layer EL12.

The first charge generation layer CGL11 may inject electric charges into each adjacent light emitting layer. The first charge generation layer CGL11 may control the charge balance between the first light emitting material layer EL11 and the second light emitting material layer EL12. In some embodiments, the first charge generation layer CGL11 may include an n-type charge generation layer and a p-type charge generation layer. The p-type charge generation layer may be located on the n-type charge generation layer.

The second light emitting material layer EL12 may emit blue light like the first light emitting material layer EL11, although the disclosure is not limited thereto. The second light emitting material layer EL12 may emit blue light having the same peak wavelength as or a different peak wavelength from blue light emitted from the first light emitting material layer EL11. In one or more embodiments, the first light emitting material layer EU11 and the second light emitting material layer EL12 may emit light of different colors. That is, the first light emitting material layer EL11 may emit blue light, and the second light emitting material layer EL12 may emit green light.

Because the light emitting layer OL having the above structure includes two light emitting layers, luminous efficiency and life can be improved compared with the structure of FIG. 7.

FIG. 9 shows that a light emitting layer OL can include three light emitting material layers EL11 through EL13 and two charge generation layers CGL11 and CGL12 interposed between respective ones thereof. As illustrated in FIG. 9, the light emitting layer OL may further include a first charge generation layer CGL11 located on a first light emitting material layer EL11, a second light emitting material layer EL12 located on the first charge generation layer CGL11, a second charge generation layer CGL12 located on the second light emitting material layer EL12, and a third light emitting material layer EL13 located on the second charge generation layer CGL12. A first charge transport layer ETL1 may be located on the third light emitting material layer EL13.

The third light emitting material layer EL13 may emit blue light like the first light emitting material layer EL11 and the second light emitting material layer EL12. In one or more embodiments, the first light emitting material layer EL11, the second light emitting material layer EL12, and the third light emitting material layer EL13 may each emit blue light, and all of the blue light may have the same wavelength peak, or some of the blue light may have a different wavelength peak than other of the blue light. In one or more embodiments, the first light emitting material layer EL11, the second light emitting material layer EL12, and the third light emitting material layer EL13 may emit light of different colors. For example, each light emitting layer may emit blue or green light, or each light emitting layer may emit red, green, or blue light to thereby collectively emit white light.

An encapsulation layer 170 may be located on the cathode CE (e.g., see FIG. 5). The encapsulation layer 170 may be located in the light emitting areas LA1 through LA6 and the non-light emitting area NLA. In one or more embodiments, the encapsulation layer 170 may be directly located on the cathode CE to cover the cathode CE. However, the disclosure is not limited thereto, and other layers may also be further located between the encapsulation layer 170 and the cathode CE.

In one or more embodiments, the encapsulation layer 170 may include a first encapsulation layer 171, a second encapsulation layer 173, and a third encapsulation layer 175. The first encapsulation layer 171 and the third encapsulation layer 175 may include an inorganic insulating material, and the second encapsulation layer 173 may include an organic insulating material. For example, each of the first encapsulation layer 171 and the third encapsulation layer 175 may include at least any one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride ($SiO_xN_y$), and lithium fluoride. The second encapsulation layer 173 may include at least any one of acrylic resin, methacrylic resin, polyisoprene, vinyl resin, epoxy resin, urethane resin, cellulose resin, and perylene resin. However, the structure and material of the encapsulation layer 170 are not limited to the above example, and the stacked structure or material of the encapsulation layer 170 can be variously changed.

A panel light blocking member 190 may be located on the encapsulation layer 170. The panel light blocking member 190 may reduce or prevent color mixing due to intrusion of light between adjacent light emitting areas, thereby further improving a color gamut. In some embodiments, the panel light blocking member 190 may be located in the non-light emitting area NLA to surround the light emitting areas LA1 through LA6. The panel light blocking member 190 may include an organic light blocking material, and may be formed by coating and exposing the organic light blocking material.

The color conversion substrate 30 may include the second substrate 310, a plurality of color filter layers 231 through 233, the light blocking member 221, the bank layer 400, a plurality of wavelength conversion layers 330 and 340, and a light transmitting layer 350. In addition, the color conversion substrate 30 may further include a plurality of capping layers 391, 393, and 395. The light blocking member 221, the color filter layers 231 through 233, the wavelength conversion layers 330 and 340, and the light transmitting layer 350 may be located on (e.g., above) a surface of the second substrate 310 which faces the first substrate 110.

The second substrate 310 may be spaced apart from the first substrate 110 to face the first substrate 110. The second substrate 310 may be made of a light transmitting material. In some embodiments, the second substrate 310 may include a glass substrate or a plastic substrate. Alternatively, the second substrate 310 may further include a separate layer located on the glass substrate or the plastic substrate, for example, an insulating layer such as an inorganic layer. The second substrate 310 may include the light transmitting areas TA1 through TA3 and the light blocking area BA.

The light blocking member 221 may be located on (e.g., below) a surface of the second substrate 310 that faces the first substrate 110 among both surfaces of the second substrate 310. The light blocking member 221 may be formed in a grid pattern to partially expose the surface of the second substrate 310. Areas in which the light blocking member 221 is not located may be the light transmitting areas TA1 through TA3 in which the color filter layers 231 through 233 are located to emit light, and an area in which the light blocking member 221 is located may be the light blocking area BA in which light emission is blocked.

The light blocking member 221 may include an organic material that can absorb light. The light blocking member 221 may reduce color distortion due to reflection of external light by absorbing the external light. For example, the light blocking member 221 may be made of a material used as a black matrix of the display device 1, and may absorb all wavelengths of visible light.

In some embodiments, the light blocking member 221 may be omitted from the display device 1, and may be replaced with a material that absorbs light of a corresponding wavelength among the visible light wavelengths, and that transmits light of another corresponding wavelength. The light blocking member 221 may be replaced with a color pattern including the same material as at least any one of the color filter layers 231 through 233. For example, in the area in which the light blocking member 221 is located, a color pattern including the material of any one color filter layer may be located, or a structure in which a plurality of color patterns are stacked may be located. This will be described with reference to one or more other embodiments.

The color filter layers 231 through 233 may be located on the surface of the second substrate 310. Each of the color filter layers 231 through 233 may be located on the surface of the second substrate 310 to correspond to an area exposed by the light blocking member 221. Different color filter layers 231 through 233 may be spaced apart from each other with the light blocking member 221 interposed between them. However, the disclosure is not limited thereto. In some embodiments, a part of each of the color filter layers 231 through 233 may be located on the light blocking member 221 so that the color filter layers 231 through 233 are spaced apart from each other on the light blocking member 221. In one or more embodiments, the color filter layers 231 through 233 may partially overlap each other.

The color filter layers 231 through 233 may include a first color filter layer 231 located in the first light transmitting area TA1, a second color filter layer 232 located in the second light transmitting area TA2, and a third color filter layer 233 located in the third light transmitting area TA3. The color filter layers 231 through 233 may be formed as island-shaped patterns corresponding to the light transmitting areas TA1 through TA3. However, the disclosure is not limited thereto, and the color filter layers 231 through 233 may also form linear patterns.

The color filter layers 231 through 233 may include a colorant such as a dye or pigment that absorbs light in wavelength bands other than light in a corresponding wavelength band. The color filter layer 231, 232, or 233 may be located in each of the light transmitting areas TA1 through TA6 to transmit only a part of light incident on the color filter layer 231, 232, or 233 in the light transmitting area TA1, TA2, TA3, TA4, TAS, or TA6. In the light transmitting areas TA1 through TA6 of the color conversion substrate 30, only light transmitted through the color filter layers 231 through 233 may be selectively output. In one or more embodiments, the first color filter layer 231 may be a red color filter layer, the second color filter layer 232 may be a green color filter layer, and the third color filter layer 233 may be a blue color filter layer. Light emitted from the light emitting elements ED may pass through the wavelength conversion layers 330 and 340 and the light transmitting layer 350, and may exit through the color filter layers 231 through 233.

A first capping layer 391 may be located on the color filter layers 231 through 233 and the light blocking member 221. The first capping layer 391 may reduce or prevent impurities, such as moisture or air, from being introduced from the outside and damaging or contaminating the color filter layers 231 through 233. The first capping layer 391 may be made of an inorganic insulating material.

The bank layer 400 may be located on a surface of the first capping layer 391 to overlap the light blocking member 221. The bank layer 400 may be located in a grid pattern including parts extending in the first direction DR1 and the second direction DR2. The bank layer 400 may surround parts in which the color filter layers 231 through 233 are located to respectively correspond to the light transmitting areas TA1 through TA3. The bank layer 400 may form areas in which the wavelength conversion layers 330 and 340 and the light transmitting layer 350 are located. The bank layer 400 may be located to have a height (e.g., predetermined height) on the first capping layer 391. In one or more embodiments, the bank layer 400 may include an organic insulating material, and may have a height of about 4 μm to about 20 μm and a width of about 4 μm to about 20 μm. However, the disclosure is not limited thereto.

In the drawings, the bank layer 400 has an inverted taper shape whose upper part has a greater width than a lower part with respect to an upper surface of the second substrate 310. However, the disclosure is not limited thereto. In some embodiments, the upper part of the bank layer 400 may have a width that is less than the lower part. In addition, unlike in the drawings, upper and side surfaces of the bank layer 400 might not be linearly inclined, but may be curved instead.

The wavelength conversion layers 330 and 340 and the light transmitting layer 350 may be located on the surface of the first capping layer 391 in areas surrounded by the bank layer 400. The wavelength conversion layers 330 and 340 and the light transmitting layer 350 may be respectively located in the light transmitting areas TA1 through TA3 surrounded by the bank layer 400 to form island-shaped patterns in the display area DPA. However, the disclosure is not limited thereto, and each of the wavelength conversion layers 330 and 340 and the light transmitting layer 350 may also extend in one direction across a plurality of subpixels SPXn to form a linear pattern.

In one or more embodiments in which the light emitting element ED of each subpixel SPXn emits blue light of the third color, the wavelength conversion layers 330 and 340 may include a first wavelength conversion layer 330 located on the first light emitting area LA1 to correspond to the first light transmitting area TA1, and a second wavelength conversion layer 340 located on the second light emitting area LA2 to correspond to the second light transmitting area TA2, and the light transmitting layer 350 may be located on the third light emitting area LA3 to correspond to the third light transmitting area TA3.

The first wavelength conversion layer 330 may include a first base resin 331, and first wavelength conversion materials 335 located in the first base resin 331. The second wavelength conversion layer 340 may include a second base resin 341, and second wavelength conversion materials 345 located in the second base resin 341. The first wavelength conversion layer 330 and the second wavelength conversion layer 340 may convert the wavelength of blue light of the third color incident from the light emitting elements ED, and may transmit the resultant light. Each of the first wavelength conversion layer 330 and the second wavelength conversion layer 340 may further include scatterers 333 or 343 included in the base resin 331 or 341, and the scatterers 333 and 343 may increase wavelength conversion efficiency.

The light transmitting layer 350 may include a third base resin 351 and scatterers 353 located in the third base resin 351. The light transmitting layer 350 transmits blue light of the third color incident from the light emitting element ED while maintaining the wavelength of the blue light. The scatterers 353 of the light transmitting layer 350 may adjust an emission path of light emitted through the light transmitting layer 350. The light transmitting layer 350 may not include wavelength conversion materials.

The scatterers 333, 343, and 353 may be metal oxide particles or organic particles. The metal oxide may be, for example, titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). The material of the organic particles may be, for example, acrylic resin or urethane resin.

The first through third base resins 331, 341, and 351 may include a light transmitting organic material. For example, the first through third base resins 331, 341, and 351 may include epoxy resin, acrylic resin, cardo resin, or imide resin. The first through third base resins 331, 341, and 351 may all be made of the same material, but the disclosure is not limited thereto.

The first wavelength conversion materials 335 may convert blue light of the third color into red light of the first color, and the second wavelength conversion materials 345 may convert the blue light of the third color into green light of the second color. The first wavelength conversion materials 335 and the second wavelength conversion materials 345 may be quantum dots, quantum rods, or phosphors. The quantum dots may include group IV nanocrystals, group II-VI compound nanocrystals, group III-V compound nanocrystals, group IV-VI nanocrystals, or a combination of the same.

According to one or more embodiments, the wavelength conversion layers 330 and 340 and the light transmitting layer 350 may be formed using an inkjet printing method. The bank layer 400 of the color conversion substrate 30 may form areas in which ink for forming the wavelength conversion layers 330 and 340 and the light transmitting layer 350 is located. In the drawings, the wavelength conversion layers 330 and 340 and the light transmitting layer 350 are formed by an inkjet printing process so that an upper surface of each layer is uneven, that is, edge parts adjacent to the bank layer 400 are higher than a central part (e.g., when the second substrate 310 is therebelow). However, the disclosure is not limited thereto. Each of the wavelength conversion layers 330 and 340 and the light transmitting layer 350 may also have a flat upper surface, or the central part may be higher (e.g., when the second substrate 310 is therebelow), unlike in the drawings.

A second capping layer 393 may be located on (e.g., below) the wavelength conversion layers 330 and 340, the light transmitting layer 350, and the bank layer 400. The second capping layer 393 may reduce or prevent impurities, such as moisture or air, from being introduced from the outside and damaging or contaminating the wavelength conversion layers 330 and 340 and the light transmitting layer 350. The second capping layer 393 may be made of an inorganic insulating material.

A third capping layer 395 may be located on the second capping layer 393. The third capping layer 395 may be a planarization layer that planarizes steps formed by the color filter layers 231 through 233, the wavelength conversion layers 330 and 340, the light transmitting layer 350, etc. located between the third capping layer 395 and the second substrate 310. The third capping layer 395 may be made of an organic insulating material, and a surface of the color conversion substrate 30 may be planarized by the third capping layer 395.

The light emitting elements ED located in different light emitting areas LA1 through LA3 of the display substrate 10 may each emit blue light of the third color, and light output from the light transmitting areas TA1 through TA3 may be light of different respective colors. For example, light emitted from the first light emitting element ED1 located in the first light emitting area LA1 is incident on the first wavelength conversion layer 330, light emitted from the second light emitting element ED2 located in the second light emitting area LA2 is incident on the second wavelength conversion layer 340, and light emitted from the third light emitting element ED3 located in the third light emitting area LA3 is incident on the light transmitting layer 350. The light incident on the first wavelength conversion layer 330 may be converted into red light, the light incident on the second wavelength conversion layer 340 may be converted into green light, and the light incident on the light transmitting layer 350 may be transmitted as the same blue light without wavelength conversion. Even when each subpixel SPXn includes the light emitting elements ED emitting light of the same color, light of different colors may be output according to the arrangement of the wavelength conversion layers 330 and 340 and the light transmitting layer 350 located on the light emitting elements ED.

The first light emitting element ED1 located in the first light emitting area LA1 of the display substrate 10 may emit blue light of the third color, and the light may pass through the encapsulation layer 170, the second capping layer 393, and the third capping layer 395 to enter the first wavelength conversion layer 330. The first base resin 331 of the first wavelength conversion layer 330 may be made of a transparent material, and some of the light may transmit through the first base resin 331 to enter the first capping layer 391 located on the first base resin 331. However, at least a part of the light may enter the scatterers 333 and the first wavelength conversion materials 335 located in the first base resin 331, and may enter the first capping layer 391 after being scattered and wavelength-converted into red light. Light incident on the first capping layer 391 may enter the first color filter layer 231, and the first color filter layer 231 may block or reduce transmission of light other than red light. Accordingly, red light may be output from a first subpixel SPX1.

Similarly, light emitted from the second light emitting element ED2 located in the second light emitting area LA2 may be output as green light after passing through the encapsulation layer 170, the second capping layer 393, the third capping layer 395, the second wavelength conversion layer 340, the first capping layer 391, and the second color filter layer 232.

The third light emitting element ED3 located in the third light emitting area LA3 may emit blue light of the third color, and the light may pass through the encapsulation layer 170, the second capping layer 393, and the third capping layer 395 to enter the light transmitting layer 350. The third base resin 351 of the light transmitting layer 350 may be made of a transparent material, and some of the light may transmit through the third base resin 351 to enter the first capping layer 391 located on the third base resin 351. Light incident on the first capping layer 391 may pass through the first capping layer 391 to enter the third color filter layer 233, and the third color filter layer 233 may block or reduce transmission of light other than blue light. Accordingly, blue light may be output from the third light transmitting area TA3.

In the display device 1 according to one or more embodiments, because the color conversion substrate 30 includes the wavelength conversion layers 330 and 340, the light transmitting layer 350, and the color filter layers 231 through 233 located on the light emitting elements ED, light of different colors can be displayed even when the light emitting elements ED emitting light of the same color are located in each light emitting area LA1, LA2, or LA3 of each display substrate 10.

In the embodiments corresponding to FIG. 5, the color filter layers 231 through 233, the wavelength conversion layers 330 and 340, and the light transmitting layer 350 are each formed on the second substrate 310, and are bonded to the first substrate 110 through the sealing part 50. However, the disclosure is not limited thereto. According to one or more embodiments, the wavelength conversion layers 330 and 340 and the light transmitting layer 350 may also be directly formed on (e.g., above) the first substrate 110, or the color filter layers 231 through 233 may be formed on the first substrate 110, and thus the second substrate 310 may be omitted.

As described above, the wavelength conversion layers 330 and 340 and the light transmitting layer 350 of the color conversion substrate 30 may be formed by an inkjet printing process. In one or more embodiments in which the light transmitting areas TA1 through TA6 of the color conversion substrate 30 are arranged in the first direction DR1 and the second direction DR2, the same wavelength conversion layer 330 or 340 or the light transmitting layer 350 may be located in light transmitting areas arranged in the first direction DR1 (e.g., the first light transmitting area TA1 and the fourth light transmitting area TA4), and different wavelength conversion layers 330 and 340 or the light transmitting layer 350 may be located in light transmitting areas arranged in the second direction DR2 (e.g., the first light transmitting area TA1 and the second light transmitting area TA2). An inkjet printing process may be performed concurrently or substantially simultaneously in the light transmitting areas in which the same wavelength conversion layer 330 or 340 or the light transmitting layer 350 is located. However, an inkjet printing process may be performed separately in each of the light transmitting areas in which different wavelength conversion layers 330 and 340 or the light transmitting layer 350 are located.

In one or more embodiments in which the wavelength conversion layers 330 and 340 and the light transmitting layer 350 are formed by an inkjet printing process, it may be required to accurately spray ink to a position corresponding to each light transmitting area TA. If ink is incorrectly deposited on the bank layer 400 surrounding the light transmitting areas TA, it may remain on the upper surface of the bank layer 400 as a defect that may be visible from the outside of the color conversion substrate 30 or the display device 1. According to one or more embodiments, the color conversion substrate 30 may be structured to cause ink to flow to other areas without remaining on the upper surface of the bank layer 400, even when the ink is incorrectly deposited on the bank layer 400.

Figure 10:
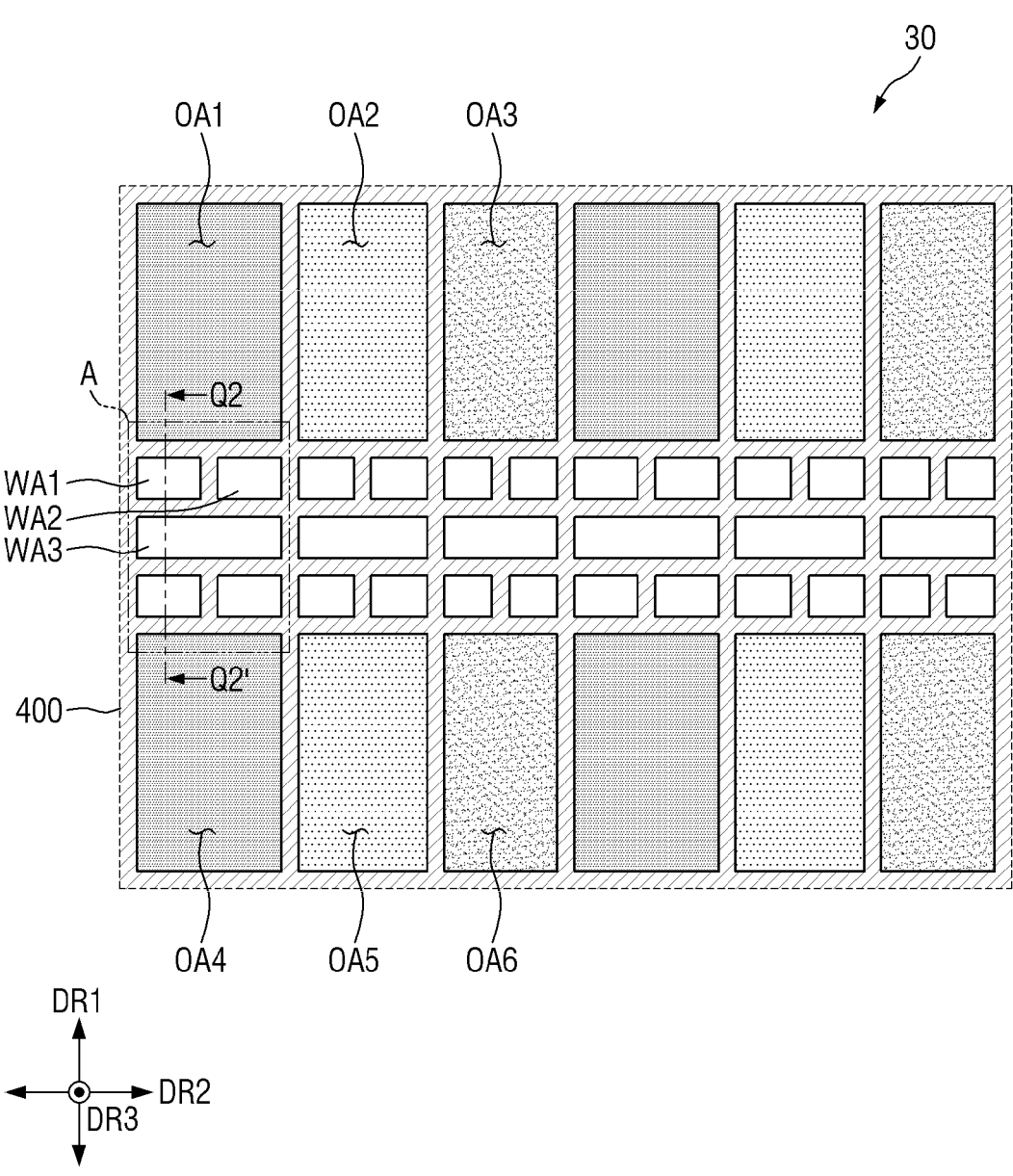
FIG. 10 illustrates the schematic planar arrangement of a bank layer included in the color conversion substrate according to one or more embodiments.
Figure 11:
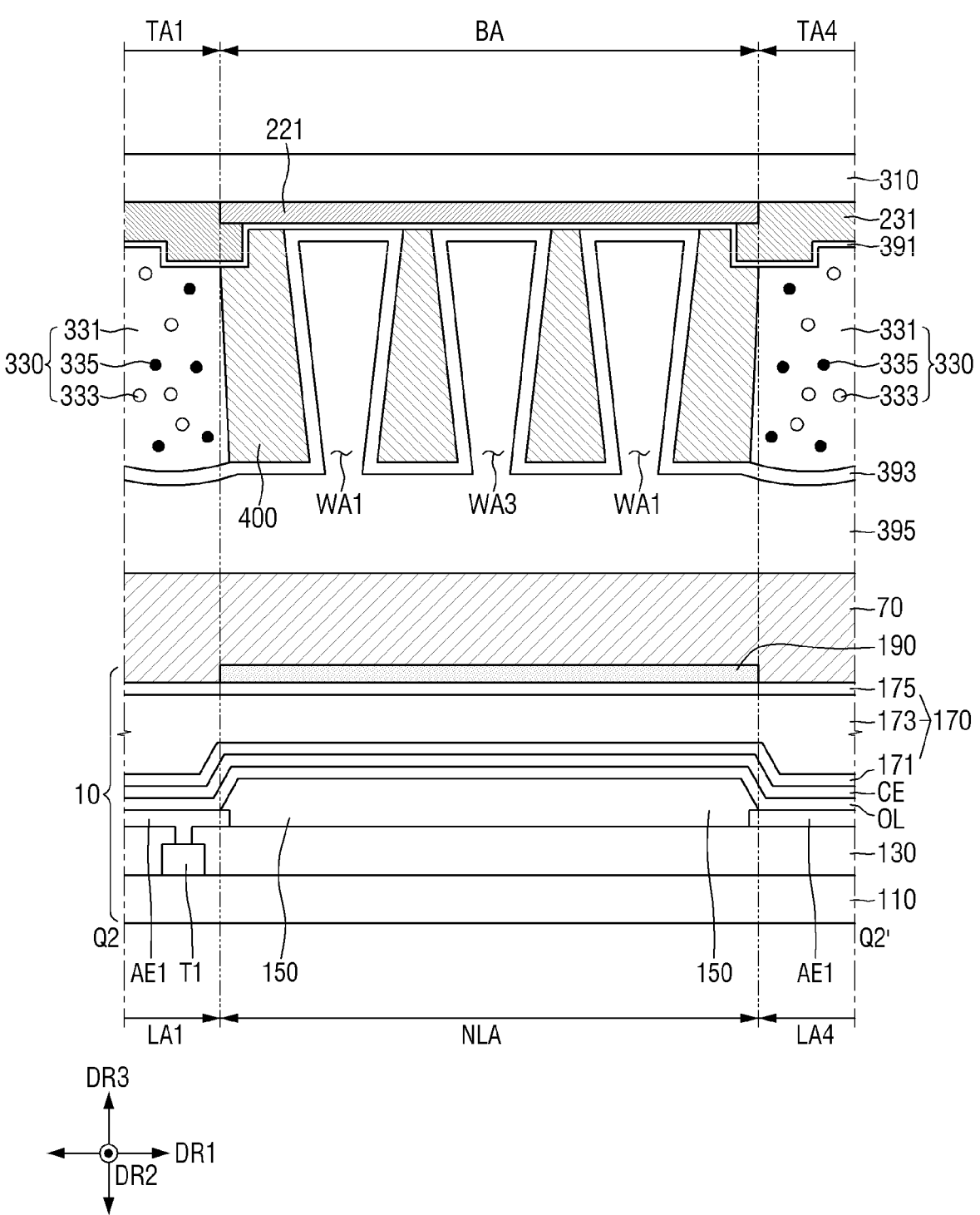
FIG. 11 is a cross-sectional view taken along the line Q2-Q2' of FIG. 10.
Figure 12:
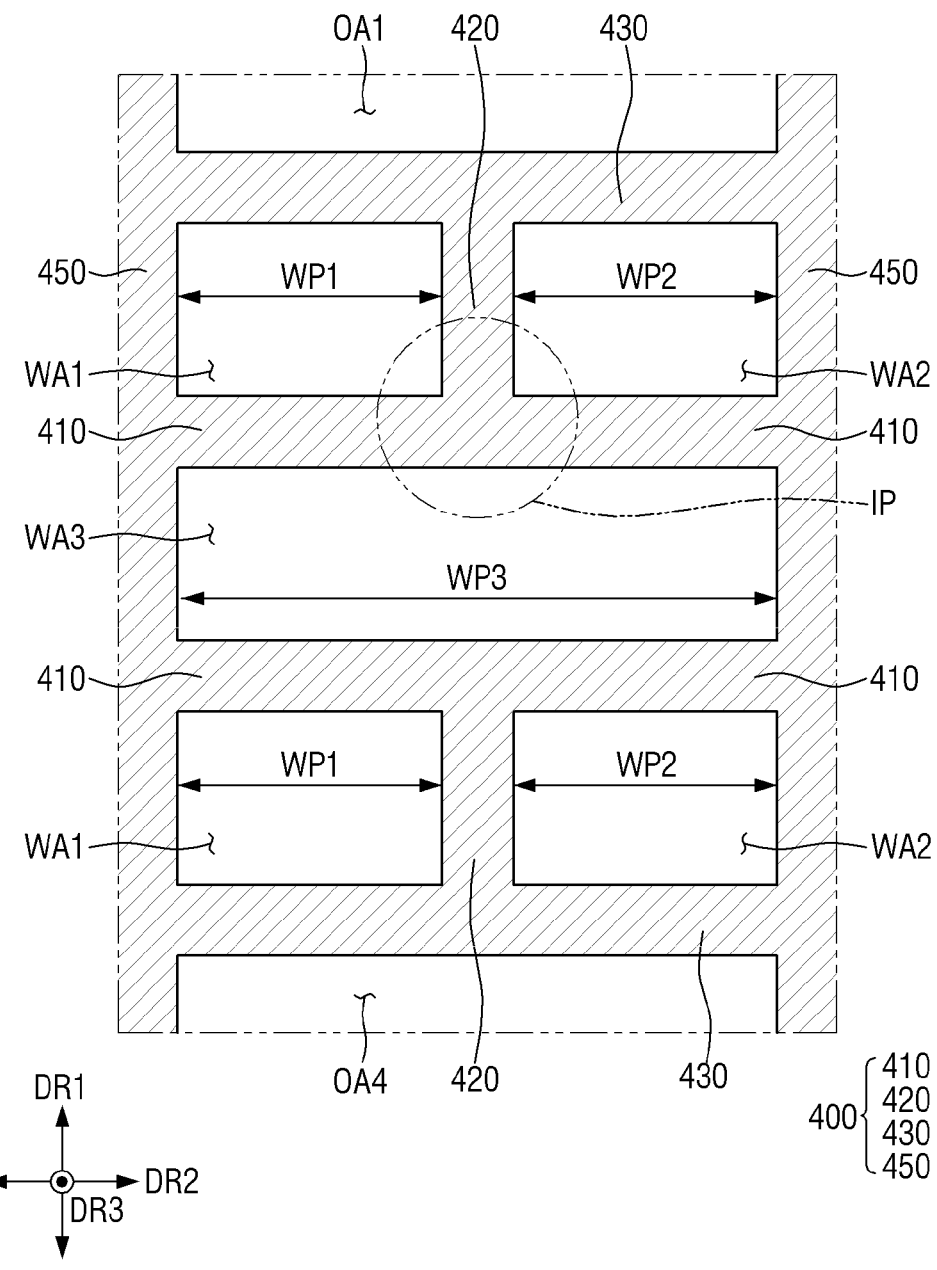
FIG. 12 is an enlarged view of part A of FIG. 10.

FIG. 10 illustrates the schematic planar arrangement of the bank layer 400 included in the color conversion substrate 30 according to one or more embodiments. FIG. 11 is a cross-sectional view taken along the line Q2-Q2' of FIG. 10. FIG. 12 is an enlarged view of part A of FIG. 10. FIG. 10 illustrates the planar arrangement of the bank layer 400 located in the color conversion substrate 30 and surrounding a plurality of areas. FIG. 11 illustrates a cross section taken across openings OA1 and OA4 neighboring each other in the first direction DR1 and the bank layer 400 between them in the first direction DR1. FIG. 12 is a plan view illustrating the bank layer 400 and wells WA1 through WA3 located between a first opening OA1 and a fourth opening OA4 neighboring each other in the first direction DR1.

Referring to FIGS. 10 through 12 in conjunction with FIGS. 5 and 6, the color conversion substrate 30 according to one or more embodiments may include the bank layer 400 extending in the first direction DR1 and the second direction DR2 to surround a plurality of areas. The bank layer 400 may include or define a plurality of openings OA1 through OA6 corresponding to the light transmitting areas TA1 through TA6, and a plurality of wells WA1 through WA3 overlapping the light blocking area BA. The openings OA1 through OA6 and the wells WA1 through WA3 may be parts of the color conversion substrate 30 in which the bank layer 400 extending in the first direction DR1 and the second direction DR2 is not located.

The openings OA1 through OA6 may be arranged in the first direction DR1 and the second direction DR2, like the light transmitting areas TA1 through TA6. The first opening OA1, a second opening OA2, and a third opening OA3 may be sequentially located in the second direction DR2, and the fourth opening OA4, a fifth opening OA5, and a sixth opening OA6 may be sequentially located in the second direction DR2. The first opening OA1 and the fourth opening OA4 may be spaced apart from each other in the first direction DR1, the second opening OA2 and the fifth opening OA5 may be spaced apart from each other in the first direction DR1, and the third opening OA3 and the sixth opening OA6 may be spaced apart from each other in the first direction DR1. The first wavelength conversion layer 330 may be located in each of the first opening OA1 and the fourth opening OA4, the second wavelength conversion layer 340 may be located in each of the second opening OA2 and the fifth opening OA5, and the light transmitting layer 350 may be located in the third opening OA3 and the sixth opening OA6.

Parts of the bank layer 400 that extend in the first direction DR1 may be located between the openings OA1 through OA6 adjacent to each other in the second direction DR2. Parts of the bank layer 400 which extend in the second direction DR2 may be located between the openings OA1 through OA6 adjacent to each other in the first direction DR1. The openings OA1 through OA6 are areas exposed by the bank layer 400 extending in the first direction DR1 and the second direction DR2. The wavelength conversion layers 330 and 340 and the light transmitting layer 350 may be formed by spraying ink into the areas exposed by the bank layer 400.

The wells WA1 through WA3 surrounded by the bank layer 400 may be located between the openings OA1 through OA6 adjacent to each other in the first direction DR1. According to one or more embodiments, the wells WA1 through WA3 may include a first well WA1 and a second well WA2 spaced apart from each other in the second direction DR2, and a third well WA3 spaced apart from the first well WA1 and the second well WA2 in the first direction DR1. For example, a plurality of first wells WA1, a plurality of second wells WA2, and one third well WA3 may be located between the first opening OA1 and the fourth opening OA4. The first wells WA1 may be located adjacent to the first opening OA1 and the fourth opening OA4, respectively, and the second wells WA2 may be spaced apart from the first wells WA1 in the second direction DR2 and also may be located adjacent to the first opening OA1 and the fourth opening OA4, respectively. The third well WA3 may be located between different first wells WA1 and between different second wells WA2. However, the disclosure is not limited thereto, and a greater number of wells WA1 through WA3 may also be located between the openings OA1 through OA6 adjacent in the first direction DR1, or the wells WA1 through WA3 may also be located in a different arrangement from that of FIG. 12.

The bank layer 400 may include parts extending in the first direction DR1 and the second direction DR2 between the openings OA1 through OA6 adjacent in the first direction DR1 to surround the wells WA1 through WA3. The wells WA1 through WA3 may be located on the light blocking member 221 in the light blocking area BA, and the wavelength conversion layers 330 and 340 and the light transmitting layer 350 may not be located in the wells WA1 through WA3. The second capping layer 393, which is located on the bank layer 400, the wavelength conversion layers 330 and 340, and the light transmitting layer 350, may be directly located on the first capping layer 391 in the wells WA1 through WA3, and a part of the third capping layer 395 may be located on the second capping layer 393 in the wells WA1 through WA3. A part of the third capping layer 395 may be located on the second capping layer 393 not to overlap the bank layer 400, the wavelength conversion layers 330 and 340, and the light transmitting layer 350. The third capping layer 395 may compensate for a step difference due to the bank layer 400 surrounding the wells WA1 through WA3, and may planarize a surface of the color conversion substrate 30.

The wells WA1 through WA3 are areas to which ink for forming the wavelength conversion layers 330 and 340 and the light transmitting layer 350 is not sprayed, but may be areas to which ink incorrectly deposited on the bank layer 400 flows. When some of the ink sprayed to the openings OA1 through OA6 is sprayed between the openings OA1 through OA6, it may be deposited on the bank layer 400 or in the wells WA1 through WA3. However, because the color conversion substrate 30 according to one or more embodiments includes the wells WA1 through WA3 that can accommodate the incorrectly deposited ink, it is possible to reduce or prevent the likelihood of a defect in which ink remains on the bank layer 400 and is seen from the outside.

Meanwhile, even when the color conversion substrate 30 includes the wells WA1 through WA3 located in the light blocking area BA, ink may be deposited and remain on the bank layer 400. To reduce or prevent the likelihood of this, in the color conversion substrate 30 according to one or more embodiments, the bank layer 400 surrounding the wells WA1 through WA3 may be structured to cause ink incorrectly deposited thereon to flow to the wells WA1 through WA3.

The bank layer 400 may include parts extending in the first direction DR1 and the second direction DR2, and the parts extending in the first direction DR1 and the second direction DR2 may intersect each other. The bank layer 400 may include intersections IP where the parts extending in the first direction DR1 and the parts extending in the second direction DR2 meet. Each intersection IP where parts extending in different directions meet may have a relatively larger area than other extending parts. In the color conversion substrate 30 according to one or more embodiments, the bank layer 400 may be structured to reduce or minimize the area of each intersection IP, and to cause ink deposited thereon to flow to the wells WA1 through WA3.

According to one or more embodiments, the bank layer 400 may include first bank parts 410 extending in the second direction DR2 between the openings OA1 through OA6 adjacent to each other in the first direction DR1, second bank parts 420 connected to the first bank parts 410 and extending in the first direction DR1, and third bank parts 430 connected to the second bank parts 420 and extending in the second direction DR2. In addition, the bank layer 400 may further include bank extension parts 450 extending in the first direction DR1 between the openings OA1 through OA6 adjacent to each other in the second direction DR2. The first bank parts 410 and the second bank parts 420 may be inner bank parts surrounding and contacting the wells WA1 through WA3, and the third bank parts 430 and the bank extension parts 450 may be outer bank parts partially surrounding and contacting the openings OA1 through OA6. In each of the openings OA1 through OA6, sides extending in the first direction DR1 may be in contact with the bank extension parts 450, and sides extending in the second direction DR2 may be in contact with the third bank parts 430. In each of the wells WA1 through WA3, each side extending in the second direction DR2 may be in contact with a first bank part 410 or a third bank part 430, and each side extending in the first direction DR1 may be in contact with a second bank part 420 or a bank extension part 450. Both sides of each of the first bank parts 410 and the third bank parts 430 in the second direction DR2 may be connected to the bank extension parts 450, and the first bank parts 410 and the third bank parts 430 may be connected to each other through the second bank parts 420 located between them. However, the bank extension parts 450 may not necessarily be distinguished from the second bank parts 420. For example, each of the bank extension parts 450 may be one of the bank parts extending in the first direction DR1 and may be one of the different second bank parts 420.

The first bank parts 410 and the second bank parts 420, which are inner bank parts of the bank layer 400, may extend in the second direction DR2 and the first direction DR1, respectively, and may meet each other. In addition, the second bank parts 420 and the third bank parts 430 may extend in the first direction DR1 and the second direction DR2, respectively, and may meet each other. An intersection IP of the bank layer 400 may be formed at each part where the bank parts 410, 420, and 430 meet, and each of the bank parts 410, 420, and 430 meeting each other may not cross the other bank parts 410, 420, and 430. Thus, the area of the intersection IP can be reduced or minimized.

For example, the first bank parts 410 may be connected to the second bank parts 420 to form intersections IP, but the second bank parts 420 may not cross the first bank parts 410. A first side, which is a side of each first bank part 410 in the first direction DR1, may be in contact with the third well WA3, and a second side, which is the other side of each first bank part 410 in the first direction DR1, may be in contact with the first and second wells WA1 and WA2. The first side of each first bank part 410 may not be connected to another bank part, but the second side may be connected to a second bank part 420 located between the first and second wells WA1 and WA2. The second bank part 420 may branch from the second side of each first bank part 410 to extend in the first direction DR1. Similarly, the third bank parts 430 may be connected to the second bank parts 420 to form intersections IP, but the second bank parts 420 may not cross the third bank parts 430. A third side, which is a side of each third bank part 430 in the first direction DR1, may be in contact with some the first and second wells WA1 and WA2, and a fourth side, which is the other side of each third bank part 430 in the first direction DR1, may be in contact with others of the first and second wells WA1 and WA2. The third side of each third bank part 430 may not be connected to another bank part, but the fourth side may be connected to a second bank part 420 located between the first and second wells WA1 and WA2. The second bank part 420 may branch from the fourth side of each third bank part 430 to extend in the first direction DR1. The bank parts 410, 420, and 430 extending in the first direction DR1 and the second direction DR2 between the wells WA1 through WA3 may meet each other but may not cross each other. That is, because the bank parts 410, 420, and 430 branch or extend not in four directions, but instead in three directions, at each intersection IP of the bank layer 400, the planar area of each intersection IP can be reduced.

According to one or more embodiments, the wells WA1 through WA3 surrounded by the bank layer 400 may have different widths or may be staggered with each other. Therefore, each intersection IP of the bank layer 400 may have a small area. For example, as illustrated in FIG. 12, a first width WP1 of each first well WA1 measured in the second direction DR2 may be the same as a second width WP2 of each second well WA2, but may be less than a third width WP3 of the third well WA3.

Alternatively, a distance between a second bank part 420 and a bank extension part 450 may be less than a distance between the bank extension parts 450. The third width WP3 of the third well WA3 may be the same as a width of the first opening OA1 or the width WT1 of the first light transmitting area TA1, and the first and second wells WA1 and WA2, each having a width less than the third width WP3, may be spaced apart from each other in the second direction DR2. Each second bank part 420 located between the first and second wells WA1 and WA2 may have both sides in the first direction DR1 connected to a first bank part 410 and a third bank part 430, respectively, and the both sides may face the third well WA3 and the first opening OA1 or the fourth opening OA4, respectively.

Because the wells WA1 through WA3 located between the first opening OA1 and the fourth opening OA4 have different widths WP1 through WP3, and are spaced apart from each other in the first direction DR1 and the second direction DR2, parts of the bank layer 400 that extend in the second direction DR2 may not be continuous. The second bank parts 420 located between the first opening OA1 and the fourth opening OA4 may extend in the first direction DR1 with the third well WA3 interposed between them, and may be respectively connected to the first bank parts 410 while not crossing the first bank parts 410. Because each intersection IP of the bank layer 400 is formed by the bank parts 410, 420, and 430 extending to both sides in the second direction DR2 and to only one side in the first direction DR1, the area of the intersection IP can be reduced.

In the drawings, the bank parts 410, 420, and 430 extend in three directions at each intersection IP of the wells WA1 through WA3 located between the openings OA1 through OA6 adjacent to each other in the first direction DR1.

However, the disclosure is not limited thereto. The color conversion substrate 30 may also be structured such that the bank parts 410, 420, and 430 of the bank layer 400 branch or extend in three directions at each intersection IP formed as a point where the bank parts 410, 420, and 430 extending in the first direction DR1 and the second direction DR2 meet. Accordingly, the arrangement of the wells WA1 through WA3 and the openings OA1 through OA6 or the structure of the bank layer 400 located between them may be variously changed.

Because the same wavelength conversion layer 330 or 340 or the light transmitting layer 350 is located in the openings OA1 through OA6 arranged in the first direction DR1, ink may be sprayed concurrently or substantially simultaneously to the openings OA1 through OA6 arranged in the first direction DR1 in an inkjet printing process. When the ink is sprayed to the openings OA1 through OA6 surrounded by the bank layer 400, the ink may be incorrectly deposited between the openings OA1 through OA6 adjacent in the first direction DR1 due to an alignment error of an inkjet printing device and the second substrate 310.

According to one or more embodiments, the wells WA1 through WA3 surrounded by the bank layer 400 may be located between the openings OA1 through OA6 of the color conversion substrate 30 that are adjacent in the first direction DR1, and ink incorrectly deposited between the openings OA1 through OA6 adjacent in the first direction DR1 may flow to the wells WA1 through WA3 without remaining on the bank layer 400. In addition, because the bank layer 400 is structured to reduce or minimize the area of each intersection IP, ink incorrectly deposited on the intersections IP of the bank layer 400 between the openings OA in an inkjet printing process may flow to the surrounding wells WA1 through WA3. Thus, the color conversion substrate 30 according to one or more embodiments can reduce or prevent ink from remaining on the bank layer 400, and thus preventing the ink from being seen as a defect from the outside.

The arrangement of the bank parts 410, 420, and 430 for reducing the area of each intersection IP of the bank layer 400 is not limited to that illustrated in FIG. 12. According to one or more embodiments, in the color conversion substrate 30, the shape or arrangement of the bank layer 400 located between the openings OA1 through OA6 can be variously changed as long as incorrectly deposited ink may be reduced or prevented from remaining on the bank layer 400. Various embodiments of the planar arrangement of the bank layer 400 included in the color conversion substrate 30 will now be described.

Figure 13:
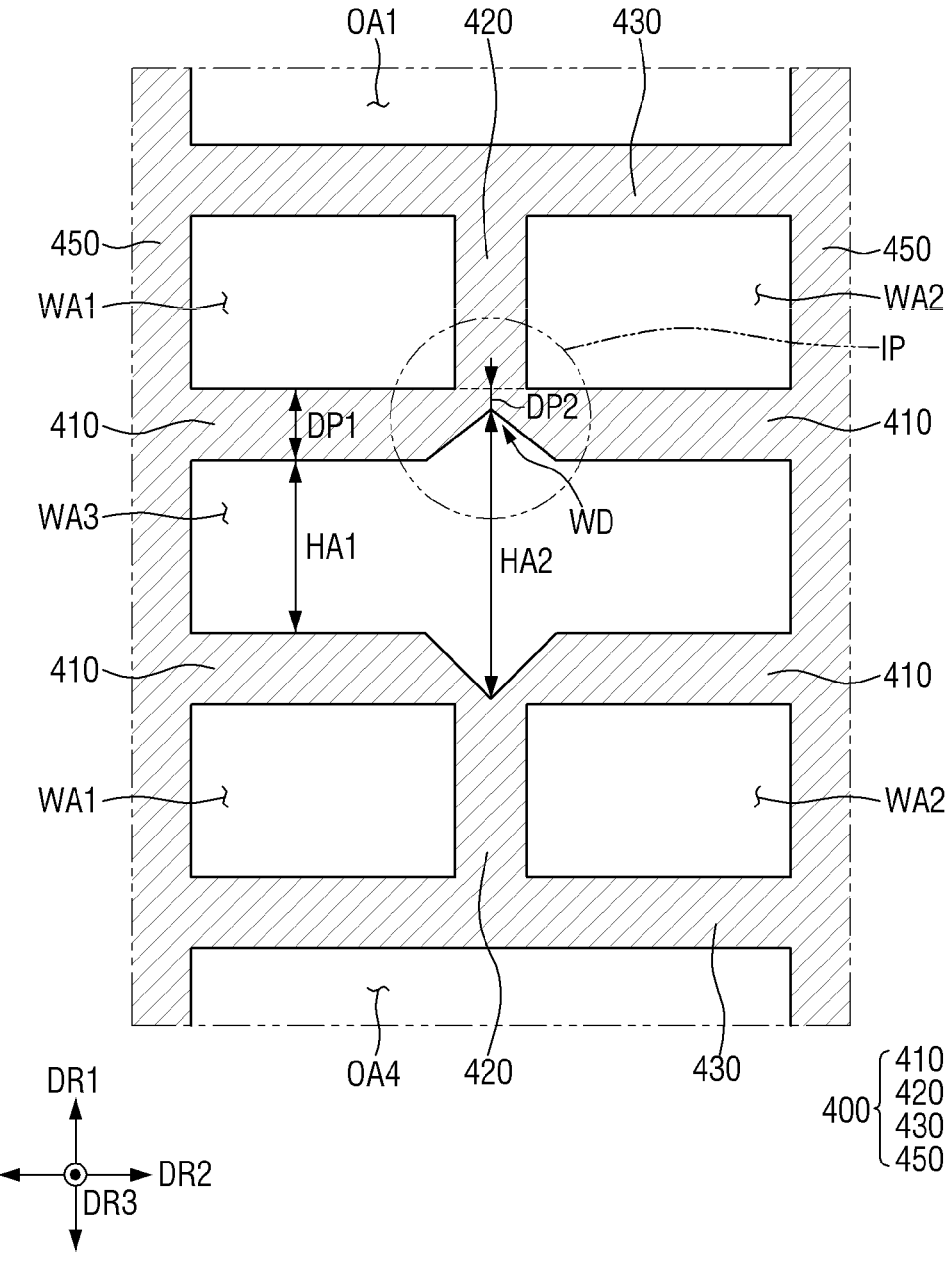
FIG. 13 illustrates the schematic planar arrangement of a bank layer included in a color conversion substrate according to one or more embodiments.

FIG. 13 illustrates the schematic planar arrangement of a bank layer 400 included in a color conversion substrate 30 according to one or more embodiments.

Referring to FIG. 13, the color conversion substrate 30 according to one or more embodiments may include a recess WD formed at each intersection IP where several bank parts 410, 420, and 430 of the bank layer 400 meet. The recess WD may be recessed inwardly from a side of a bank part 410, 420, or 430 at each intersection IP of the bank layer 400, and may further reduce the area of each intersection IP. The recesses WD formed in the bank layer 400 may be structured to cause ink deposited on the intersections IP to flow to wells WA1 through WA3. As described above, each intersection IP of the bank layer 400 may be a part where a bank part 410, 420, or 430 extending in one direction meets another bank part 410, 420, or 430 but does not cross it. Accordingly, at each intersection IP, a well WA1, WA2, or WA3 may be formed in a direction in which the bank parts

410, 420, and 430 do not extend, and the recess WD that is recessed inwardly from a side of a bank part 410, 420, or 430 may be formed in the direction in which the bank parts 410, 420, and 430 do not extend.

For example, at each intersection IP where a first bank part 410 and a second bank part 420 meet, a second side of the first bank part 410 may be in contact with a third well WA3 without being connected to the second bank part 420. The second side of the first bank part 410 may be a side from which the bank parts 410, 420, and 430 of the bank layer 400 do not branch or extend, and the recess WD may be formed in a part of the second side which is side by side with the second bank part 420. In each first bank part 410 extending in the second direction DR2, a first bank width DP1 between the third well WA3 and a first well WA1 or a second well WA2 may be greater than a second bank width DP2 of a part where the recess WD is formed. In the case of the third well WA3, a first well width HA1 of an area between the first wells WA1 may be less than a second well width HA2 between the intersections IP where the recesses WD are formed. Alternatively, among distances between the first bank parts 410 spaced apart from each other in the first direction DR1, a distance between the intersections IP where the recesses WD are formed may be greater than a distance between parts where the recesses WD are not formed. In one or more embodiments, the first bank width DP1 of the bank layer 400 may be in the range of about 4 μm to about 20 μm, and the second bank width DP2 of each part where the recess WD is formed may be in a range that is less than the above range.

At each intersection IP where the first bank part 410 and the second bank part 420 meet, because the recess WD recessed inwardly is formed in a part where the first bank part 410 and the second bank part 420 do not extend, the planar area of each intersection IP can be further reduced. Ink deposited on an intersection IP of the bank layer 400 may flow to the third well WA3 facing a side where the recess WD is formed, and may be reduced or prevented from remaining on the bank layer 400.

Figure 14:
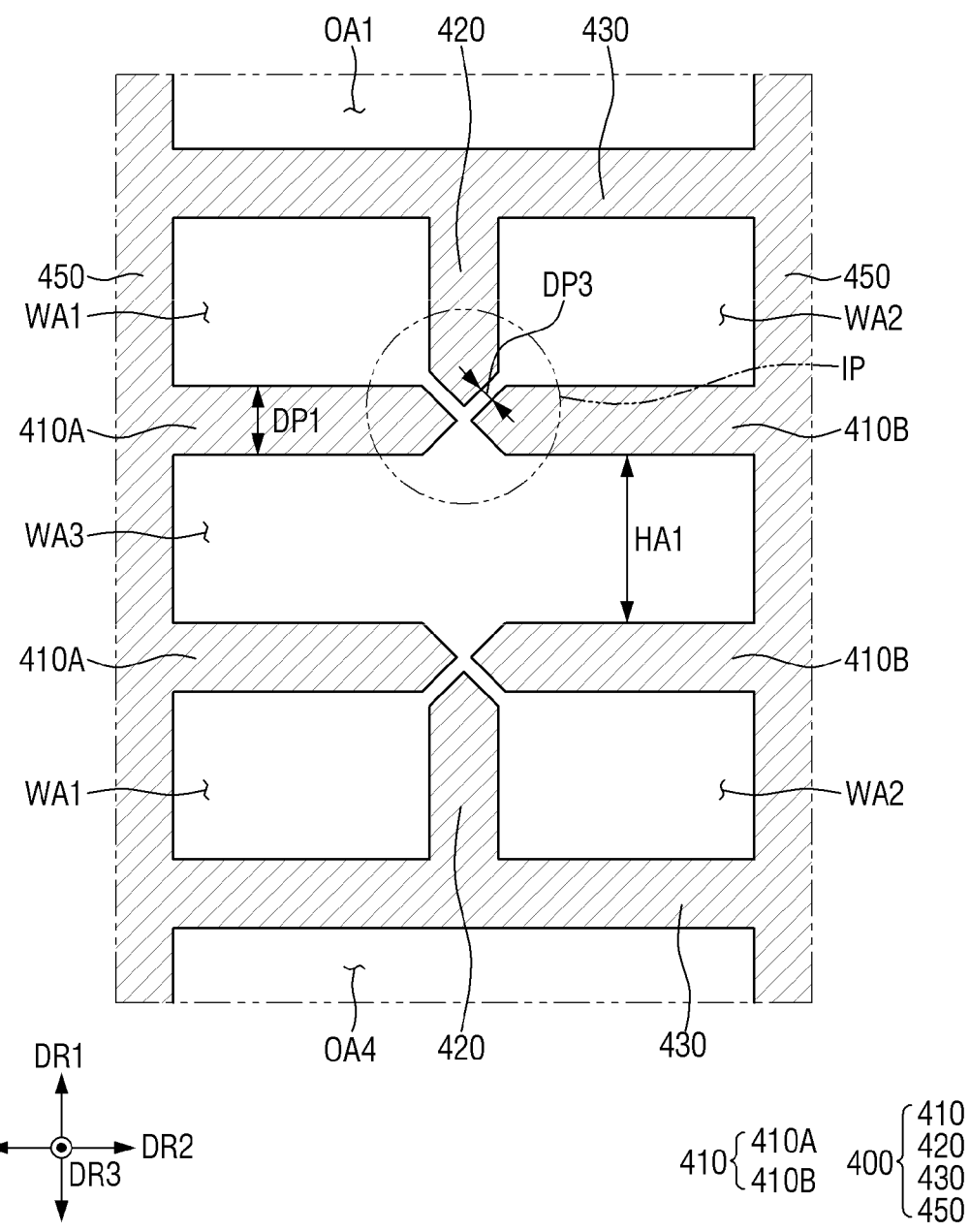
FIG. 14 illustrates the schematic planar arrangement of a bank layer included in a color conversion substrate according to one or more embodiments.

FIG. 14 illustrates the schematic planar arrangement of a bank layer 400 included in a color conversion substrate 30 according to one or more embodiments.

Referring to FIG. 14, in the color conversion substrate 30 according to one or more embodiments, different bank parts 410, 420, and 430 may be spaced apart from each other at each intersection IP where several bank parts 410, 420, and 430 of the bank layer 400 meet. For example, a second bank part 420 extending in the first direction DR1 may not be connected to a first bank part 410 (410A and 410B) extending in the second direction DR2, but instead may be at least partially spaced apart from the first bank part 410 at each intersection IP where they meet (e.g., where they are adjacent). Each first bank part 410 may include a first sub-bank part 410A located on a left side of an intersection IP, which is a side in the second direction DR2, and a second sub-bank part 410B located on a right side of the intersection IP, which is the other side in the second direction DR2, and the first sub-bank part 410A and the second sub-bank part 410B may also be spaced apart from each other. The first sub-bank part 410A and the second sub-bank part 410B of each first bank part 410 may extend in the second direction DR2. The second bank parts 420 may extend in the first direction DR1, but may become narrower at the intersections IP, and might not be connected to each other. A first bank width DP1 of each of the bank parts 410, 420, and 430 of the bank layer 400 may be greater than a distance DP3 between the bank parts 410, 420, and 430 meeting at each intersection IP. For example, the distance DP3 between the bank parts 410, 420, and 430 may be in the range of, but not limited to, about 0.1 μm to about 2 μm.

Because the bank parts 410, 420, and 430 extending in the first direction DR1 and the second direction DR2 are at least partially spaced apart without being connected to each other, liquid repellency may be weakened at each intersection IP so that ink can flow to the surrounding wells WA1 through WA3. In the color conversion substrate 30, because the bank parts 410, 420, and 430 of the bank layer 400 are spaced apart from each other at each intersection IP, the area of each intersection IP can be reduced. In addition, because the bank layer 400 is structured to cause ink deposited thereon to flow to the wells WA1 through WA3, the ink can be reduced or prevented from remaining on the bank layer 400.

This structure of the bank layer 400 may be formed through a mask pattern so that the bank parts 410, 420, and 430 of the bank layer 400 are spaced apart from each other at each intersection IP. However, even when the bank parts 410, 420, and 430 are designed to be spaced apart from each other at each intersection IP of the bank layer 400 through the design of a mask pattern, because the distance DP3 between the bank parts 410, 420, and 430 is less than the first bank width DP1 of each of the bank parts 410, 420, and 430, the bank parts 410, 420, and 430 that are different from each other may not be completely spaced apart from each other. However, although the bank parts 410, 420, and 430 meeting at each intersection IP may partially contact each other, materials that form the bank parts 410, 420, and 430 may just meet without being connected to each other. For example, the bank parts 410, 420, and 430 of the bank layer 400 may be spaced apart from each other at each intersection IP, or a physical boundary may be formed between them even when they contact each other. Accordingly, liquid repellency may be weakened at each intersection IP according to the arrangement of the bank parts 410, 420, and 430, and thus ink may flow to the surrounding wells WA1 through WA3.

Figure 15:
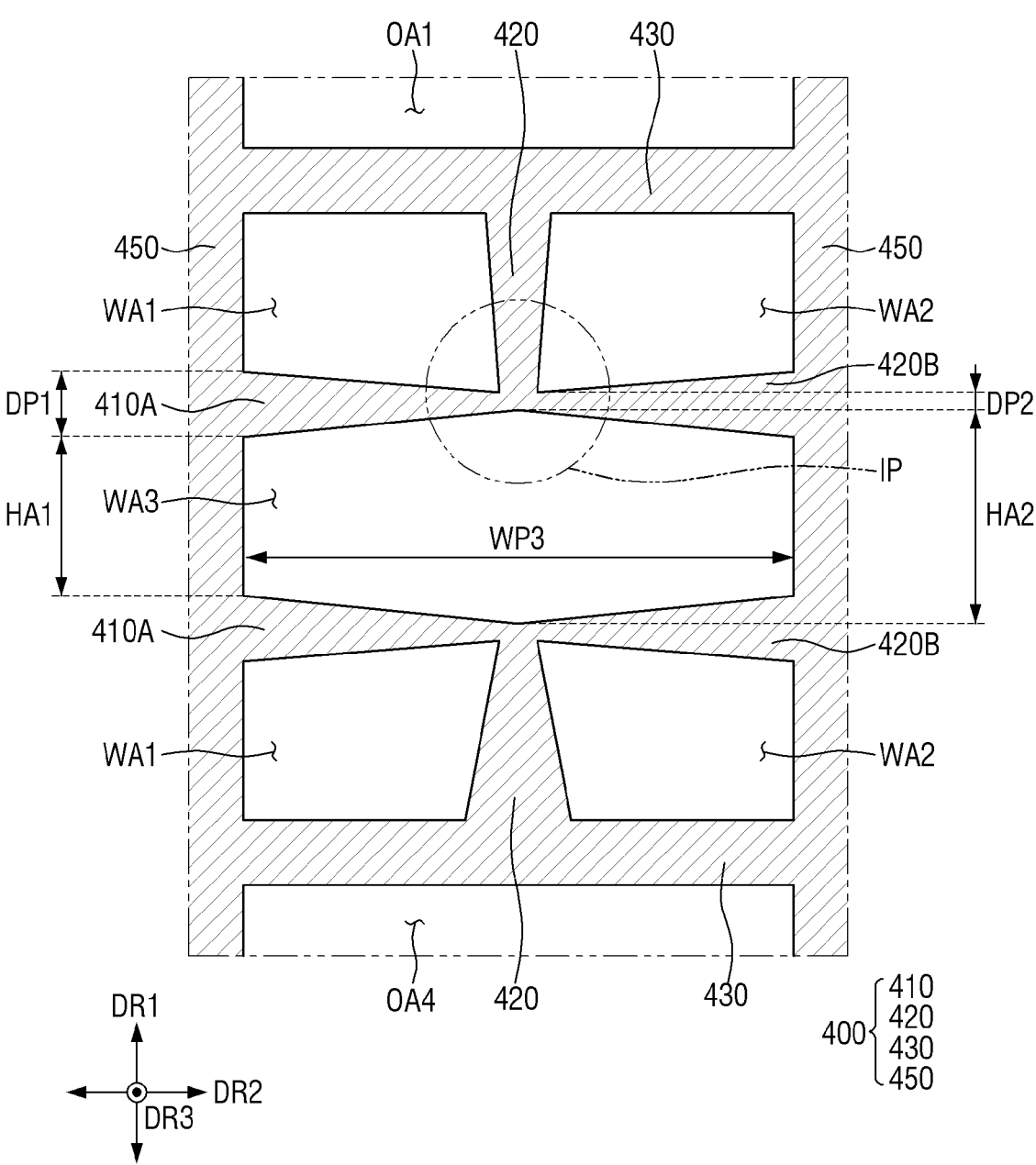
FIG. 15 illustrates the schematic planar arrangement of a bank layer included in a color conversion substrate according to one or more embodiments.

FIG. 15 illustrates the schematic planar arrangement of a bank layer 400 included in a color conversion substrate 30 according to one or more embodiments.

Referring to FIG. 15, in the color conversion substrate 30 according to one or more embodiments, some of bank parts 410, 420, and 430 of the bank layer 400 may extend in one direction but may become narrower toward each intersection IP. For example, each second bank part 420 extending in the first direction DR1 may be connected to a first bank part 410 extending in the second direction DR2, but a part connected to the first bank part 410 may be narrower than a part connected to a third bank part 430. Similarly, in each first bank part 410, a part connected to a second bank part 420 may be narrower than parts connected to bank extension parts 450. According to one or more embodiments, a maximum width of each first bank part 410, that is, a first bank width DP1 of the parts connected to the bank extension parts 450 may be greater than a minimum width of the first bank part 410, that is, a second bank width DP2 of the part meeting the second bank part 420 at an intersection IP. A maximum width of each second bank part 420, that is, a width of the part connected to the third bank part 430 may be greater than a minimum width of the second bank part 420, that is, a width of the part meeting the first bank part 410 at an intersection IP. In one or more embodiments, the first bank width DP1 may be in the range of about 1.2 times to about 1.8 times the second bank width DP2. In one or more embodiments in which the first bank width DP1 is about 14 μm, the second bank width DP2 may be about 11 μm. However, the disclosure is not limited thereto.

In one or more embodiments in which the third bank parts 430 and the bank extension parts 450 have a constant width, sides of first and second wells WA1 and WA2 that are in contact with the first and second bank parts 410 and 420 may be inclined. Sides of a third well WA3, which are in contact with the first and second bank parts 410 and 420, may also be inclined. In the third well WA3, a second well width HA2 of an area where the intersections IP are located between the second bank parts 420 may be greater than a first well width HA1 of sides in contact with the bank extension parts 450.

Because the bank parts 410 and 420 extending in the first direction DR1 and the second direction DR2 become narrower at each intersection IP where they meet each other, the area of each intersection IP can be further reduced. Accordingly, the color conversion substrate 30 can be reduce or prevent a defect in which ink remains on the bank layer 400 and is seen from the outside.

In the above-described embodiments, the bank parts 410, 420, and 430 of the bank layer 400 may be structured to extend in the first direction DR1 or the second direction DR2. That is, the bank parts 410, 420, and 430 may extend in directions orthogonal to each other so that an included angle between the directions in which the bank parts 410, 420, and 430 extend at each intersection IP of the bank layer 400 is about 90 degrees, but the disclosure is not limited thereto. When the bank parts 410, 420, and 430 branch or extend in three or fewer directions at each intersection IP, the area of each intersection IP of the bank layer 400 may be reduced.

Figure 16:
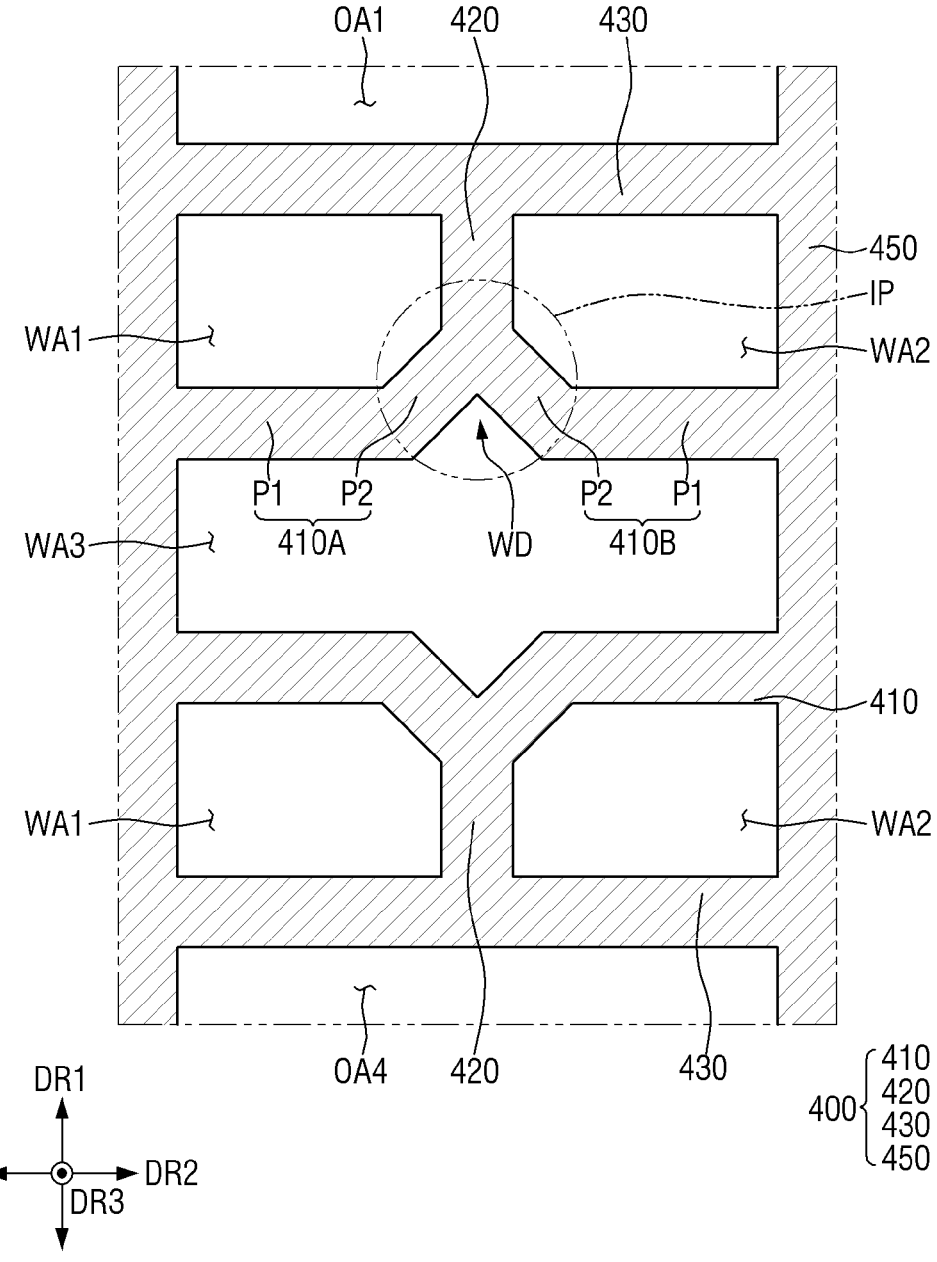
FIGS. 16 and 17 illustrate the schematic planar arrangements of bank layers included in color conversion substrates according to embodiments.
Figure 17:
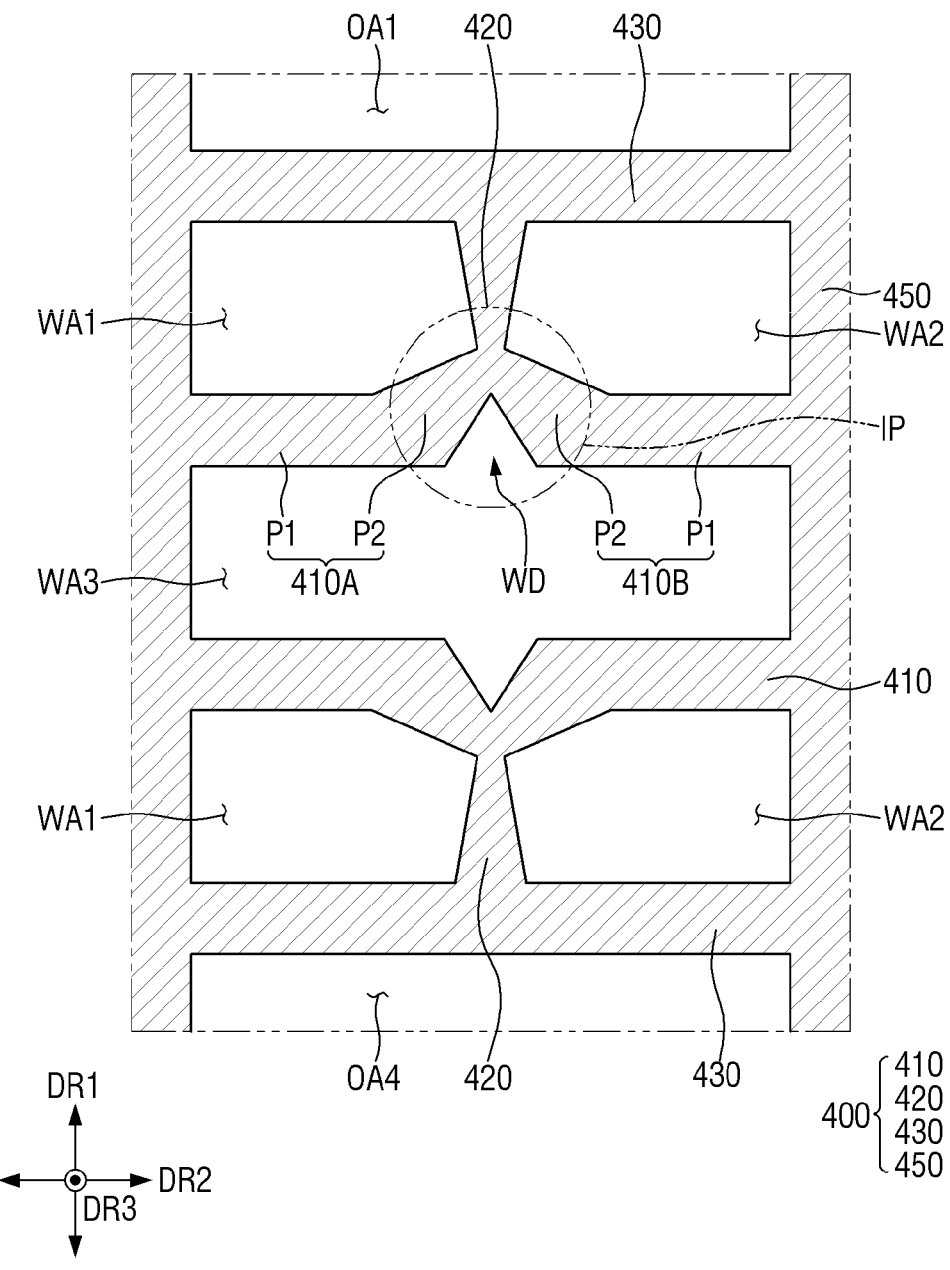

FIGS. 16 and 17 illustrate the schematic planar arrangements of bank layers 400 included in color conversion substrates 30 according to embodiments.

Referring to FIG. 16, in a color conversion substrate 30 according to one or more embodiments, some of bank parts 410, 420, and 430 of a bank layer 400 may extend in one direction but may also extend in a diagonal direction at each intersection IP. For example, each first bank part 410 may include a first part P1 extending in the second direction DR2 and connected to a bank extension part 450, and a second part P2 extending in a diagonal direction between the first direction DR1 and the second direction DR2 at an intersection IP, and connected to the first part P1 and a second bank part 420. At each intersection IP where a first bank part 410 and a second bank part 420 meet, the first bank part 410 may extend in a diagonal direction, and the second bank part 420 may extend in the first direction DR1. Accordingly, the bank parts 410, 420, and 430 extending in three directions at each intersection IP may extend in the first direction DR1 and in a diagonal direction not perpendicular to the first direction DR1. That is, the bank parts 410, 420, and 430 may partially extend in directions diagonal to each other so that an included angle between the directions in which the bank parts 410, 420, and 430 extend at each intersection IP of the bank layer 400 is more than about 90 degrees.

As described above, when the bank parts 410, 420, and 430 branch or extend in three directions at each intersection IP where the bank parts 410, 420, and 430 extending in different directions meet, the planar area of each intersection IP can be reduced or minimized. The bank layer 400 generally extends in the first direction DR1 and the second direction DR2, but may include parts extending in a diagonal direction while surrounding wells WA1 through WA3 located between openings OA. According to one or more embodiments, even when the bank layer 400 does not necessarily extend in the first direction DR1 or the second direction DR2, if ink can be reduced or prevented from remaining on the bank layer 400, the bank layer 400 may be structured to reduce the area of each intersection IP where the bank parts 410, 420, and 430 meet.

Referring to FIG. 17, in a color conversion substrate 30 according to one or more embodiments, some of bank parts 410, 420, and 430 of a bank layer 400 may extend in one direction, but also may extend in a diagonal direction at each intersection IP, and a part extending in the diagonal direction may become narrower toward the intersection IP. In the embodiments corresponding to FIG. 17, some of the bank parts 410, 420, and 430 may partially become narrower as in the embodiments corresponding to FIG. 16 in the embodiments corresponding to FIG. 15. A description of the embodiments corresponding to FIG. 17 is the same as the above description of the embodiments of FIGS. 15 and 16, and thus a redundant description will be omitted.

In the above-described embodiments, a third well WA3 not adjacent to openings OA among a plurality of wells WA1 through WA3 may have a larger area than the other wells WA1 and WA2. However, the disclosure is not limited thereto. Even when the wells WA1 through WA3 have the same area, or the third well WA3 has an area that is less than the other wells WA1 and WA2, the bank layer 400 may be located such that each intersection IP of the bank parts 410, 420, and 430 has a relatively small area.

Figure 18:
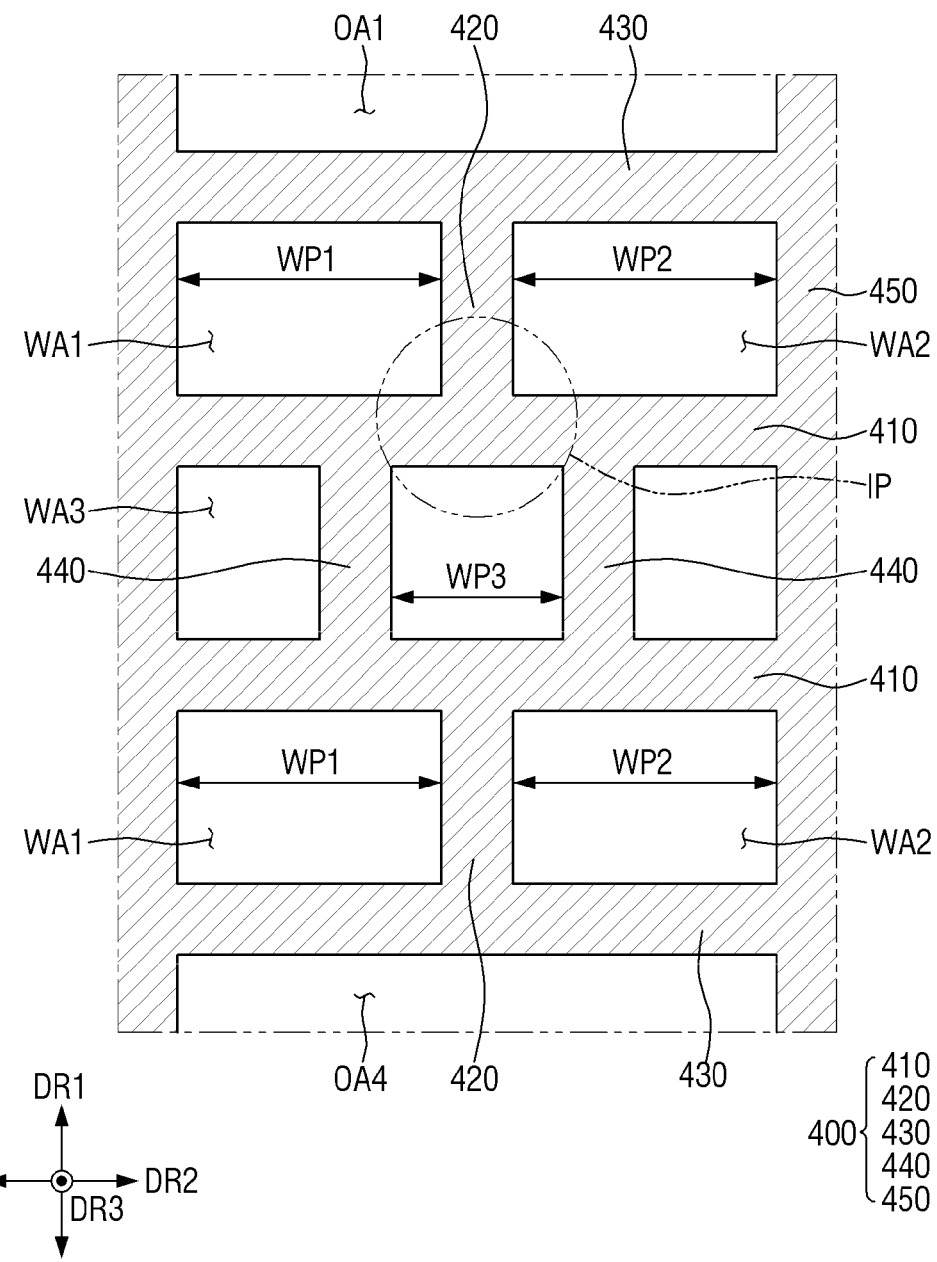
FIGS. 18 through 20 illustrate the schematic planar arrangements of bank layers included in color conversion substrates according to embodiments.
Figure 19:
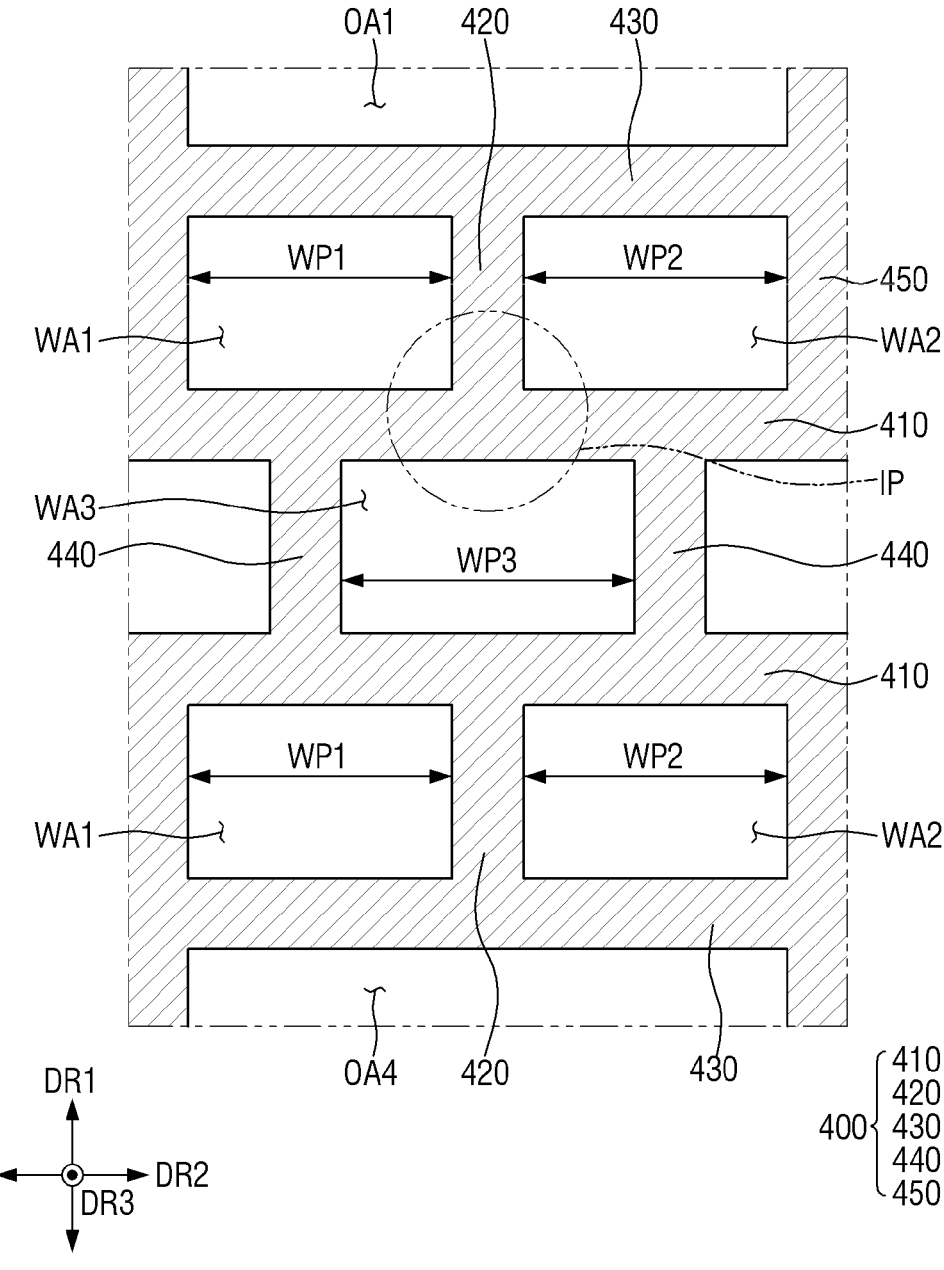
Figure 20:
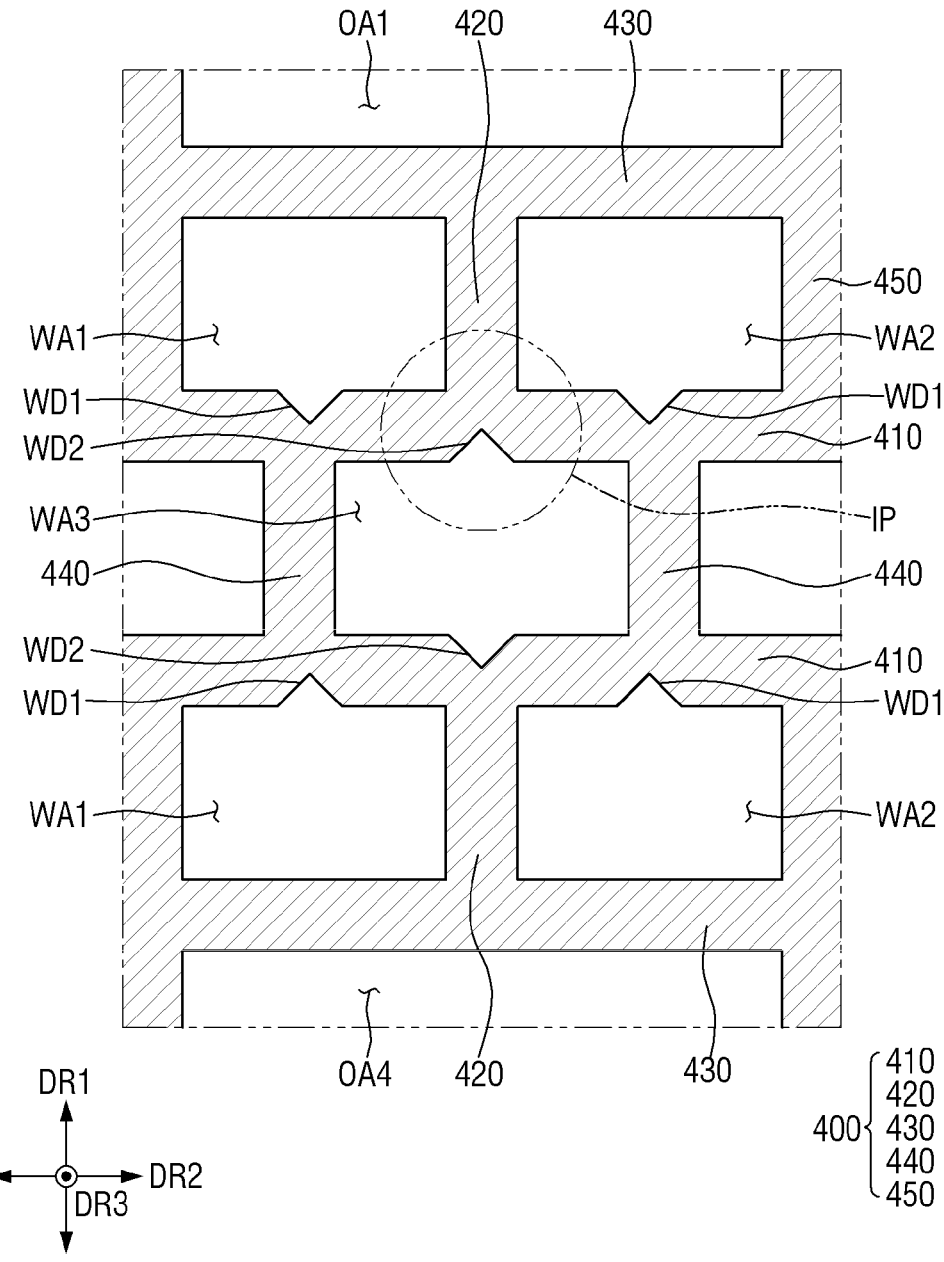

FIGS. 18 through 20 illustrate the schematic planar arrangements of bank layers 400 included in color conversion substrates 30 according to embodiments.

Referring to FIG. 18, in a color conversion substrate 30 according to one or more embodiments, a width WP3 of each third well WA3 may be less than widths WP1 and WP2 of first and second wells WA1 and WA2, and a bank layer 400 may further include fourth bank parts 440, each extending in the first direction DR1 in a region between different third wells WA3 and connected to different first bank parts 410. The bank layer 400 may include a plurality of first bank parts 410 and a plurality of third bank parts 430 extending in the second direction DR2 and a plurality of second bank parts 420, a plurality of fourth bank parts 440, and a plurality of bank extension parts 450 extending in the first direction DR1. Unlike the bank extension parts 450 extending in the first direction DR1 between openings OA adjacent to each other in the second direction DR2, the second bank parts 420 and the fourth bank parts 440 may extend in the first direction DR1 between openings OA adjacent to each other in the first direction DR1, and may meet the bank parts 410 and 430 extending in the second direction DR2.

Each of the first and second wells WA1 and WA2 may be surrounded by a first bank part 410, a second bank part 420, a third bank part 430, and a bank extension part 450. Each of the third wells WA3 may be surrounded by the first bank parts 410, a fourth bank part 440, and a bank extension part 450. The third width WP3 of each third well WA3 may be less than a width of a first opening OA1 or a width WT1 of a first light transmitting area TA1, and the first and second wells WA1 and WA2, each having a width greater than the third width WP3, may be spaced apart from each other in the second direction DR2. Each second bank part 420 located between the first and second wells WA1 and WA2 may have both sides in the first direction DR1 connected to a first bank part 410 and a third bank part 430, respectively, and the both sides may face a third well WA3 and the first opening OA1 or a fourth opening OA4, respectively. Similarly, each fourth bank part 440 located between the third wells WA3 may have both sides in the first direction DR1 connected to different first bank parts 410, respectively, and the both sides may face respective ones of the first wells WA1 or the second wells WA2. Each of the fourth bank parts 440 located between the first opening OA1 and the fourth opening OA4 may have both sides in the first direction DR1 facing the wells WA1 or WA2, respectively.

Because the bank parts 420 and 440 extending in the first direction DR1 and the bank parts 410 and 430 extending in the second direction DR2 branch or extend in only three directions at each intersection IP where they meet, the area of each intersection IP can be reduced.

Referring to FIG. 19, in a color conversion substrate 30 according to one or more embodiments, a width WP3 of each third well WA3 may be the same as widths WP1 and WP2 of first and second wells WA1 and WA2. Bank parts 410, 420, 430, and 440 of a bank layer 400 may be located such that the third wells WA3 are not side by side with the first wells WA1 or the second wells WA2 in the first direction DR1. The bank parts 410, 420, 430, and 440 extending in first direction DR1 and the second direction DR2 to meet each other may branch or extend in three directions at each intersection IP.

Although the wells WA1 through WA3 have the same width, they may be staggered with each other according to the arrangement of the bank parts 410, 420, 430, and 440. Each second bank part 420 located between the first and second wells WA1 and WA2 may have both sides in the first direction DR1 connected to a first bank part 410 and a third bank part 430, respectively, and the both sides may face a third well WA3 and a first opening OA1 or a fourth opening OA4, respectively. Similarly, each fourth bank part 440 located between the third wells WA3 may have both sides in the first direction DR1 connected to different first bank parts 410, respectively, and the both sides may face the first wells WA1 or the second wells WA2, respectively. Each of the fourth bank parts 440 located between the first opening OA1 and the fourth opening OA4 may have both sides in the first direction DR1 facing respective ones of the wells WA1 or WA2.

Because the bank parts 420 and 440 extending in the first direction DR1 and the bank parts 410 and 430 extending in the second direction DR2 branch or extend in only three directions at each intersection IP where they meet, the area of each intersection IP can be reduced.

Referring to FIG. 20, in a color conversion substrate 30 according to one or more embodiments, a plurality of wells WA1 through WA3 have the same width and are staggered with each other, and a bank layer 400 may further include a plurality of recesses WD (WD1 and WD2) formed at intersections IP where a plurality of respective bank parts 410, 420, 430, and 440 meet. The current example is different from the embodiments corresponding to FIG. 13 in the embodiments corresponding to FIG. 19 in that a plurality of recesses WD are formed in some of the bank parts 410, 420, 430, and 440 of the bank layer 400.

As described above with reference to the embodiments corresponding to FIG. 13, at each intersection IP where the bank parts 410, 420, 430, and 440 extending in different directions meet, a recess WD that is recessed inwardly may be formed in a part where the bank parts 410, 420, 430, and 440 do not extend. For example, at each intersection IP where a first bank part 410 and a fourth bank part 440 meet, a plurality of first recesses WD1 may be formed on a first side in contact with a first well WA1 or a second well WA2 among both sides of the first bank part 410 in the first direction DR1. At each intersection IP where a first bank part 410 and a second bank part 420 meet, a plurality of second recesses WD2 may be formed on a second side in contact with a third well WA3 among both sides of the first bank part 410 in the first direction DR1. The first recesses WD1 may be side by side with the fourth bank parts 440 in the first direction DR1, and the second recesses WD2 may be side by side with the second bank parts 420 in the first direction DR1. When ink is incorrectly deposited on the intersections IP where the bank parts 410, 420, 430, and 440 meet, it may flow to the wells WA1 through WA3 in contact with the parts where the recesses WD1 and WD2 are formed. For example, ink deposited on intersections IP where the first recesses WD1 are formed may flow to the first wells WA1 or the second wells WA2, and ink deposited on intersections IP where the second recesses WD2 are formed may flow to the third wells WA3. The color conversion substrate 30 including a plurality of recesses WD (WD1 and WD2) can reduce or prevent ink from remaining on the bank layer 400.

Figure 21:
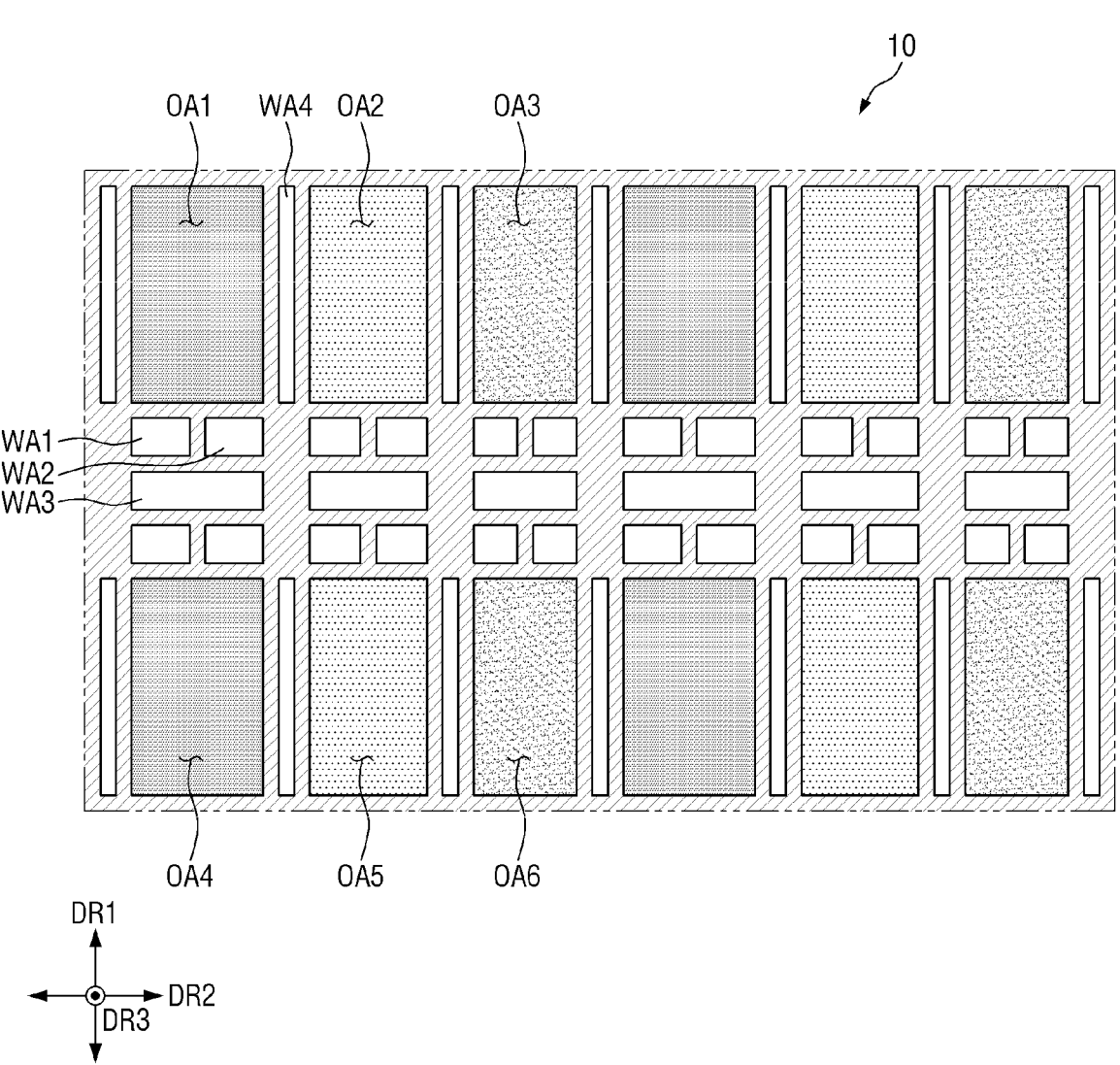
FIG. 21 illustrates the schematic planar arrangement of a bank layer included in a color conversion substrate according to one or more embodiments.

FIG. 21 illustrates the schematic planar arrangement of a bank layer 400 included in a color conversion substrate 30 according to one or more embodiments.

Referring to FIG. 21, the color conversion substrate 30 according to one or more embodiments may include a greater number of wells WA1 through WA4. For example, the bank layer 400 of the color conversion substrate 30 may include a plurality of bank parts 410, 420, and 430 and may further include fourth wells WA4 located between openings OA adjacent to each other in the second direction DR2, in addition to first through third wells WA1 through WA3 located between openings OA adjacent to each other in the first direction DR1. Each bank extension part 450 of the bank layer 400 may extend in the first direction DR1, and may branch between the openings OA adjacent to each other in the second direction DR2. Each bank extension part 450 may branch at a part located side by side with a side of an opening OA in the first direction DR1, and then may be connected again at a part located side by side with the other side of the opening OA. Accordingly, each bank extension part 450 may have an area surrounded by the branching part, and the area may be a fourth well WA4.

Unlike the first through third wells WA1 through WA3, the fourth wells WA4 may be located between the openings OA adjacent to each other in the second direction DR2. When wavelength conversion layers 330 and 340 and a light transmitting layer 350 are formed in the openings OA arranged in the first direction DR1, the first through third wells WA1 through WA3 may reduce or prevent incorrectly deposited ink from remaining on the bank layer 400. On the other hand, when the wavelength conversion layers 330 and 340 and the light transmitting layer 350 are formed in any one opening OA, the fourth wells WA4 may reduce or prevent ink from flowing to other neighboring openings OA. When the amount of ink sprayed to an opening OA is greater than a designed value, the ink may overflow to adjacent openings OA. However, the color conversion substrate 30 including the fourth wells WA4 located between the openings OA to which different inks are sprayed can reduce or prevent the ink from overflowing to unwanted areas. Accordingly, in the color conversion substrate 30, the quality of the wavelength conversion layers 330 and 340 and the light transmitting layer 350 located in each opening OA can be improved.

FIGS. 22 through 25 illustrate the schematic planar arrangements of bank layers 400 included in color conversion substrates 30 according to embodiments.

Figure 22:
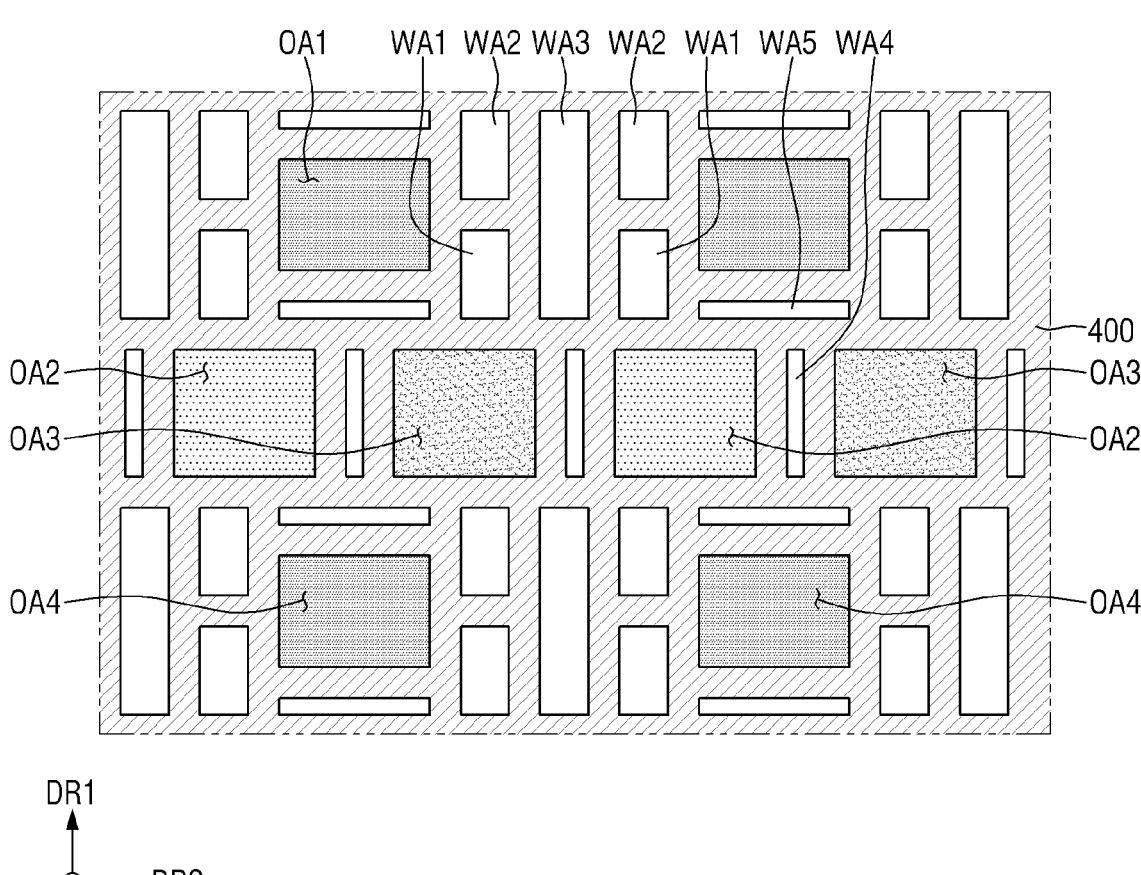
FIGS. 22 through 25 illustrate the schematic planar arrangements of bank layers included in color conversion substrates according to embodiments.
Figure 22:
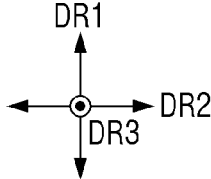

Referring to FIG. 22, in a color conversion substrate 30 according to one or more embodiments, the arrangement of a plurality of openings OA1, OA2, OA3, OA4, etc. of a bank layer 400 may be different from that in the embodiments corresponding to FIG. 10. Although not illustrated in the drawing, the arrangement of a plurality of light emitting areas LA1 through LA6 of a display substrate 10 may also be similar to the arrangement of the openings OA1 through OA4 of the bank layer 400 illustrated in FIG. 22. Accordingly, the shape of the bank layer 400 and the arrangement of light transmitting areas TA of the color conversion substrate 30 may be changed. Thus, a redundant description will be omitted, and the arrangement of the openings OA1 through OA4 of the bank layer 400 will be described in detail below.

According to one or more embodiments, the light emitting areas LA and the light transmitting areas TA may not necessarily be spaced apart from each other in the first direction DR1 and the second direction DR2. Like first through third light emitting areas LA1 through LA3 or first through third light transmitting areas TA1 through TA3 repeatedly arranged as a pair, first through third openings OA1 through OA3 among the openings OA of the bank layer 400 may be repeatedly arranged as a pair. In the embodiments corresponding to FIG. 10, the first through third openings OA1 through OA3 are sequentially arranged in the second direction DR2, but the disclosure is not limited thereto. According to one or more embodiments, the first through third openings OA1 through OA3 forming one pair among the openings OA1 through OA4 may be spaced apart from each other in a diagonal direction and the second direction DR2.

For example, a second opening OA2 and a third opening OA3 may be spaced apart from each first opening OA1 in a diagonal direction, and may be spaced apart from each other in the second direction DR2. Among the openings OA, the first openings OA1 may be spaced apart from each other in the second direction DR2 and repeatedly arranged in a first row, and the second openings OA2 and the third openings OA3 may be spaced apart from each other and alternately and repeatedly arranged in a second row. Each of the first openings OA1 may be located side by side with the bank layer 400 in the first direction DR1 between the second and third openings OA2 and OA3. In a third row, fourth openings OA4 may be spaced apart from each other in the second direction DR2 and may be repeatedly arranged. In a fourth row, in some embodiments, different openings (e.g., fifth and sixth openings) that form a pair with a fourth opening OA4 may be spaced apart from each other in the second direction DR2 and may be alternately and repeatedly arranged.

In the color conversion substrate 30 of FIG. 22, the openings OA1 through OA4 may be partially spaced apart from each other in a diagonal direction according to the arrangement of the bank layer 400, and the light transmitting areas TA may also be arranged accordingly. When the arrangement of the light emitting areas LA of the display substrate 10 of a display device 1 corresponds to the arrangement of the openings OA1 through OA4 of the color conversion substrate 30 of FIG. 22, the display substrate 10 and the color conversion substrate 30 of FIG. 22 may be bonded together to form the display device 1.

The bank layer 400 may include a plurality of wells WA1 through WAS. First through third wells WA1 through WA3 may be located between the first openings OA1 spaced apart from each other in the second direction DR2, and each fourth well WA4 may be located between the second and third openings OA2 and OA3. The bank layer 400 may further include fifth wells WAS, each being located between the first and fourth openings WA1 and WA4. As described above, the wells WA1 through WA5 may accommodate incorrectly deposited ink and may reduce or prevent ink from remaining on the bank layer 400.

Figure 23:
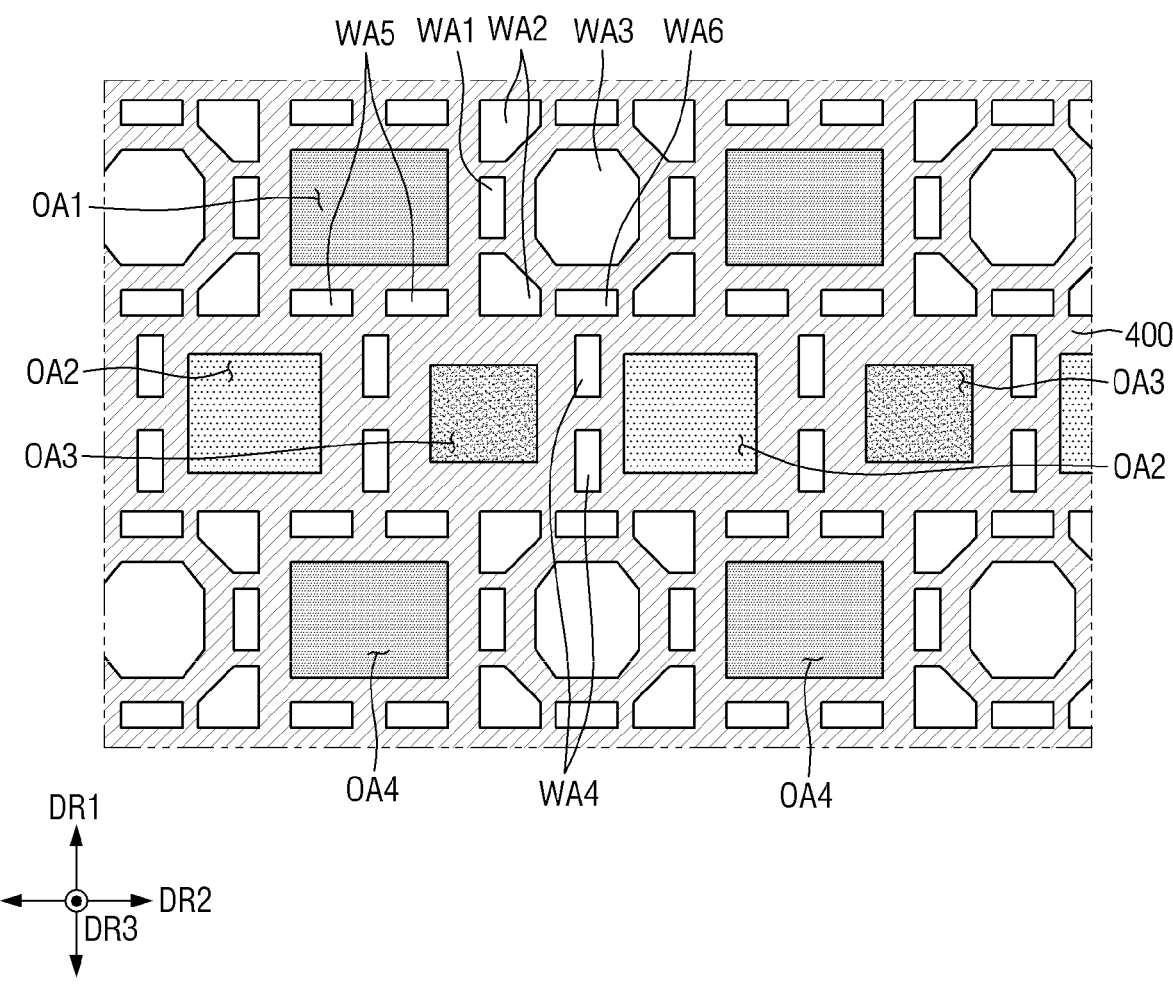

Referring to FIG. 23, in a color conversion substrate 30 according to one or more embodiments, the arrangement and shape of a plurality of wells WA1 through WA6 of a bank layer 400 may be different from those of the embodiments corresponding to FIG. 22. Thus, a redundant description will be omitted, and the arrangement of the wells WA1 through WA6 of the bank layer 400 will be described in detail below.

The bank layer 400 may include a plurality of wells WA1 through WA6. First through third wells WA1 through WA3 and sixth wells WA6 may be located between first openings OA1 spaced apart from each other in the second direction DR2, and fourth wells WA4 may be located between second and third openings OA2 and OA3. Fifth wells WA5 may be located between an area where the fourth wells WA4 are located and each first opening OA1. The fourth wells WA4 may be spaced apart from each other, and the fifth wells WA5 may also be spaced apart from each other.

Each of the third wells WA3 may be located between the first openings OA1 spaced apart from each other in the second direction DR2 and may have a larger area than other wells. For example, the third wells WA3 may have a polygonal or circular shape in plan view. Although the third wells WA3 have an octagonal shape in the drawing, the disclosure is not limited thereto. In some embodiments, first bank parts 410 of the bank layer 400 may be bank parts in contact with the third wells WA3 as in the above-described embodiments.

The first wells WA1, the second wells WA2, and the sixth wells WA6 may surround each third well WA3. Each of the first wells WA1 may be located between a third well WA3 and a first opening OA1, and the second wells WA2 may be located on both sides of each first well WA1 in the first direction DR1, respectively. The second wells WA2 may be spaced apart from each other with a first well WA1 interposed between them. Each of the sixth wells WA6 may be located between a third well WA3 and a fourth well WA4.

The first wells WA1, the second wells WA2, and the sixth wells WA6 may have an area and a width that are less than that of the third wells WA3. In addition, the first wells WA1 and the sixth wells WA6 may have an area and a width that are less than that of the second wells WA2. The first wells WA1 and the sixth wells WA6 may or may not have the same width (e.g., corresponding to respective directions). In one or more embodiments in which the third wells WA3 have an octagonal shape, each of the first and sixth wells WA1 and WA6 may be located to correspond to a side of a third well WA3 that extends in the first direction DR1 or the second direction DR2, and each of the second wells WA2 may be located to correspond to a side of the third well WA3 that extends in a diagonal direction between the first direction DR1 and the second direction DR2.

The wells WA1 through WA6 may be surrounded by bank parts of the bank layer 400, and the bank parts of the bank layer 400 may be located between the wells WA1 through WA6 spaced apart from each other. Similarly to the arrangement of first and second bank parts 410 and 420 in other embodiments, the bank parts of the bank layer 400 may extend in the first direction DR1, the second direction DR2, or other directions in one or more embodiments. At each intersection IP where bank parts extending in different directions among the bank parts of the bank layer 400 meet, the different bank parts might not intersect each other. For example, a second bank part 420 may branch from a side of a first bank part 410 contacting and surrounding a third well WA3, but may not intersect or protrude from the other side of the first bank part 410.

Figure 24:
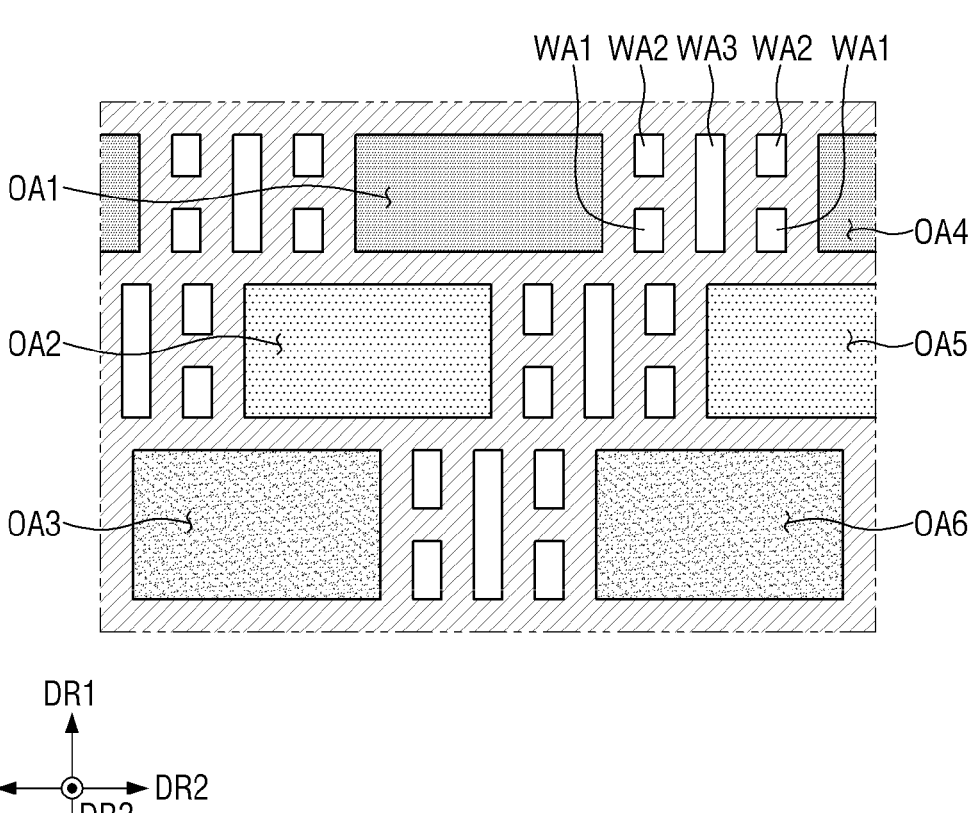

Referring to FIG. 24, in a color conversion substrate 30 according to one or more embodiments, a plurality of openings OA1, OA2, OA3, OA4, etc. of a bank layer 400 may be arranged in a diagonal direction between the first direction DR1 and the second direction DR2. For example, as in the embodiments corresponding to FIG. 10, some openings OA may be located side by side in one direction. A first opening OA1 and a fourth opening OA4 may be spaced apart from each other in the second direction DR2, a second opening OA2 and a fifth opening OA5 may be spaced apart from each other in the second direction DR2, and a third opening OA3 and a sixth opening OA6 may be spaced apart from each other in the second direction DR2. On the other hand, the first opening OA1, the second opening OA2, and the third opening OA3 that form one set may be spaced apart from each other in a diagonal direction, and the fourth opening OA4, the fifth opening OA5, and the sixth opening OA6 that form another set may be spaced apart from each other in a diagonal direction.

The bank layer 400 may include a plurality of wells WA1 through WA3. First through third wells WA1 through WA3 may be located between openings OA spaced apart from each other in the second direction DR2. As described above, the wells WA1 through WA3 may accommodate incorrectly deposited ink and prevent ink from remaining on the bank layer 400.

Figure 25:
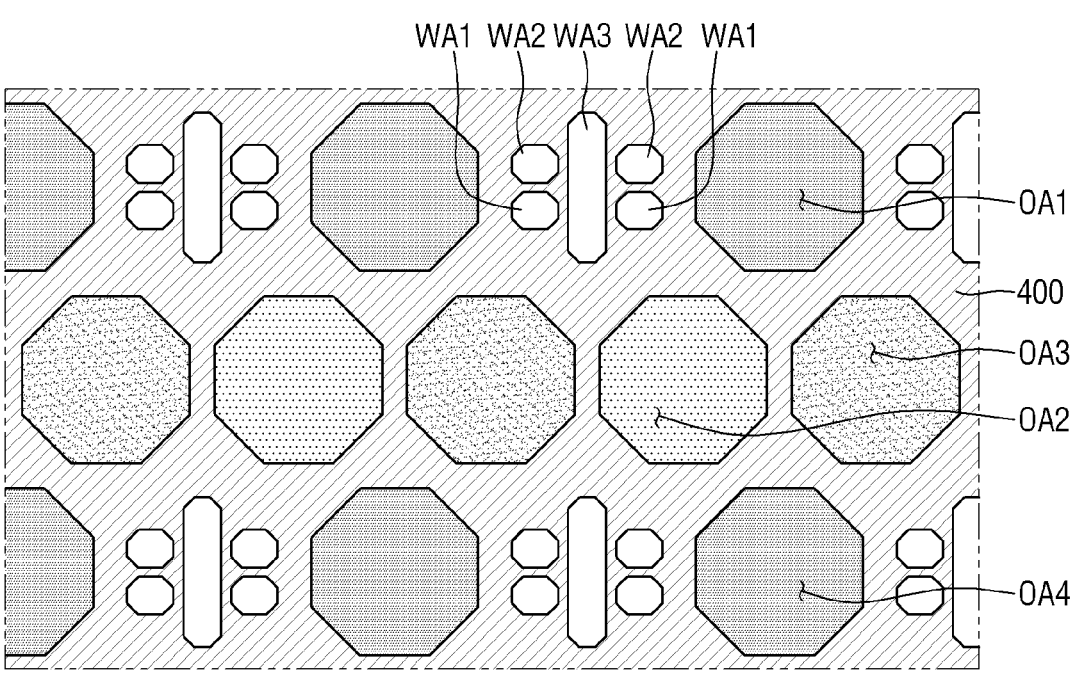
Figure 25:
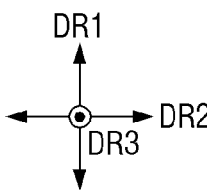

Referring to FIG. 25, in a color conversion substrate 30 according to one or more embodiments, a plurality of openings OA and a plurality of wells WA1 through WA3 may each have a polygonal shape in plan view. The embodiments corresponding to FIG. 25 is different from the embodiments corresponding to FIG. 22 in that the openings OA and the wells WA1 through WA3 have an octagonal shape in plan view. Thus, a redundant description will be omitted.

Figure 26:
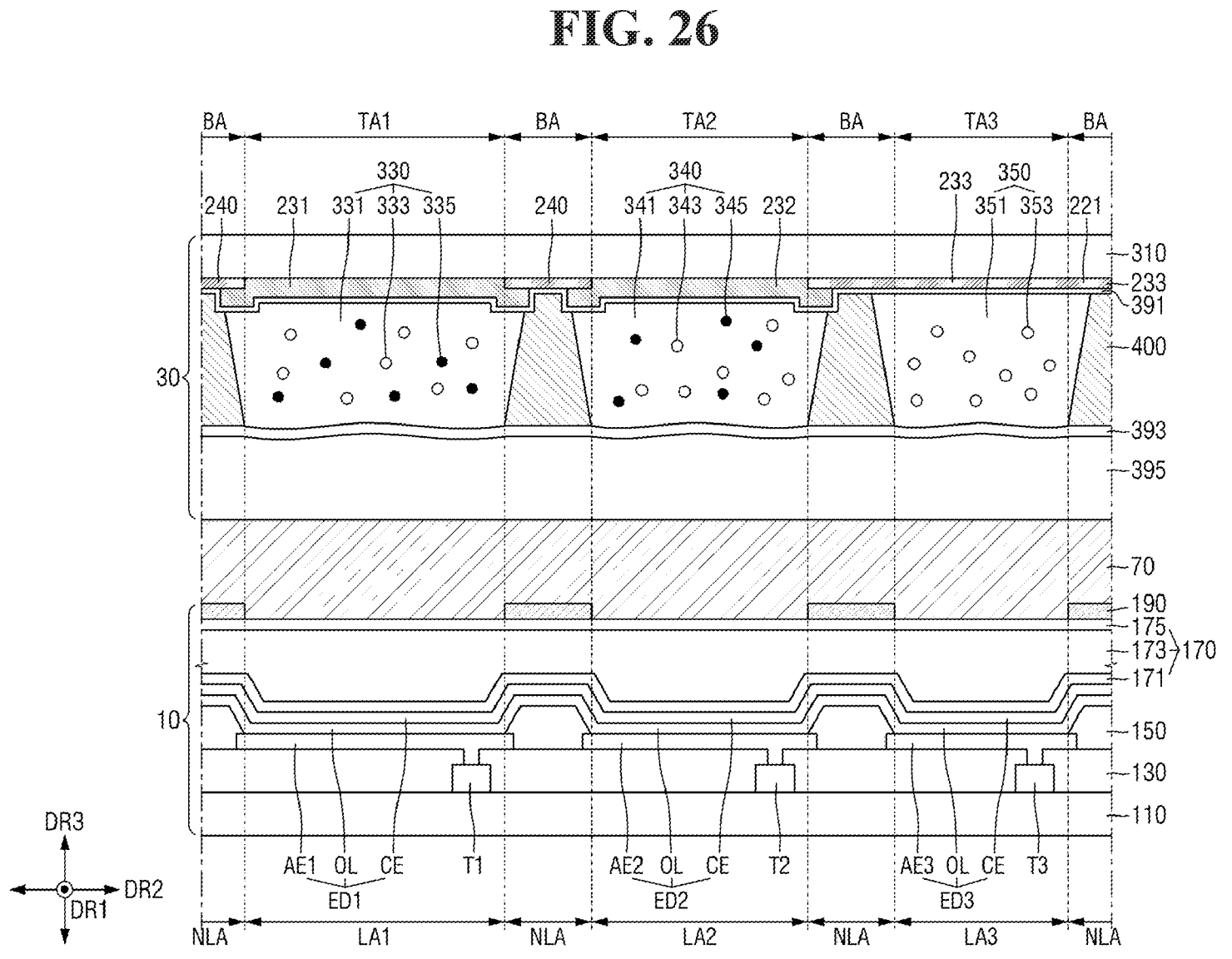

FIG. 26 is a schematic cross-sectional view of a display device 1 according to one or more embodiments.

Referring to FIG. 26, in the display device 1 according to one or more embodiments, a color conversion substrate 30 may omit a light blocking member 221 and may include a color pattern 240. The current example is the same as the embodiments corresponding to FIG. 5 except that the color conversion substrate 30 further includes the color pattern 240 located on a surface of a second substrate 310. Thus, a redundant description will be omitted, and differences will be mainly described below.

The color pattern 240 may reduce reflected light due to external light by absorbing some of the light introduced to the color conversion substrate 30 from the outside of the display device 1. In one or more embodiments, like a third color filter layer 233, the color pattern 240 may include a blue colorant such as a blue dye or a blue pigment. In some embodiments, the color pattern 240 may be made of the same material as the third color filter layer 233, and may be formed at the same time (e.g., during the same process) as the third color filter layer 233. The third color filter layer 233 and the color pattern 240 may be concurrently or substantially simultaneously formed by applying a photosensitive organic material including a blue colorant on a surface of the second substrate 310, and by exposing and developing the photosensitive organic material. A thickness of the color pattern 240 may be substantially the same as a thickness of the third color filter layer 233.

When the color pattern 240 includes a blue colorant, external light or reflected light passing through the color pattern 240 may have a blue wavelength band.

The eye color sensibility that a user's eyes perceive varies depending on the color of light. For example, light in the blue wavelength band may be perceived less sensitively by a user than light in a green wavelength band and light in a red wavelength band. Therefore, because the color pattern 240 includes a blue colorant, the user may perceive reflected light relatively less sensitively.

A part of the color pattern 240 may be located in a light blocking area BA on the surface of the second substrate 310. The color pattern 240 may reduce or prevent color mixing between neighboring light transmitting areas TA, and the light blocking member 221 may be omitted.

Figure 27:
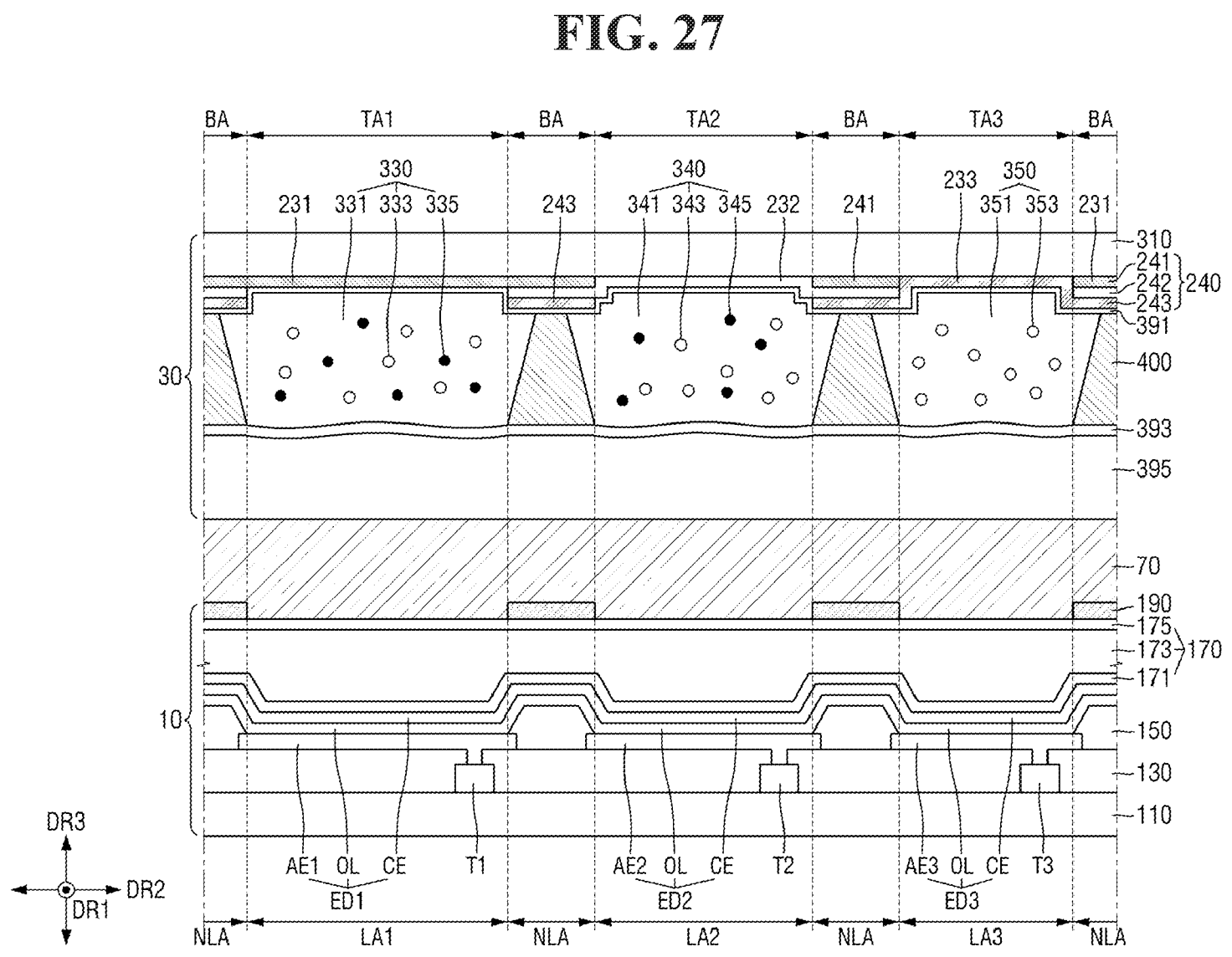

FIG. 27 is a schematic cross-sectional view of a display device 1 according to one or more embodiments.

Referring to FIG. 27, in the display device 1 according to one or more embodiments, a color conversion substrate 30 may omit a light blocking member 221, and may include a plurality of color patterns 240 (241 through 243). The current example is different from the embodiments corresponding to FIG. 26 in that the light blocking member 221 is replaced with the color patterns 240.

The color patterns 240 may be formed in substantially the same grid pattern as the color pattern 240 of FIG. 26. However, the color patterns 240 may include the same material as color filter layers 231 through 233, and may be integrally formed with the color filter layers 231 through 233. Different color patterns 240 (241 through 243) may be stacked on each other in a light blocking area BA, and transmission of light may be blocked in the area where they are stacked.

A first color pattern 241 may include the same material as a first color filter layer 231, and may be located in the light blocking area BA. The first color pattern 241 may be directly located on a second substrate 310 in the light blocking area BA, and may be integrated with the first color filter layer 231 in the light blocking area BA adjacent to a first light transmitting area TA1.

A second color pattern 242 may include the same material as a second color filter layer 232, and may be located in the light blocking area BA. The second color pattern 242 may be directly located on the first color pattern 241 in the light blocking area BA, and may be integrated with the second color filter layer 232 in the light blocking area BA adjacent to a second light transmitting area TA2. Similarly, a third color pattern 243 may include the same material as a third color filter layer 233, and may be located in the light blocking area BA. The third color pattern 243 may be directly located on the second color pattern 242 in the light blocking area BA, and may be integrated with the third color filter layer 233 in the light blocking area BA adjacent to a third light transmitting area TA3.

In the display device 1 according to one or more embodiments, the color patterns 240 of the color conversion substrate 30 are stacked and perform the same role as the light blocking member 221. Therefore, it is possible to reduce or prevent color mixing between neighboring areas due to materials including different colorants. In addition, because the color patterns 240 include the same material as the color filter layers 231 through 233, external light or reflected light passing through the light blocking area BA may have a wavelength band of a corresponding color. The eye color sensibility that a user's eyes perceive varies depending on the color of light. For example, light in a blue wavelength band may be perceived less sensitively by a user than light in a green wavelength band and light in a red wavelength band. The color patterns 240 replacing the light blocking member 221 in the light blocking area BA may block or reduce transmission of light, cause a user to perceive reflected light relatively less sensitively, and reduce reflected light due to external light by absorbing some of the light introduced from the outside of the display device 1.

Figure 28:
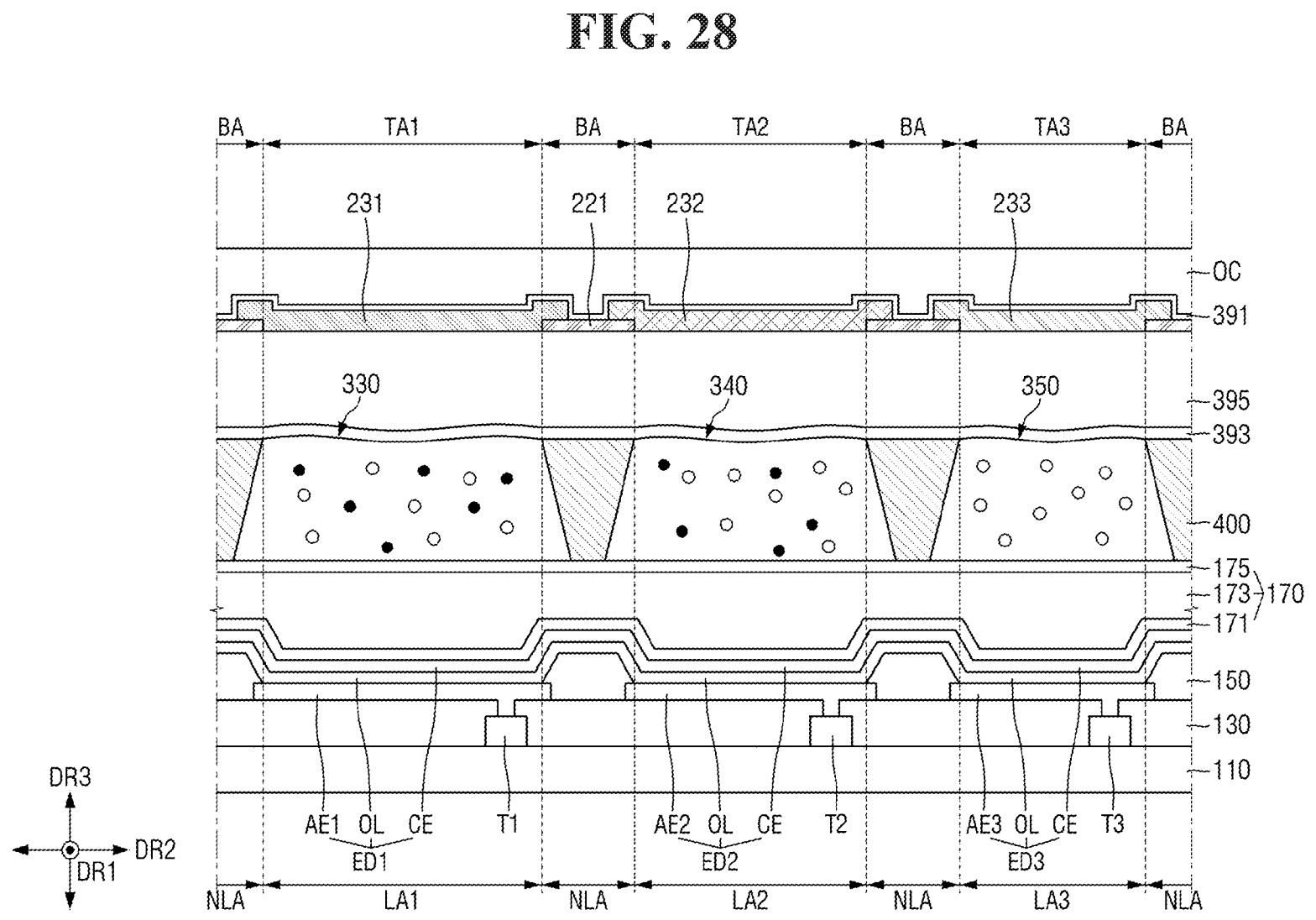
Figure 29:
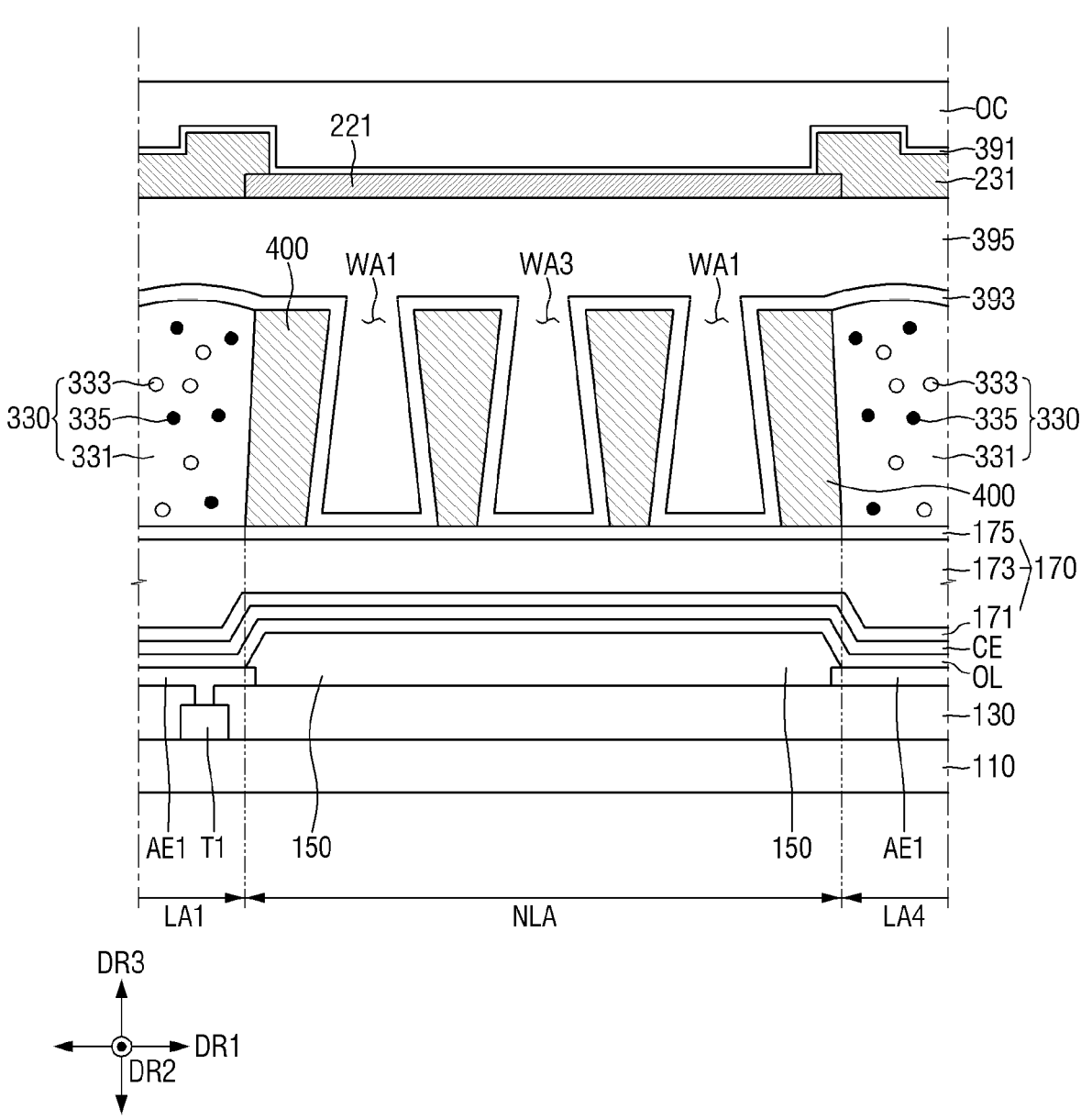
FIG. 29 is a cross-sectional view taken across areas surrounded by a bank layer of the display device of FIG. 28.

FIG. 28 is a schematic cross-sectional view of a display device 1 according to one or more embodiments. FIG. 29 is a cross-sectional view taken across areas surrounded by a bank layer 400 of the display device 1 of FIG. 28.

Referring to FIGS. 28 and 29, in the display device 1 according to one or more embodiments, wavelength conversion layers 330 and 340, a light transmitting layer 350, and the bank layer 400 may be formed on a first substrate 110, and color filter layers 231 through 233 may be formed on the wavelength conversion layers 330 and 340, the light transmitting layer 350, and the bank layer 400. The current example is different from the embodiments corresponding to FIG. 5 with respect to the arrangement of the wavelength conversion layers 330 and 340 and the light transmitting layer 350.

The bank layer 400 may be directly located on an encapsulation layer 170. The bank layer 400 may surround at least light emitting areas LA1 through LA3, and the wavelength conversion layers 330 and 340 and the light transmitting layer 350 may be located in respective openings OA of the bank layer 400 to correspond to the light emitting areas LA1 through LA3.

The wavelength conversion layers 330 and 340 and the light transmitting layer 350 may be directly located on the encapsulation layer 170. In the display device 1, light emitting elements ED for emitting light, the wavelength conversion layers 330 and 340, and the light transmitting layer 350 may be successively located on one first substrate 110. The bank layer 400 may have a height (e.g., predetermined height) and may surround areas where the light emitting elements ED are located. Base resins of the wavelength conversion layers 330 and 340 and the light transmitting layer 350 may be directly located on the encapsulation layer 170 in the areas surrounded by the bank layer 400.

A second capping layer 393 and a third capping layer 395 are located on the bank layer 400, the wavelength conversion layers 330 and 340, and the light transmitting layer 350. The second capping layer 393 may protect the wavelength conversion layers 330 and 340 and the light transmitting layer 350 from outside air, and the third capping layer 395 may planarize steps thereunder. In addition, in some embodiments, the third capping layer 395 may be an optical layer including a material having a low refractive index to recycle light passing through the wavelength conversion layers 330 and 340 and the light transmitting layer 350, and may improve the light output efficiency and color purity of the display device 1.

A light blocking member 221, the color filter layers 231 through 233, and a first capping layer 391 may be located on the third capping layer 395. The first capping layer 391, the color filter layers 231 through 233, and the light blocking member 221 are substantially the same as those described above except for their positions.

An overcoat layer OC may be located on the color filter layers 231 through 233 and the light blocking member 221. The overcoat layer OC may be located over the entire display area DPA, and a part of the overcoat layer OC may also be located in a non-display area NDA. The overcoat layer OC may include an organic insulating material to protect members located in the display area DPA from the outside.

Figure 30:
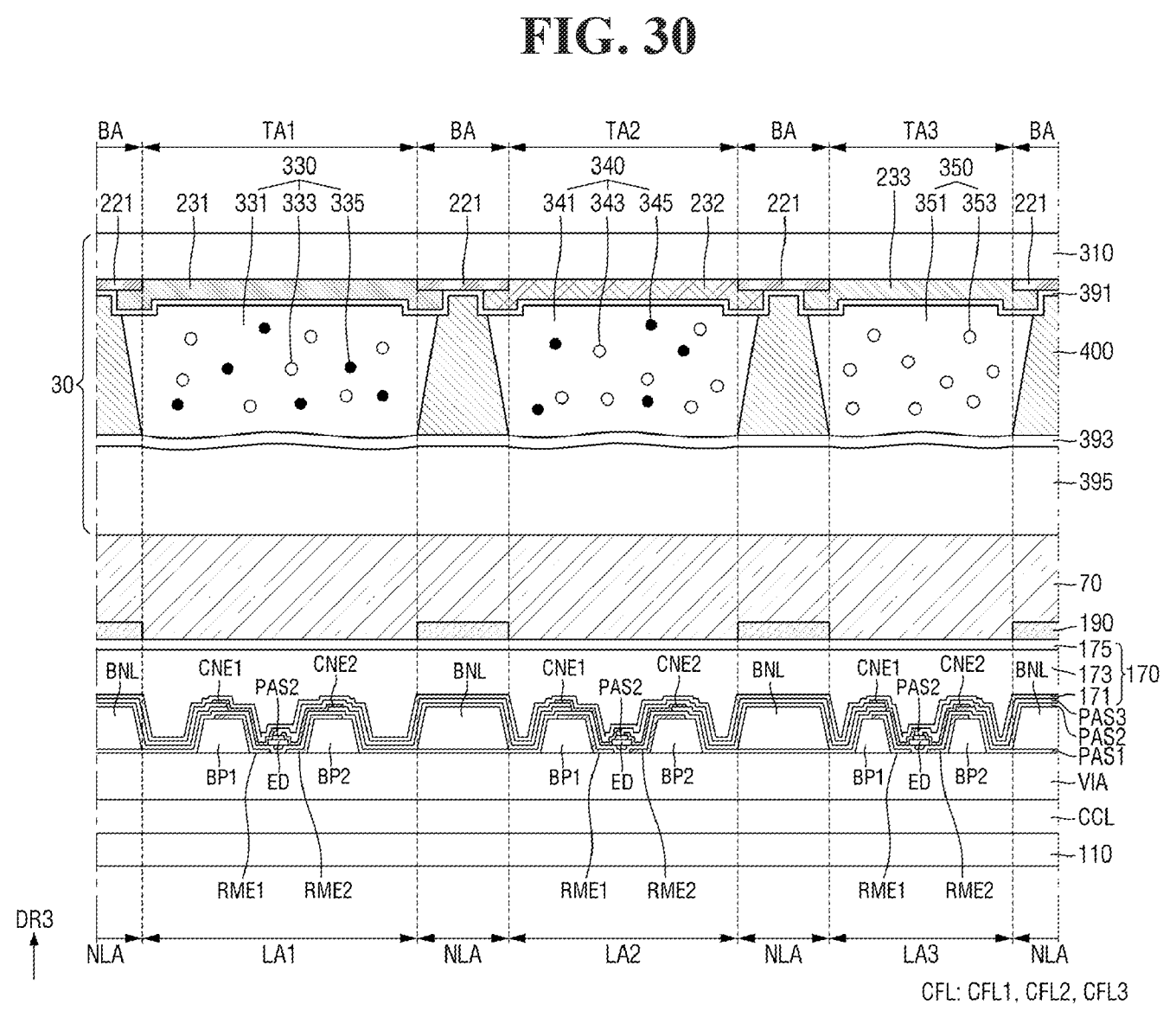

FIG. 30 is a schematic cross-sectional view of a display device 1 according to one or more embodiments.

Referring to FIG. 30, in the display device 1 according to one or more embodiments, a display substrate 10 may include light emitting elements ED located on two different electrodes RME1 and RME2. The current example is different from the embodiments corresponding to FIG. 5 in the structure of the display substrate 10. Thus, the structure of the display substrate 10 will be described in detail below.

According to one or more embodiments, the display substrate 10 of the display device 1 may include a circuit layer CCL, a via layer VIA, a plurality of protruding patterns BP1 and BP2, a plurality of electrodes RME1 and RME2, light emitting elements ED, a plurality of connection electrodes CNE1 and CNE2, and a lower bank layer BNL located on a first substrate 110. In addition, the display substrate 10 may further include a plurality of insulating layers PAS1 through PAS3.

Like the display substrate 10 of FIG. 5, the circuit layer CCL may include a plurality of switching elements T1 through T3. Like the circuit insulating layer 130 of FIG. 5, the via layer VIA may be located on the circuit layer CCL to planarize an upper surface of the circuit layer CCL.

The protruding patterns BP1 and BP2 may be spaced apart from each other in each light emitting area LA1, LA2, or LA3.

For example, the protruding patterns BP1 and BP2 may include a first protruding pattern BP1 and a second protruding pattern BP2 spaced apart from each other in the second direction DR2. The first protruding pattern BP1 may be located on a left side of the center of each light emitting area LA1, LA2, or LA3, and the second protruding pattern BP2 may be spaced apart from the first protruding pattern BP1 and located on a right side of the center of each light emitting area LA1, LA2, or LA3. A plurality of light emitting elements ED may be located between the first protruding pattern BP1 and the second protruding pattern BP2. The first protruding pattern BP1 and the second protruding pattern BP2 may have the same width in the second direction DR2. However, the disclosure is not limited thereto, and the first protruding pattern BP1 and the second protruding pattern BP2 may also have different widths.

The protruding patterns BP1 and BP2 may be directly located on the via layer VIA, and at least a part of each of the protruding patterns BP1 and BP2 may protrude from an upper surface of the via layer VIA. The protruding part of each of the protruding patterns BP1 and BP2 may have inclined or curved side surfaces, and light emitted from the light emitting elements ED may be reflected upward above the via layer VIA by the electrodes RME located on the protruding patterns BP1 and BP2. Unlike in the drawings, in other embodiments, each of the protruding patterns BP1 and BP2 may also have a semicircular or semielliptical shape having a curved outer surface in cross section. The protruding patterns BP1 and BP2 may include, but are not limited to, an organic insulating material such as polyimide (PI).

The electrodes RME (RME1 and RME2) may be located in each light emitting area LA1, LA2, or LA3. A first electrode RME1 may be located on the left side of the center of each light emitting area LA1, LA2, or LA3, and a second electrode RME2 may be spaced apart from the first electrode RME1 in the second direction DR2 and located on the right side of the center of each light emitting area LA1, LA2, or LA3. The first electrode RME1 may be located on the first protruding pattern BP1, and the second electrode RME2 may be located on the second protruding pattern BP2.

Although two electrodes RME extend in the first direction DR1 in each light emitting area LA1, LA2, or LA3, the disclosure is not limited thereto. For example, in the display substrate 10, a greater number of electrodes RME may be located in one subpixel SPXn, or the electrodes RME may be partially bent and may have a different width according to position.

The first electrode RME1 and the second electrode RME2 may be located on at least the inclined side surfaces of the protruding patterns BP1 and BP2. In one or more embodiments, a width of each of the electrodes RME measured in the second direction DR2 may be less than the width of each of the protruding patterns BP1 and BP2 measured in the second direction DR2. A distance between the first electrode RME1 and the second electrode RME2 in the second direction DR2 may be less than a distance between the protruding patterns BP1 and BP2. At least a part of each of the first electrode RME1 and the second electrode RME2 may be directly located on the via layer VIA so that they lie in the same plane.

The light emitting elements ED located between the protruding patterns BP1 and BP2 may emit light toward both ends thereof, and the emitted light may travel toward the electrodes RME located on the protruding patterns BP1 and BP2. Each electrode RME may have a structure in which a part located on a protruding pattern BP1 or BP2 can reflect light emitted from the light emitting elements ED. Each of the first electrode RME1 and the second electrode RME2 may cover at least one side surface of a protruding pattern BP1 or BP2 to reflect light emitted from the light emitting elements ED.

The electrodes RME may include a conductive material having high reflectivity. For example, each of the electrodes RME may include a metal such as silver (Ag), copper (Cu), or aluminum (Al), may be an alloy including aluminum (Al), nickel (Ni), or lanthanum (La), or may have a structure in which a metal layer such as titanium (Ti), molybdenum (Mo), or niobium (Nb) and the above alloy are stacked. In some embodiments, each of the electrodes RME may be a double layer or a multilayer in which an alloy including aluminum (Al) and at least one metal layer made of titanium (Ti), molybdenum (Mo), or niobium (Nb) are stacked.

However, the disclosure is not limited thereto, and each electrode RME may further include a transparent conductive material. For example, each electrode RME may include a material such as ITO, IZO or ITZO. In some embodiments, each electrode RME may have a structure in which a transparent conductive material and a metal layer having high reflectivity are each stacked in one or more layers or may be formed as a single layer including them. For example, each electrode RME may have a stacked structure of ITO/Ag/ITO, ITO/Ag/IZO, or ITO/Ag/ITZO/IZO. The electrodes RME may be electrically connected to the light emitting elements ED and may reflect some of the light emitted from the light emitting elements ED in an upward direction above the first substrate 110.

A first insulating layer PAS1 may be located on the via layer VIA and the electrodes RME. The first insulating layer PAS1 may protect the electrodes RME while insulating them from each other. For example, because the first insulating layer PAS1 covers the electrodes RME before the lower bank layer BNL is formed, it can reduce or prevent the likelihood of the electrodes RME being damaged in the process of forming the lower bank layer BNL. In addition, the first insulating layer PAS1 may reduce or prevent the likelihood of the light emitting elements ED located thereon directly contacting other members to thus be damaged.

The lower bank layer BNL may be located on the first insulating layer PAS1. The lower bank layer BNL may include parts extending in the first direction DR1 and the second direction DR2, and may surround each subpixel SPXn. The lower bank layer BNL may surround the light emitting areas LA1 through LA3 to separate them, and may surround the outermost periphery of a display area DPA to separate the display area DPA and a non-display area NDA.

Like the protruding patterns BP1 and BP2, the lower bank layer BNL may have a height (e.g., predetermined height). In some embodiments, an upper surface of the lower bank layer BNL may be at a greater height than those of the protruding patterns BP1 and BP2, and a thickness of the lower bank layer BNL may be equal to or greater than those of the protruding patterns BP1 and BP2. The lower bank layer BNL may reduce or prevent ink from overflowing to adjacent light emitting areas LA1 through LA3 in an inkjet printing process during a manufacturing process of the display device 1. Like the protruding patterns BP1 and BP2, the lower bank layer BNL may include an organic insulating material such as polyimide.

The light emitting elements ED may be located in each light emitting area LA1, LA2, or LA3. The light emitting elements ED may be located between the protruding patterns BP1 and BP2. In one or more embodiments, the light emitting elements ED may extend in a direction, and both ends thereof may be located on different electrodes RME, respectively. A length of each light emitting element ED may be greater than the distance between the electrodes RME spaced apart in the second direction DR2. The direction in which the light emitting elements ED extend may be substantially perpendicular to the first direction DR1 in which the electrodes RME extend. However, the disclosure is not limited thereto, and the direction in which the light emitting elements ED extend may also be the second direction DR2 or a direction oblique to the second direction DR2.

The light emitting elements ED may be located on the first insulating layer PAS1. The light emitting elements ED may extend in a direction, and the direction in which the light emitting elements ED extend may be parallel to an upper surface of the first substrate 110. As will be described later, each light emitting element ED may include a plurality of semiconductor layers located along the extending direction, and the semiconductor layers may be sequentially located along a direction parallel to the upper surface of the first substrate 110. However, the disclosure is not limited thereto. When the light emitting elements ED have a different structure, the semiconductor layers may be located in a direction perpendicular to the first substrate 110.

A second insulating layer PAS2 may be located on the light emitting elements ED, the first insulating layer PAS1, and the lower bank layer BNL. The second insulating layer PAS2 may be located between the protruding patterns BP1 and BP2 to partially cover outer surfaces of the light emitting elements ED, and might not cover both sides or both ends of each light emitting element ED. The second insulating layer PAS2 may protect the light emitting elements ED while fixing the light emitting elements ED during the process of manufacturing the display device 1.

The connection electrodes CNE (CNE1 and CNE2) may be located on the electrodes RME and the protruding patterns BP1 and BP2. The connection electrodes CNE may extend in one direction and may be spaced apart from each other. Each of the connection electrodes CNE may contact the light emitting elements ED.

A first connection electrode CNE1 may extend in the first direction DR1 and may be located on the first electrode RME1 or the first protruding pattern BP1. The first connection electrode CNE1 may partially overlap the first electrode RME1. A second connection electrode CNE2 may extend in the first direction DR1, and may be located on the second electrode RME2 or the second protruding pattern BP2. The second connection electrode CNE2 may partially overlap the second electrode RME2. The first connection electrode CNE1 and the second connection electrode CNE2 may contact the light emitting elements ED and may be electrically connected to the electrodes RME or the circuit layer CCL thereunder.

For example, the first connection electrode CNE1 and the second connection electrode CNE2 may be located on side surfaces of the second insulating layer PAS2, respectively, and may contact the light emitting elements ED. The first connection electrode CNE1 may partially overlap the first electrode RME1 and may contact an end of each of the light emitting elements ED. The second connection electrode CNE2 may partially overlap the second electrode RME2, and may contact the other end of each of the light emitting elements ED.

The connection electrodes CNE may include a conductive material such as ITO, IZO, ITZO, or aluminum (Al). For example, the connection electrodes CNE may include a transparent conductive material, and light emitted from the light emitting elements ED may pass through the connection electrodes CNE.

A third insulating layer PAS3 is located on the second connection electrode CNE2 and the second insulating layer PAS2. The third insulating layer PAS3 may be entirely located on the second insulating layer PAS2 to cover the second connection electrode CNE2, and the first connection electrode CNE1 may be located on the third insulating layer PAS3. The third insulating layer PAS3 may be entirely located on the via layer VIA except for an area where the second connection electrode CNE2 is located. The third insulating layer PAS3 may insulate the first connection electrode CNE1 and the second connection electrode CNE2 from each other so that the first connection electrode CNE1 does not directly contact the second connection electrode CNE2.

In one or more embodiments, another insulating layer may be further located on the third insulating layer PAS3 and the first connection electrode CNE1. The insulating layer may protect members located on the first substrate 110 from an external environment.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material, but the second insulating layer PAS2 may include an organic insulating material. Each or at least any one of the first insulating layer PAS1, the second insulating layer PAS2, and the third insulating layer PAS3 may be formed in a structure in which a plurality of insulating layers are alternately or repeatedly stacked. In one or more embodiments, each of the first insulating layer PAS1, the second insulating layer PAS2, and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material, some may be made of the same material while some others are made of different materials, or all of them may be made of different materials.

Figure 31:
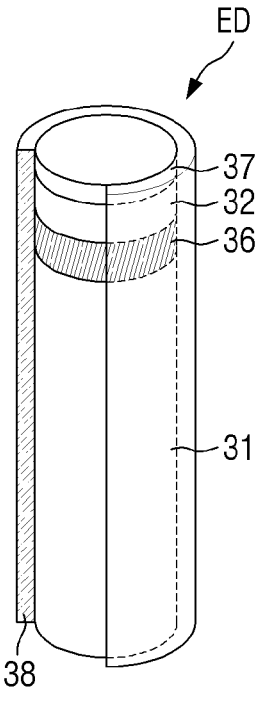
FIG. 31 is a perspective view of a light emitting element included in the display device of FIG. 30.

FIG. 31 is a perspective view of a light emitting element ED included in the display device 1 of FIG. 30.

Referring to FIG. 31, the light emitting element ED may be a light emitting diode. For example, the light emitting element ED may be an inorganic light emitting diode having a size of nanometers to micrometers and made of an inorganic material. When an electric field is formed in a corresponding direction between two electrodes facing each other, the light emitting element ED may be aligned between the two electrodes in which polarities are formed.

The light emitting element ED according to one or more embodiments may extend in one direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped and a hexagonal prism, and a shape extending in a direction and having a partially inclined outer surface.

The light emitting element ED may include a semiconductor layer doped with a dopant of any conductivity type (e.g., a p type or an n type). The semiconductor layer may receive an electrical signal from an external power source and emit light in a corresponding wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN, and InN doped with an n-type dopant. The n-type dopant used to dope the first semiconductor layer 31 may be Si, Ge, Sn, or the like.

The second semiconductor layer 32 is located on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN, and InN doped with a p-type dopant. The p-type dopant used to dope the second semiconductor layer 32 may be Mg, Zn, Ca, Se, Ba, or the like.

Although each of the first semiconductor layer 31 and the second semiconductor layer 32 is composed of one layer in the drawing, the disclosure is not limited thereto. Each of the first semiconductor layer 31 and the second semiconductor layer 32 may also include a greater number of layers, for example, may further include a clad layer or a tensile strain barrier reducing (TSBR) layer depending on the material of the light emitting layer 36.

The light emitting layer 36 is located between the first semiconductor layer 31 and the second semiconductor layer 32. The light emitting layer 36 may include a material having a single or multiple quantum well structure. When the light emitting layer 36 includes a material having a multiple quantum well structure, it may have a structure in which a plurality of quantum layers and a plurality of well layers are alternately stacked. The light emitting layer 36 may emit light through combination of electron-hole pairs according to an electrical signal received through the first semiconductor layer 31 and the second semiconductor layer 32. The light emitting layer 36 may include a material such as AlGaN or AlGaInN. For example, when the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include different group 3 to 5 semiconductor materials depending on the wavelength band of light that it emits. Light emitted from the light emitting layer 36 is not limited to light in a blue wavelength band. In some cases, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

When the light emitting element ED is electrically connected to an electrode or a connection electrode in the display device 1, the electrode layer 37 may reduce the resistance between the light emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layer described above. For example, the insulating film 38 may surround an outer surface of at least the light emitting layer 36 but may expose both ends of the light emitting element ED in a longitudinal direction. In addition, an upper surface of the insulating film 38 may also be rounded in cross section in an area adjacent to at least one end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). Although the insulating film 38 is illustrated as a single layer in the drawing, the disclosure is not limited thereto. In some embodiments, the insulating film 38 may be formed in a multilayer structure in which a plurality of layers are stacked.

The insulating film 38 may protect the semiconductor layers and the electrode layer of the light emitting element ED. The insulating film 38 may reduce or prevent the likelihood of an electrical short circuit that may occur in the light emitting layer 36 when the light emitting layer 36 directly contacts an electrode through which an electrical signal is transmitted to the light emitting element ED. In addition, the insulating film 38 may prevent a reduction in luminous efficiency of the light emitting element ED.

In addition, an outer surface of the insulating film 38 may be treated. The light emitting element ED may be sprayed onto electrodes in a state where it is dispersed in an ink (e.g., predetermined ink) and then may be aligned. Here, the surface of the insulating film 38 may be hydrophobic or hydrophilic-treated so that the light emitting element ED remains separate from other adjacent light emitting elements ED in the ink without agglomerating with them.

In a color conversion substrate according to one or more embodiments, incorrectly deposited ink can be reduced or prevented from remaining on a bank layer.

A display device according to one or more embodiments can reduce or prevent an appearance defect from occurring due to remaining ink by including the above color conversion substrate.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A color conversion substrate comprising:
   a substrate;
   color filter layers on the substrate, and arranged in a first direction, and in a second direction orthogonal to the first direction;
   a bank layer defining openings overlapping the color filter layers, and comprising:
   a first bank part extending in the second direction; and
   second bank parts connected to the first bank part and extending in the first direction from a first side of the first bank part; and
   wavelength conversion layers in the openings of the bank layer,
   wherein the first bank part defines a recess side by side with the second bank parts in the first direction and recessed inwardly from a second side opposite the first side, and
   wherein a maximum width of the first bank part in the first direction is greater than a width of a part of the first bank part that is connected to the second bank parts.

2. The color conversion substrate of claim 1, wherein an angle between the first direction and the second direction is about 90 degrees or more.

3. The color conversion substrate of claim 1, wherein the bank layer further comprises:
   a third bank part spaced apart from the first bank part in the first direction with the second bank parts interposed therebetween; and
   a bank extension part extending in the first direction, and connected to the first bank part and the third bank part, and
   wherein a distance between each of the second bank parts and the bank extension part is less than a distance between the bank extension part and another bank extension part.

4. The color conversion substrate of claim 3, wherein the distance between each of the second bank parts and the bank extension part is less than a width of each of the openings.

5. The color conversion substrate of claim 1, wherein the color filter layers are on the bank layer to partially overlap each other.

6. The color conversion substrate of claim 1, further comprising a light-blocking member on the substrate and extending in the first direction and the second direction,
   wherein the color filter layers are spaced apart from each other with the light-blocking member interposed therebetween.

7. The color conversion substrate of claim 1, further comprising:

a first capping layer on the color filter layers;

a second capping layer on the wavelength conversion layers and the bank layer; and a third capping layer on the second capping layer, wherein the wavelength conversion layers are on the first capping layer.

8. The color conversion substrate of claim 7, wherein a part of the third capping layer on the second capping layer does not overlap the bank layer and the wavelength conversion layers.

9. A color conversion substrate comprising:

a substrate;

color filter layers on the substrate, and arranged in a first direction, and in a second direction orthogonal to the first direction;

a bank layer defining openings overlapping the color filter layers, and comprising:

a first bank part extending in the second direction; and second bank parts connected to the first bank part and extending in the first direction from a first side of the first bank part; and wavelength conversion layers in the openings of the bank layer, wherein the first bank part defines a recess side by side with the second bank parts in the first direction and recessed inwardly from a second side opposite the first side, and wherein the first bank part becomes wider in the second direction from an intersection.

10. A color conversion substrate comprising:

a substrate;

color filter layers on the substrate, and arranged in a first direction, and in a second direction orthogonal to the first direction;

a bank layer defining openings overlapping the color filter layers, and comprising:

a first bank part extending in the second direction; and second bank parts extending in the first direction from a first side of the first bank part; and wavelength conversion layers in the openings of the bank layer, wherein the first bank part defines a recess recessed inwardly from a part of a second side opposite the first side, wherein at least a part of each of the second bank parts is spaced apart from the first bank part, and wherein a width of each of the first bank part and the second bank parts is greater than a distance between the first bank part and each of the second bank parts.

11. The color conversion substrate of claim 10, wherein the first bank part comprises a first sub-bank part and a second sub-bank part spaced apart from each other in the second direction, and wherein each of the second bank parts is spaced apart from each of the first sub-bank part and the second sub-bank part at an intersection where the first sub-bank part and the second sub-bank part are spaced apart from each other.

12. The color conversion substrate of claim 11, wherein, in each of the second bank parts, a part facing the first sub-bank part and the second sub-bank part is narrower than other parts.

13. The color conversion substrate of claim 12, wherein the first bank part and each of the second bank parts are at least partially in contact with each other.

14. A display device comprising:

a display substrate comprising a first substrate and light-emitting elements on the first substrate;

a bank layer on the display substrate, extending in a first direction and in a second direction that is orthogonal to the first direction, and surrounding openings;

wavelength conversion layers in the openings of the bank layer; and color filter layers on the bank layer and the wavelength conversion layers to overlap the openings, wherein the bank layer comprises:

a first bank part extending in the second direction; and second bank parts extending in the first direction from a first side of the first bank part in the first direction and connected to the first bank part, wherein the first bank part defines a recess that is side by side with the second bank parts in the first direction and that is recessed inwardly from a part of a second side that is opposite the first side, and wherein a maximum width of the first bank part measured in the first direction is greater than a width of a part of the first bank part connected to the second bank parts.

15. The display device of claim 14, further comprising:

a first capping layer between the color filter layers and the bank layer and the wavelength conversion layers;

a second capping layer between the wavelength conversion layers and the bank layer and the first substrate; and a third capping layer between the second capping layer and the first substrate, wherein a part of the third capping layer on the second capping layer does not overlap the bank layer and the wavelength conversion layers.

16. The display device of claim 14, wherein the display substrate comprises anodes on the first substrate, and a cathode on the anodes, and wherein the light-emitting elements are between respective ones of the anodes and the cathode.

17. The display device of claim 14, wherein the display substrate comprises:

a first electrode and a second electrode on the first substrate, and spaced apart from each other;

a first connection electrode on the first electrode; and a second connection electrode on the second electrode, wherein one of the light-emitting elements is on the first electrode and the second electrode, and contacts the first connection electrode and the second connection electrode.

18. A display device comprising:

a display substrate comprising a first substrate and light-emitting elements on the first substrate;

a bank layer on the display substrate, extending in a first direction and in a second direction that is orthogonal to the first direction, surrounding openings, and comprising:

a first bank part extending in the second direction; and second bank parts extending in the first direction from a first side of the first bank part in the first direction;

wavelength conversion layers in the openings of the bank layer; and color filter layers on the bank layer and the wavelength conversion layers to overlap the openings, wherein the first bank part defines a recess that is recessed inwardly from a second side that is opposite the first side, wherein the first bank part comprises a first sub-bank part and a second sub-bank part spaced apart from each other in the second direction, and wherein each of the second bank parts is spaced apart from each of the first sub-bank part and the second sub-bank part at an intersection where the first sub-bank part and the second sub-bank part are spaced apart from each other.

19. The display device of claim 18, wherein a width of each of the first bank part and the second bank parts is greater than a distance between the first bank part and each of the second bank parts, and wherein, in each of the second bank parts, a part facing the first sub-bank part and the second sub-bank part is narrower than other parts.

20. A display device comprising:

a display substrate comprising a first substrate and light-emitting elements on the first substrate;

a bank layer on the display substrate, extending in a first direction and in a second direction that is orthogonal to the first direction, and surrounding openings;

wavelength conversion layers in the openings of the bank layer; and color filter layers on the bank layer and the wavelength conversion layers to overlap the openings, wherein the bank layer comprises a first bank part extending in the second direction, and second bank parts extending in the first direction from a first side of the first bank part in the first direction, wherein the openings comprise a first opening, a second opening spaced apart from the first opening in the second direction, and a third opening spaced apart from the first opening in the first direction, and wherein the first bank part defines a recess between the first opening and the third opening and recessed inwardly from a second side that is opposite the first side.

21. The display device of claim 20, wherein the color filter layers comprise a first color filter layer overlapping the first opening, and a second color filter layer overlapping the second opening, and wherein the wavelength conversion layers comprise a first wavelength conversion layer in the first opening, and a second wavelength conversion layer in the second opening.

\* \* \* \* \*